(12) United States Patent
Yilmaz et al.

(10) Patent No.: US 10,608,092 B2
(45) Date of Patent: Mar. 31, 2020

(54) SEMICONDUCTOR POWER DEVICES MANUFACTURED WITH SELF-ALIGNED PROCESSES AND MORE RELIABLE ELECTRICAL CONTACTS

(71) Applicant: Alpha and Omega Semiconductor Incorporated, Sunnyvale, CA (US)

(72) Inventors: Hamza Yilmaz, Saratoga, CA (US); John Chen, Palo Alto, CA (US); Daniel Ng, Campbell, CA (US); Wenjun Li, Songjiang Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 15/844,520

(22) Filed: Dec. 16, 2017

(65) Prior Publication Data
US 2018/0269293 A1    Sep. 20, 2018

Related U.S. Application Data

(60) Division of application No. 14/987,759, filed on Jan. 5, 2016, now Pat. No. 10,014,381, which is a
(Continued)

(51) Int. Cl.
*H01L 21/306* (2006.01)
*H01L 29/66* (2006.01)
(Continued)

(52) U.S. Cl.
CPC ...... *H01L 29/4236* (2013.01); *H01L 21/3065* (2013.01); *H01L 21/823487* (2013.01); *H01L 27/0255* (2013.01); *H01L 29/0619* (2013.01); *H01L 29/1095* (2013.01); *H01L 29/407* (2013.01); *H01L 29/4975* (2013.01);
(Continued)

(58) Field of Classification Search
CPC ............... H01L 29/7827; H01L 29/407; H01L 29/66727; H01L 29/66734; H01L 29/7806; H01L 29/7811; H01L 29/7813; H01L 29/872; H01L 29/66666; H01L 29/0878; H01L 21/26586; H01L 29/402; H01L 29/41766; H01L 29/4236; H01L 29/42368; H01L 29/861; H01L 29/8725; H01L 29/0619; H01L 29/665; H01L 27/0255; H01L 29/1095; H01L 29/4975; H01L 29/4238; H01L 29/7804
See application file for complete search history.

(56) References Cited

U.S. PATENT DOCUMENTS

| | | | | |
|---|---|---|---|---|
| 7,323,386 B2* | 1/2008 | Yilmaz | ............... | H01L 29/0619 438/268 |
| 2006/0273386 A1* | 12/2006 | Yilmaz | ............... | H01L 29/7827 257/330 |

* cited by examiner

*Primary Examiner* — Savitr Mulpuri
(74) *Attorney, Agent, or Firm* — Bo-In Lin

(57) ABSTRACT

This invention discloses semiconductor power device that includes a plurality of top electrical terminals disposed near a top surface of a semiconductor substrate. Each and every one of the top electrical terminals comprises a terminal contact layer formed as a silicide contact layer near the top surface of the semiconductor substrate. The trench gates of the semiconductor power device are opened from the top surface of the semiconductor substrate and each and every one of the trench gates comprises the silicide layer configured as a recessed silicide contact layer disposed on top of every on of the trench gates slightly below a top surface of the semiconductor substrate surround the trench gate.

5 Claims, 85 Drawing Sheets

Related U.S. Application Data continuation of application No. 14/292,880, filed on May 31, 2014, now Pat. No. 9,252,239, which is a division of application No. 12/802,185, filed on Jun. 1, 2010, now Pat. No. 8,779,510.

(51) Int. Cl.
*H01L 29/78* (2006.01)
*H01L 21/8234* (2006.01)
*H01L 29/423* (2006.01)
*H01L 29/40* (2006.01)
*H01L 29/49* (2006.01)
*H01L 29/10* (2006.01)
*H01L 27/02* (2006.01)
*H01L 29/06* (2006.01)
*H01L 29/872* (2006.01)
*H01L 29/861* (2006.01)
*H01L 21/3065* (2006.01)

(52) U.S. Cl.
CPC .. *H01L 29/66136* (2013.01); *H01L 29/66143* (2013.01); *H01L 29/66666* (2013.01); *H01L 29/66674* (2013.01); *H01L 29/66734* (2013.01); *H01L 29/7806* (2013.01); *H01L 29/7827* (2013.01); *H01L 29/861* (2013.01); *H01L 29/872* (2013.01); *H01L 29/8725* (2013.01)

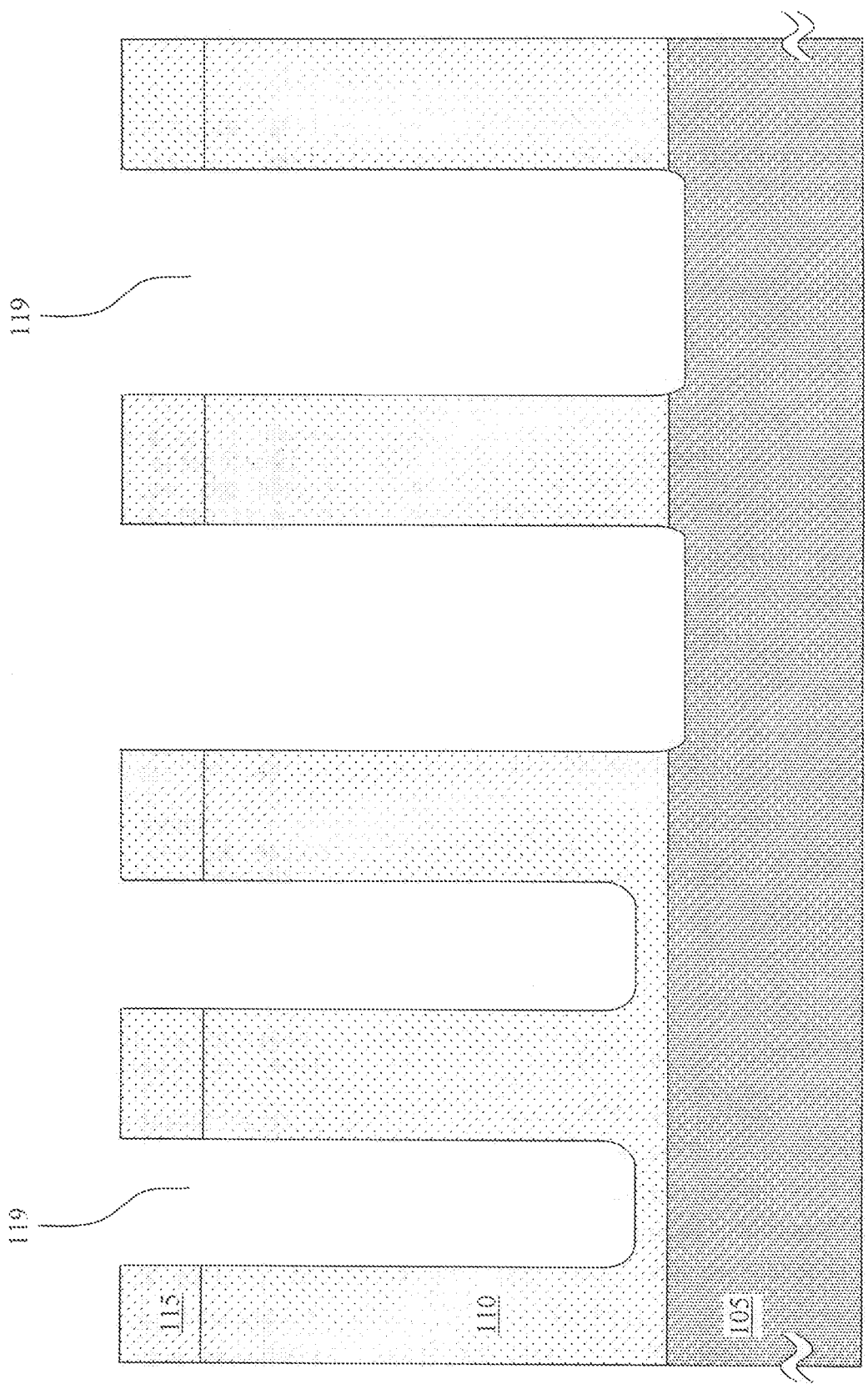

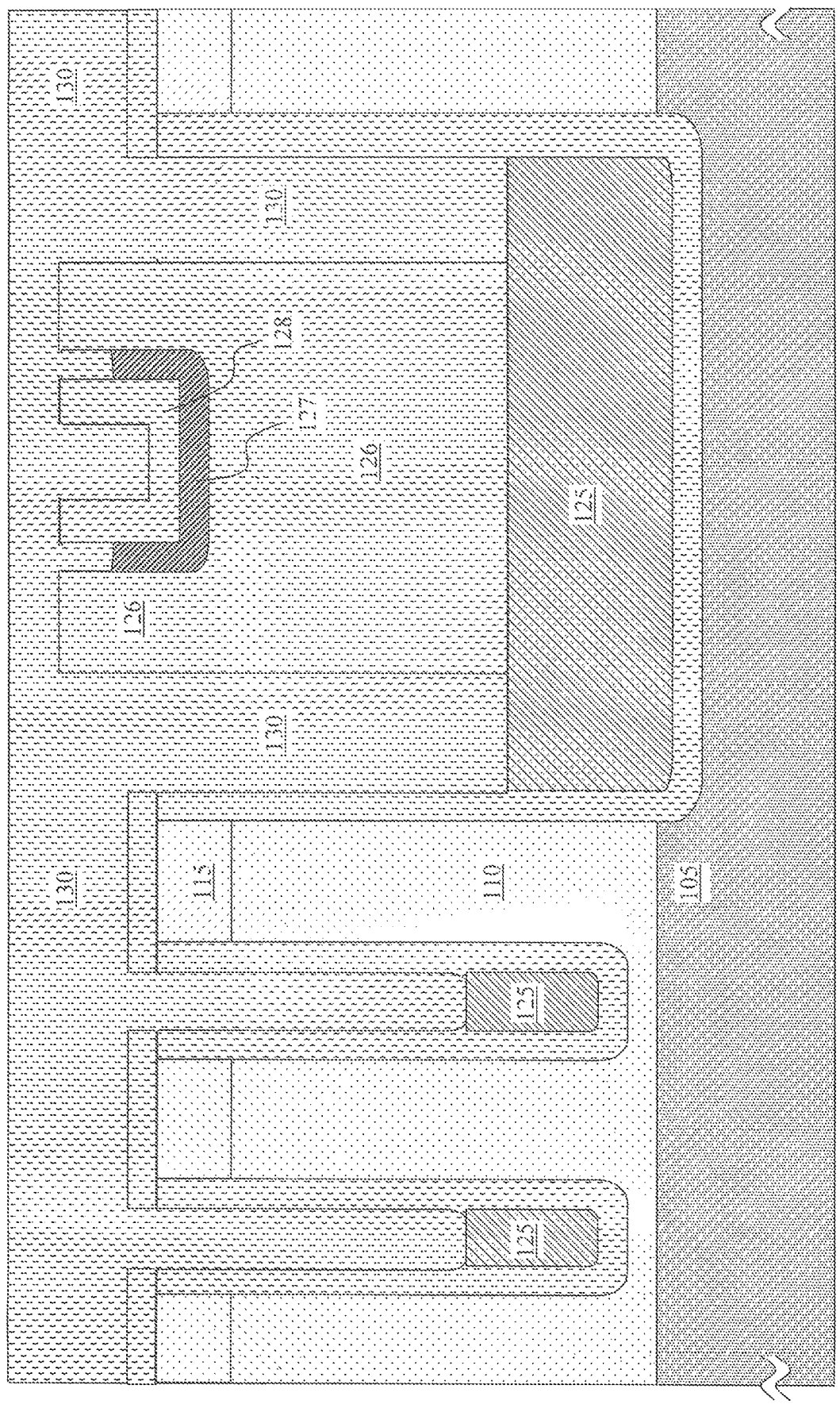

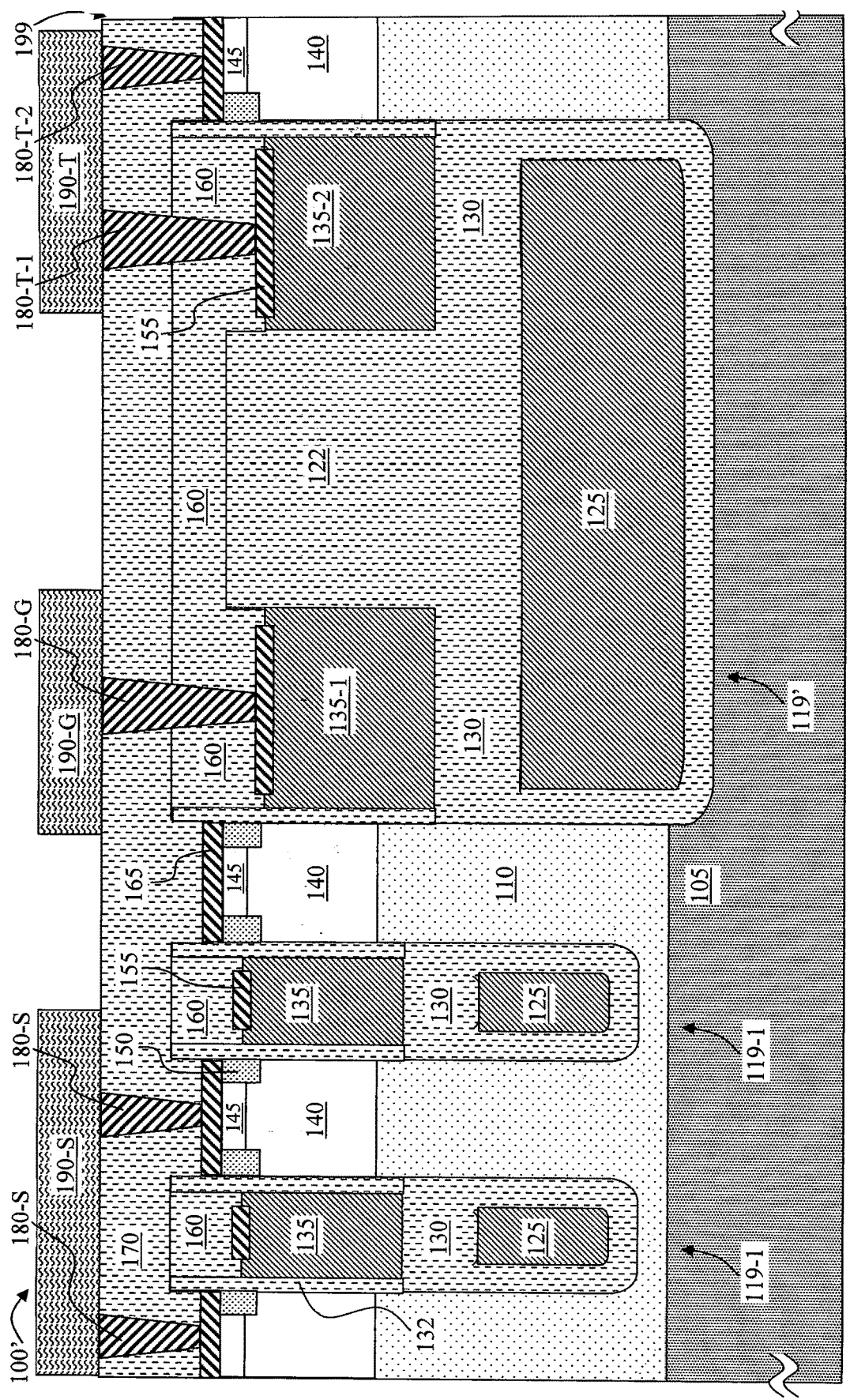
Fig. 3Q'-AA

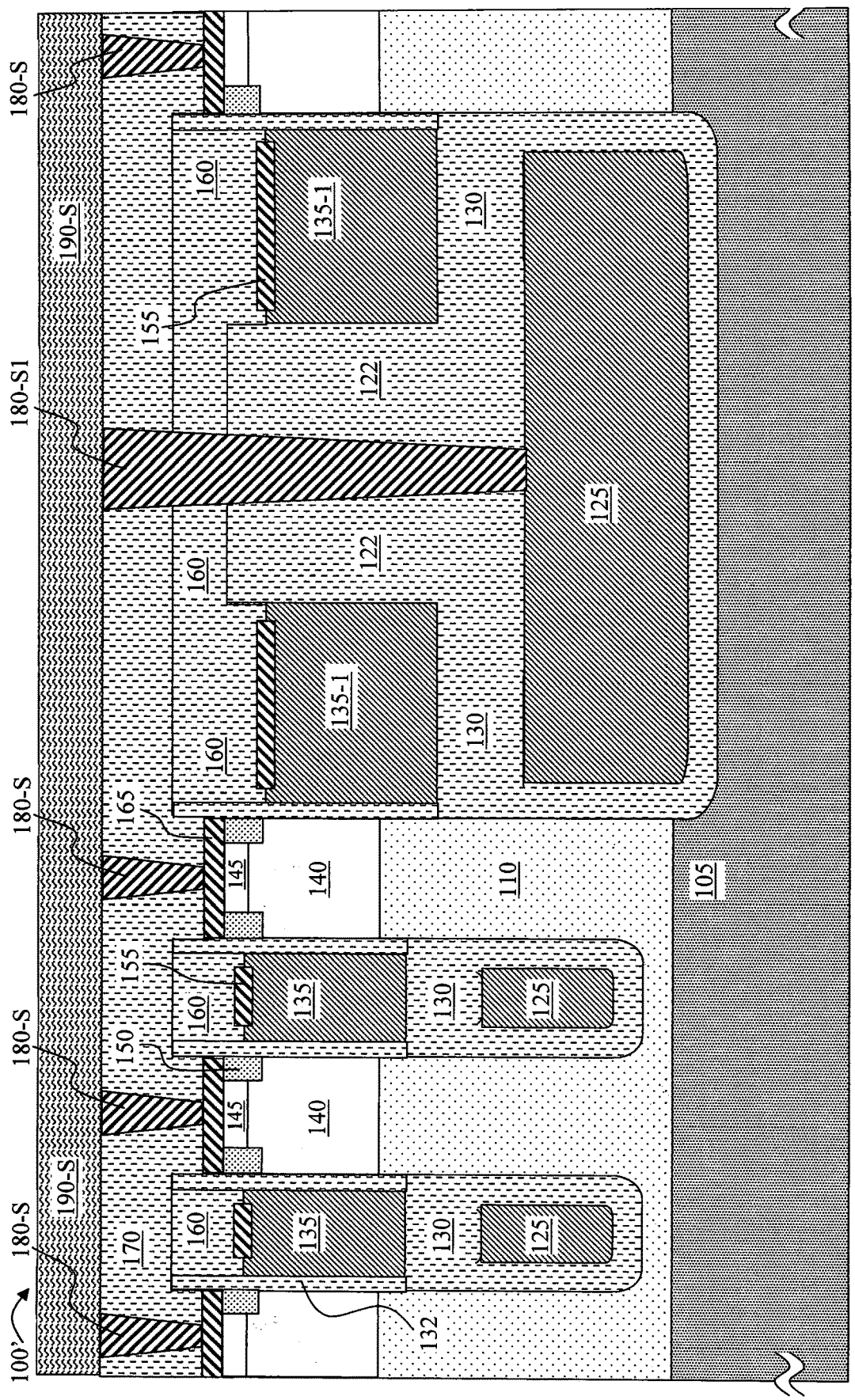
Fig. 3Q'-BB

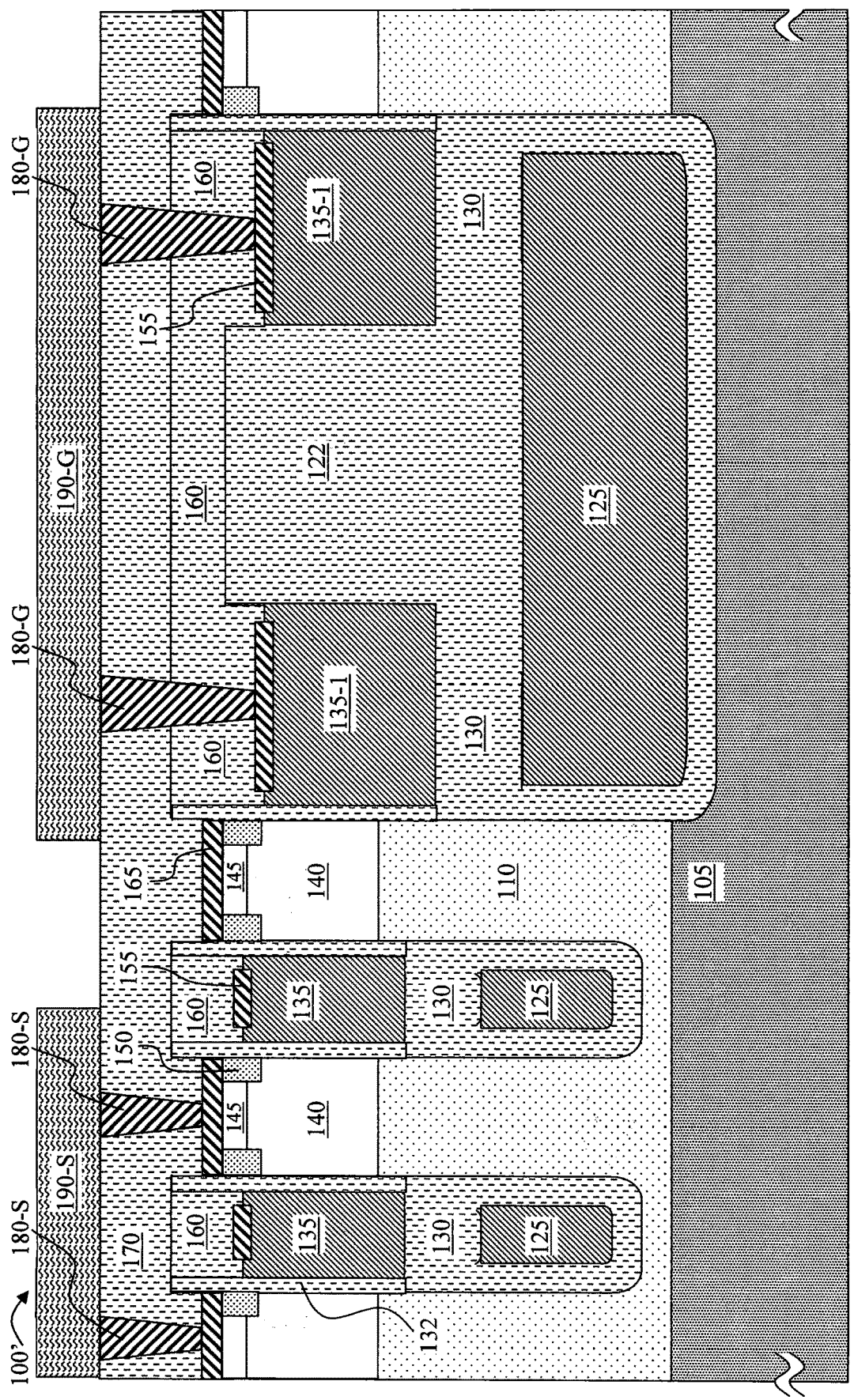
Fig. 3Q'-CC

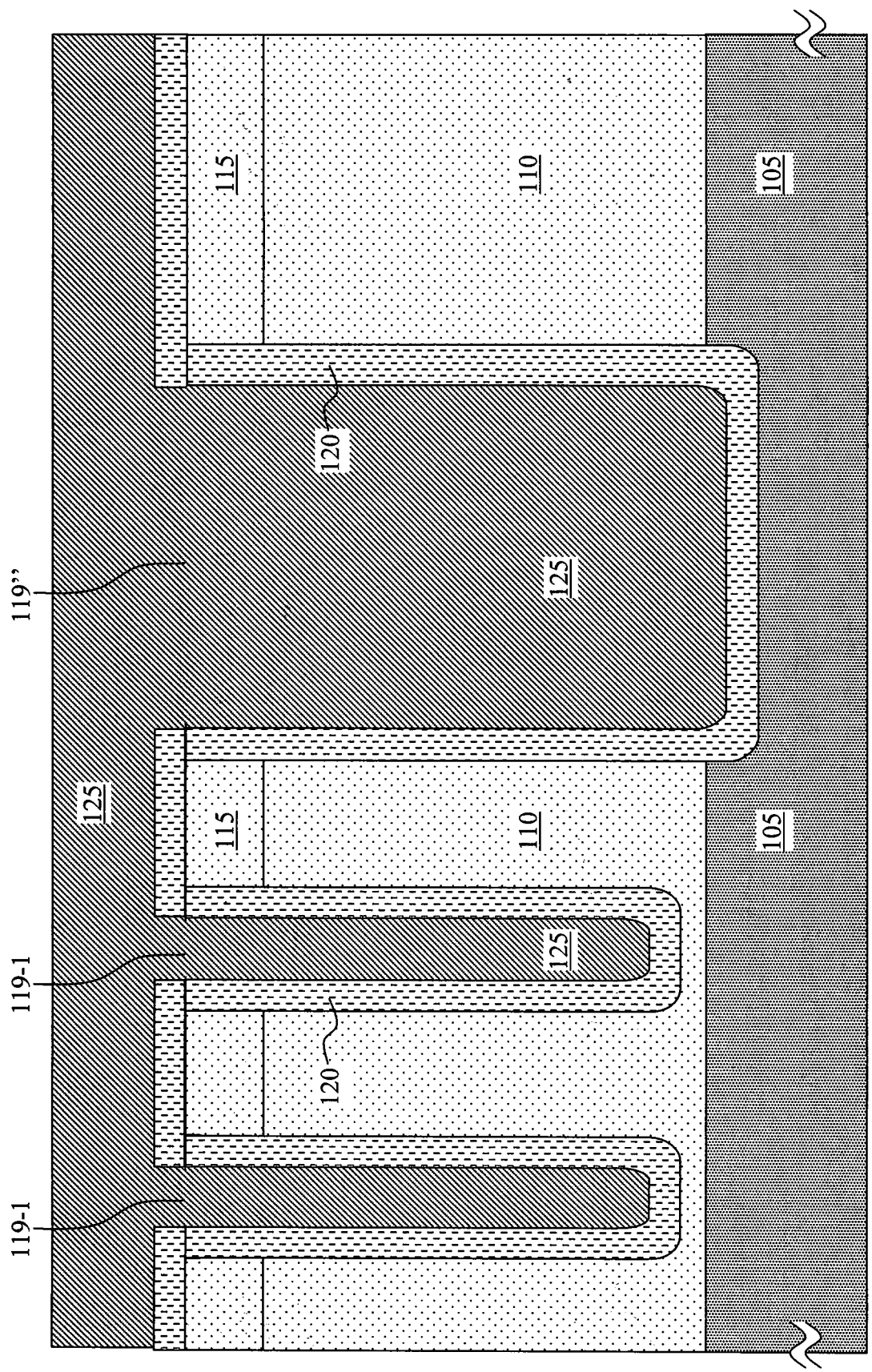

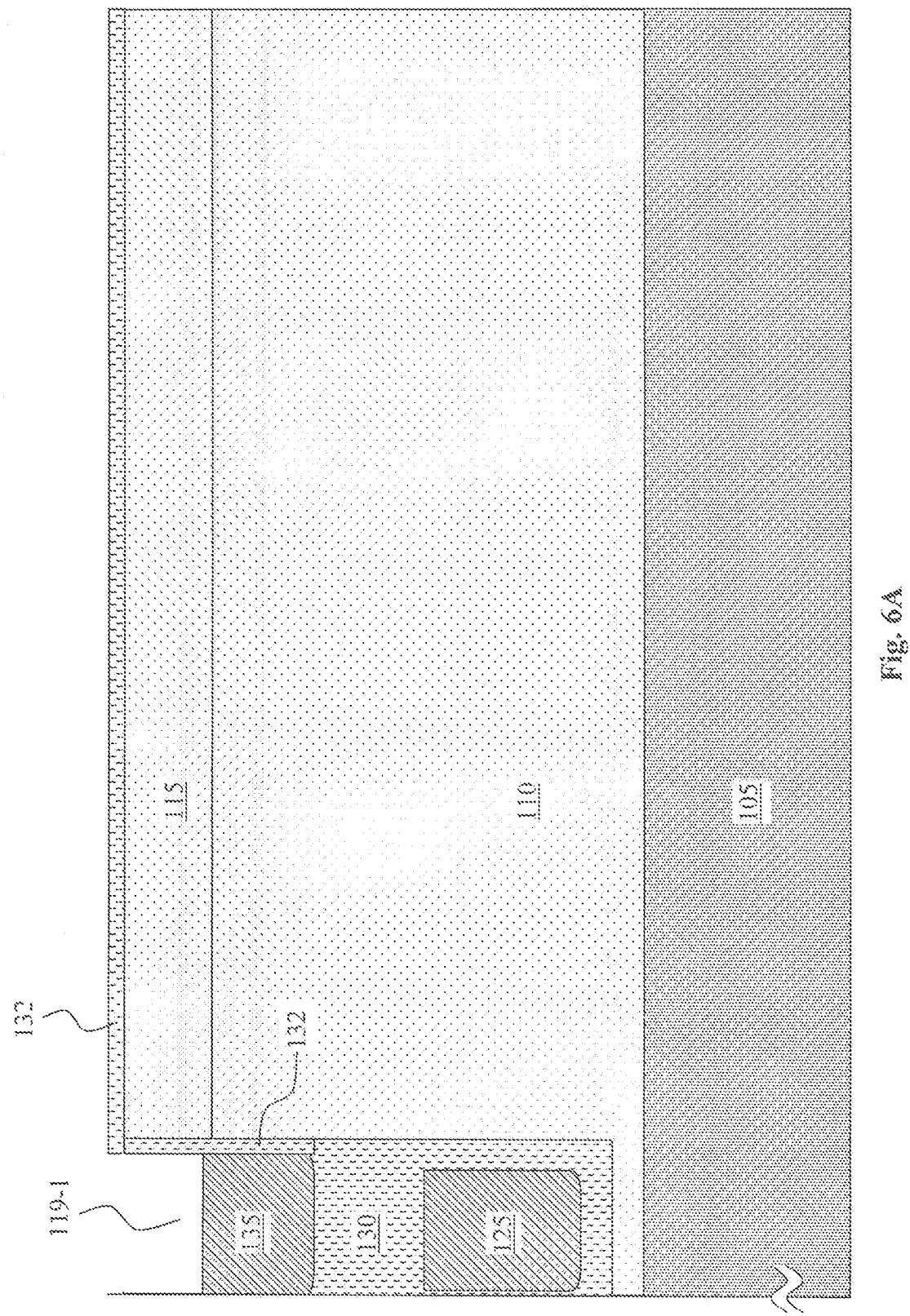

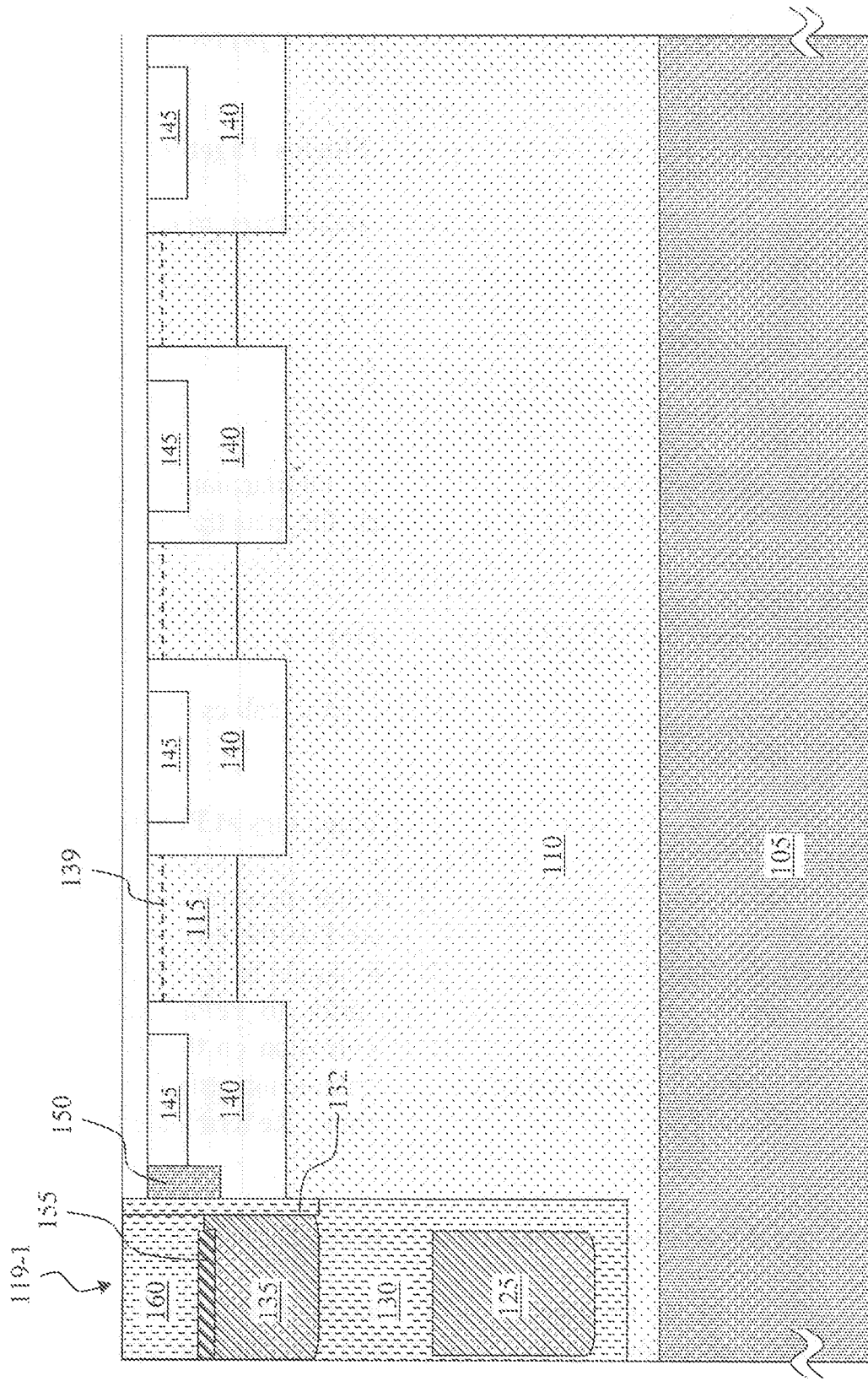

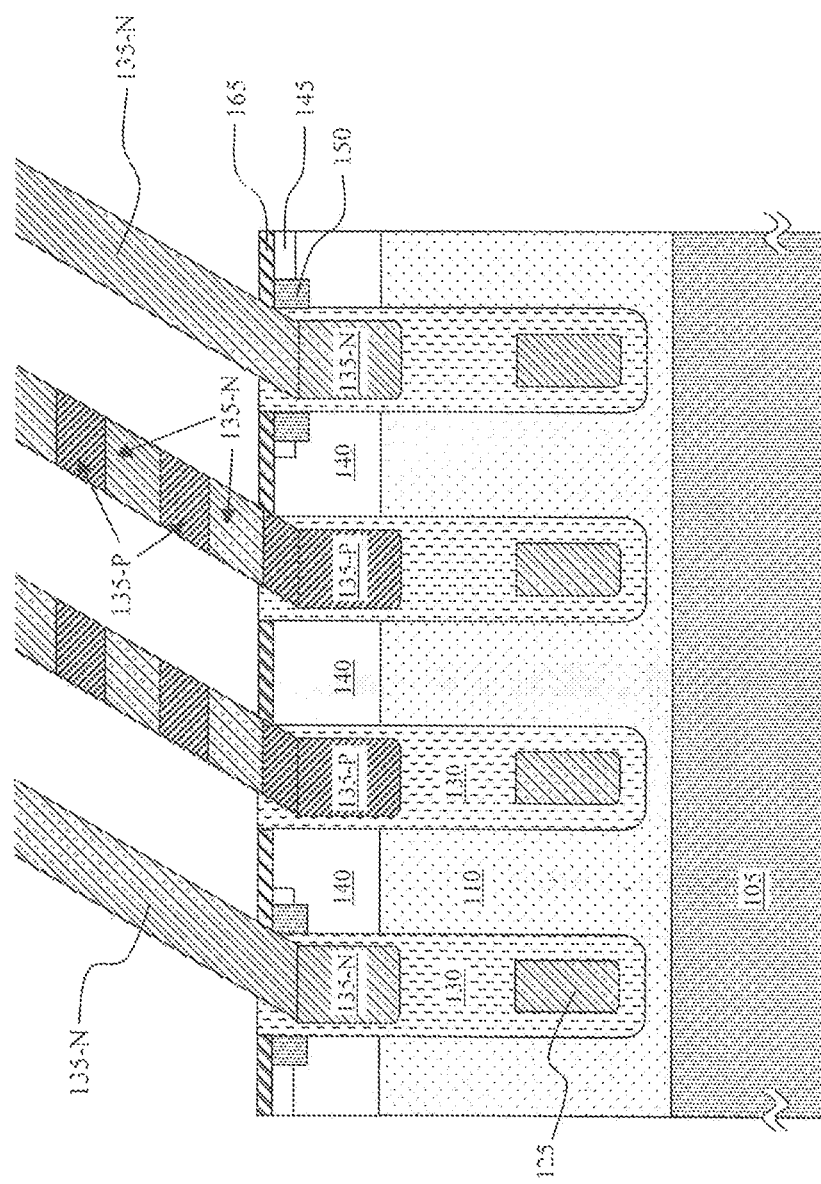

ABSTRACT US 10,608,092 B2

SEMICONDUCTOR POWER DEVICES MANUFACTURED WITH SELF-ALIGNED PROCESSES AND MORE RELIABLE ELECTRICAL CONTACTS

This Patent Application is a Divisional Application and claim the Priority Date of Application of a co-pending application with a Ser. No. 14/987,759 filed on Jan. 5, 2016. Application Ser. No. 14/987,759 is a Continuation Application of Ser. No. 14/292,880 filed on May 31, 2014 and now issued into U.S. Pat. No. 9,252,239 on Feb. 2, 2016. Application Ser. No. 14/292,880 is a Divisional Application of application Ser. No. 12/802,185 filed by common Inventors of this Application on Jun. 1, 2010 and now issued into U.S. Pat. No. 8,779,510 on Jul. 15, 2014.

BACKGROUND OF THE INVENTION

1. Field of the Invention

The invention relates generally to configurations and manufacturing methods of semiconductor power devices. More particularly, this invention relates to configurations and methods for manufacturing semiconductor power devices with a self-aligned process implemented with silicidation processes in recessed trenches to reduce required number of masks and further improve electrical contacts to the electrical terminals of the power device.

2. Description of the Prior Art

Even though power metal oxide semiconductor field effect transistors (MOSFETs) are well known in the semiconductor industry and there have been many patented disclosures and published technical papers related to trench MOSFET devices, e.g., trench FET, trench DMOS, etc., those who are involved in the fields of designing and manufacturing the power MOSFET devices are still confronted with technical difficulties and manufacturability limitations. Specifically, the manufacturing costs are increased when more masks are required to fabricate the power devices with complex configurations. The cost increase is even more severe with the advancement of technology when the structural features of the power device are further miniaturized. Furthermore, with shrunken dimension, the alignment tolerance of the power device is further tightened and that may often lead to reduced production yields and increased reliability issues and thus cause the production cost to increase. For these reasons, a technical challenge is now confronted for those of ordinary skill in the semiconductor industry to fabricate power device with smaller size, more precisely aligned structural features while reducing the number of masks to achieve cost savings.

In a US Patent Application (US 2009/0020810), Marchant discloses a trench MOSFET device manufactured with reduced mask requirements by applying a chemical mechanical planarization (CMP) method. FIG. 1A shows a cross sectional view of the device. However such device requires an extra mask to be used for the gate runner trench, and in the case of a shielded gate trench, another additional mask is needed for a shield runner electrode.

Tsui discloses in another U.S. Pat. No. 6,489,204, a trench MOSFET device formed by first using a hard mask thin SiO2 and Si3N4 films 14 and 15 respectively to etch a trench, and later to angle implant a source region 51 along the upper sidewalls of the trench, using the polysilicon plug 21 and SiO2 and Si3N4 films 14 and 15 as masks, as shown in FIG. 1B-1. As shown in FIG. 1B-2, SiO2 and Si3N4 films 14 and 15 are removed, dielectric spacers 71 are formed along the sidewalls of the trench above the polysilicon plug 22, and P+ body contact region 81 is implanted. In FIG. 1B-3, silicide contacts 91 are formed on the source and body regions 51, 81, and on the (gate) polysilicon plug 22. However, this method can result in the formation of gate to source electrical shorts due to the source body silicide and the gate silicide being formed at the same time. The spacers may not be enough to prevent bridges and leakage paths to form between the gate silicide and the source/body silicide. In addition, this invention does not disclose how to form a shield gate trench MOSFET, which is a more complex device requiring additional steps and considerations.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved device structure and manufacturing method to reduce the number of masks for manufacturing a semiconductor power device and in the meantime maintain good and reliable electric contacts with low resistance connections to electrical terminals of the power device such that the above-discussed technical limitations and difficulties can be resolved.

Specifically, one aspect of the present invention is to provide a new and improved device structure and manufacturing method with improved self-aligned processing steps by taking advantage of a configuration to form an electrical contact with a recessed trench contact configuration. Additionally, more reliable contacts are formed by forming a silicide contact layer on all electrical terminals on top of the recessed contact near the top surface of the semiconductor substrate. The processes for forming the silicide layer on the top surface and in the recessed electrodes can be performed without requiring additional masks because the self-aligned nature. The un-reacted metal layer other than the silicide contact layer can be removed by applying a chemical removal process without applying a mask. Therefore, the production costs are reduced with reduced number of masks required in manufacturing the semiconductor power devices.

Another aspect of the present invention is to provide a new and improved device structure and manufacturing method by forming a wider trench in the termination area. The wider trench in the termination area is configured to provide several advantages. The silicide contact layer for contacting the gate pad in the termination can be formed with greater contact area thus forming better and more reliable contact to the trench gate. The wider trenches in the termination area can further be implemented to form a termination connection that would enable a high voltage termination structure. Furthermore, the wider trenches in the termination area further allow the lower gate segment in a split gate device to connect directly to a source metal by opening a source contact trench through the wider trench to the lower gate segment thus improve the device performance of the semiconductor power devices.

Another aspect of the present invention is to provide a new and improved device structure and manufacturing method by combining a CMP process with the silicidation processes to form Schottky diodes and/or electrostatic discharge (ESD) protection circuit with limited number of additional masks. Therefore, the performance and functions of the semiconductor power device can be significantly enhanced without inadvertently increasing the production costs by integration the semiconductor power device with the Schottky diodes and/or the ESD protection circuit by simultaneously manufacturing these devices on a same wafer using more streamlined fabrication processes.

Specifically, in a preferred embodiment, this invention discloses a semiconductor power device that includes a plurality of top electrical terminals disposed near a top surface of a semiconductor substrate wherein each and every one of the top electrical terminals comprises a terminal contact layer formed as a silicide contact layer near the top surface of the semiconductor substrate. In an embodiment, the semiconductor power device further comprises trench gates opened from the top surface of the semiconductor substrate and each and every one of the trench gates comprises the silicide layer configured as a recessed silicide contact layer disposed on top of every on of the trench gates slightly below a top surface of the semiconductor substrate surround the trench gate. In another embodiment, the semiconductor power device further comprises a vertical semiconductor power device having at least a bottom electrical terminal disposed on a bottom surface of the semiconductor power device for conducting a current between one of the top electrical terminals to the bottom electrical terminal. In another embodiment, the semiconductor power device further comprises a MOSFET (metal oxide semiconductor field effect transistor) device having a source electrode as one of the top electrical terminals disposed near the top surface of the semiconductor and a drain electrode formed as a bottom electrical terminal disposed on a bottom surface of the semiconductor power device for conducting a current between the source electrode and the drain electrode. In another embodiment, the semiconductor power device further comprises a bottom source MOSFET (BS-MOSFET) device having a drain electrode configured as one of the top electrical terminals disposed near the top surface of the semiconductor and a source electrode as a bottom electrical terminal disposed on a bottom surface of the semiconductor power device for conducting a current between the source electrode and the drain electrode. In another embodiment, the semiconductor power device further comprises a trench MOSFET device having a source electrode and a trench gate electrode configured as the top electrical terminals disposed near the top surface of the semiconductor and a drain electrode as a bottom electrical terminal disposed on a bottom surface of the semiconductor power device for conducting a current between the source electrode and the drain electrode. In another embodiment, the semiconductor power device further comprises a bottom source trench MOSFET device having a drain electrode and a gate electrode configured the top electrical terminals disposed near the top surface of the semiconductor and a source electrode as a bottom electrical terminal disposed on a bottom surface of the semiconductor power device for conducting a current between the source electrode and the drain electrode. In another embodiment, each of the trench gates further having a split gate configuration comprises at least a bottom gate segment and a top gate segment insulated and separated by an inter-layer dielectric (ILD) layer disposed between the top and bottom gate segment wherein the recessed silicide contact layer disposed on top of the top gate segment slightly below the top surface of the semiconductor substrate surrounding the trench gate. In another embodiment, the semiconductor power device further includes a termination area having the trench gates opened with greater width whereby the recessed silicide contact layer in the termination area having a greater contact area for reducing a contact resistance from the recessed silicide contact to a top gate pad. In another embodiment, each of the trench gates further having a split gate configuration comprises at least a bottom gate segment and a top gate segment insulated and separated by an inter-layer dielectric (ILD) layer disposed between the top and bottom gate segment wherein the recessed silicide contact layer disposed on top of the top gate segment slightly below the top surface of the semiconductor substrate surrounding the trench gate; and a source metal disposed on top of the semiconductor power device electrically connected to a source region of the semiconductor power device and also connected to the bottom gate segment of the trench gates. In another embodiment, the semiconductor power device further includes a Schottky diode integrated with the semiconductor power device on the semiconductor substrate wherein the silicide contact layer constituting a Schottky barrier layer of the Schottky diode contacting the top surface of the semiconductor substrate. In another embodiment, the Schottky diode further comprising a barrier height dopant layer disposed immediately below the Schottky barrier layer for adjusting a barrier height of the Schottky diode. In another embodiment, the semiconductor power device further includes an electrostatic discharge (ESD) protection diode integrated with the semiconductor power device disposed in the semiconductor substrate wherein the silicide contact layer constituting a cathode/anode contact layer of the ESD protection diode comprising a PN junction in the semiconductor substrate. In another embodiment, the semiconductor power device further includes a termination area having the trench gates opened with greater width whereby the recessed silicide contact layer in the termination area having a greater contact area for electrically contacting another silicide contact layer disposed on an edge of the semiconductor substrate to form a high voltage termination for the semiconductor power device. In another embodiment, the semiconductor power device further includes a termination area having the trench gates opened with a greater width surrounding edges of the semiconductor substrate and the recessed silicide contact layer in the termination area having a greater contact area for connecting to a gate pad disposed near one of the edges of the semiconductor substrate. In another embodiment, the semiconductor power device further includes an electrostatic discharge (ESD) protection diode integrated with the semiconductor power device disposed in the semiconductor substrate wherein the silicide contact layer constituting a cathode/anode contact layer of the ESD protection diode comprising a PN junction in the semiconductor substrate; and a termination area having the trench gates opened with a greater width surrounding edges of the semiconductor substrate and the recessed silicide contact layer in the termination area having a greater contact area for connecting to a gate pad disposed near one of the edges of the semiconductor substrate; and the ESD protection diode is disposed near the gate pad. In another embodiment, the source metal connected to the bottom gate segment of the trench gates is disposed on edges constituting a surrounding stripe surrounding the top surface the semiconductor substrate.

Furthermore, this invention discloses a method for manufacturing semiconductor power device with top and bottom electrical terminals disposed respectively near a top and bottom surfaces of a semiconductor substrate. The method includes a step of forming each and every of the top electrical terminals near a top surface of the semiconductor substrate by applying a self-aligned process comprises first forming a recessed surface for exposing a limited silicidation area slightly below a top surface of the semiconductor substrate followed by depositing a metal layer then carrying out a silicidation process to form a silicide contact layer only on the limited silicidation area and then removing the un-reacted metal layer from the top surface of the semiconductor substrate thus forming each and every one of the top electrical terminals as a silicide contact layer near the top surface of the semiconductor substrate. In an embodiment, the method further includes a step of forming the semiconductor power device as a trench MOSFET with each and every of gate and source terminals disposed near the top surface of the semiconductor substrate comprises the silicide contact layer in electrical contact respectively with a trench and a source region respectively disposed near the top surface of the semiconductor substrate. In an embodiment, the method further includes a step of forming the semiconductor power device as a trench bottom-source MOSFET (BS-MOSFET) with each and every of gate and drain terminals disposed near the top surface of the semiconductor substrate comprises the silicide contact layer in electrical contact respectively with a trench and a drain region respectively disposed near the top surface of the semiconductor substrate. In an embodiment, the method further includes a step of forming the body and source regions near the top surface of the semiconductor substrate by applying an angular implant through sidewalls above the recessed surface of the limited silicidation area whereby the body and source regions are formed with requiring additional masks.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIG. 3O-1 is an alternate processing step for FIG. 3O.

FIG. 3Q'-AA shows a possible MOSFET termination that may be formed from a structure similar to that shown in FIG. 3P'.

FIG. 3Q'-BB shows another optional layout wherein the source metal electrically connected to the first polysilicon layer disposed on the bottom portion of the wide trench through a trench contact.

FIG. 3Q'-CC shows another optional embodiment where the gate contacts is formed from a gate metal to the gate electrodes in the wide trench.

FIGS. 5A to 5E show an alternative method of forming a shield electrode contact.

FIGS. 8A and 8A-1 to 8F are a series of cross sectional views for illustrating the processing steps for an alternative way of manufacturing a MOSFET device integrated with Schottky diodes by applying self-aligned processes to reduce the required number of masks.

FIGS. 10A and 10A-1 to 10E are a series of cross sectional views for illustrating the processing steps for manufacturing a MOSFET device integrated with ESD protection diodes by applying self-aligned processes to reduce the required number of masks.

FIG. 11A is a cross section of a perspective view and FIG. 11B is a top view for showing the layout configuration of a MOSFET device integrated with the ESD protection diodes manufactured with processes shown in FIGS. 10A to 10E.

FIGS. 13A to 13H are a series of cross sectional views for illustrating the alternative processing steps for making a MOSFET device of this invention wherein FIG. 13F-1 shows an alternative method to carry out a process as that shown in FIG. 13F.

DETAILED DESCRIPTION OF THE METHOD

Figure 2A:
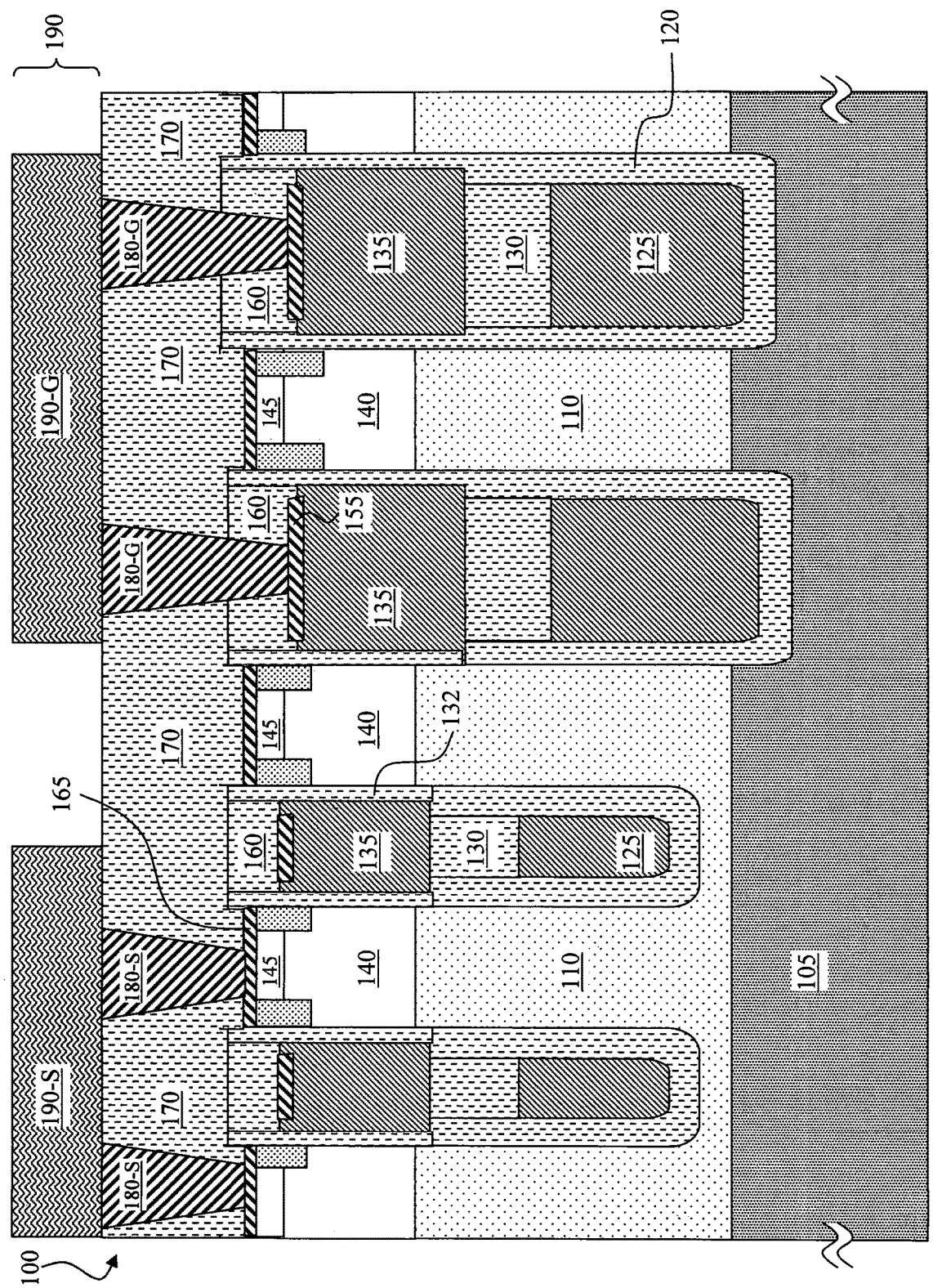
FIG. 2A is a cross sectional view of a MOSFET device formed with silicide contact layers disposed on top of recessed gates and source and body regions with self-aligned processing steps to reduce the number of required masks as an embodiment of this invention.

FIG. 2A shows a cross sectional view of a semiconductor power device, e.g., a trench metal oxide semiconductor field effect transistor (MOSFET) device 100 of this invention. The MOSFET cells are formed in an N-type epitaxial layer 110 supported on an N+ substrate 105. The MOSFET device 100 includes a plurality of trench gates each comprising a bottom polysilicon (poly) segment as a first polysilicon layer 125 padded by a gate insulation layer, e.g., a bottom oxide layer 120 disposed on the bottom portion of the trench. The first polysilicon layer 125 is covered and insulated by an inter-poly dielectric (IPD) layer 130 from a top electrode, e.g., a second polysilicon layer 135. The trench gates are narrower and shallower in the active cell area, covered under the source metal 190-S and generally located near the center of the substrate. The trenches are wider and deeper in certain areas, e.g., in a termination area near the peripheral areas of the substrate, to function as gate bus (or gate runners), and as ohmic contact points to the gate pads 190-G. A silicide gate contact layer 155 is disposed at the top of the second polysilicon layer 135 The second polysilicon layer 135 that has a recessed configuration surrounded by trench sidewalls extended above the silicide gate contact layer 155. As will be further described below, the silicide gate contact layer 155 is formed as a self-aligned process by applying a silicidation process without requiring the application of a mask.

The recessed gates 135 are surrounded by sidewall gate oxide layer 132. Between gate trenches are silicon protuberances with a top surface protruding above the second polysilicon layer 135 and having P– body regions 140 extending between the trench gates with P+ body contact regions 145 formed near the top. Source regions 150 are also formed near the top surface surrounding the P+ body contact regions 145 and adjacent to the trench gates. By way of example, the silicon protuberances may have a width ranging between 0.8 and 2 microns and the source regions 150 may have a width ranging between 0.05 and 0.2 microns. Both source regions 150 and body contact regions 145 are covered by a silicide source/body contact layer 165 which forms a contact to both regions. Again, the silicide source/body contact layer 165 is formed by a self-aligned process without requiring the application of a mask. The silicide source/body contact layer 165 substantially covers the entire top surface of the silicon between gate trenches, and is substantially flat. Though the silicide source/body contact layer 165 extends across the top surface of the silicon regions, it does not extend further down along the sidewalls of the silicon protuberances at the trench gates. The top of the device is covered with oxide layers 160 and 170 opened with contact trenches filled with source/body contact plug 180-S and gate contact plugs 180-G to contact the source pad 190-S and the gate pad 190-G disposed on top of the device.

Figure 2B:
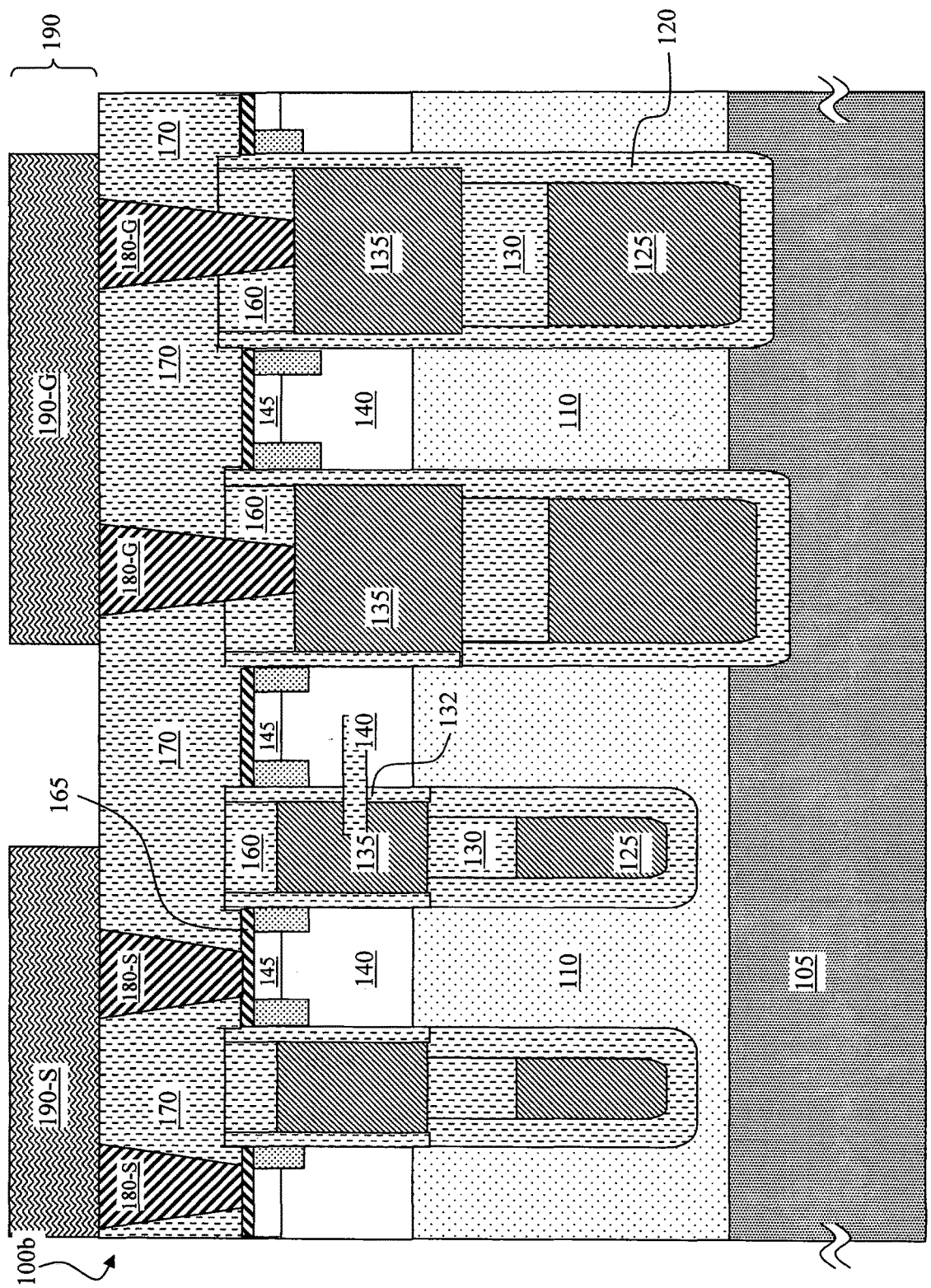
FIG. 2B is a cross sectional view of an alternative MOSFET device formed with silicide contact layers disposed on top of source and body regions with self-aligned processing steps to reduce the number of required masks as an embodiment of this invention.

FIG. 2B is similar to FIG. 2A, except that the MOSFET device 100b of FIG. 2B does not include the gate silicides 155. This can be done to further ensure that there is no gate to source shorting from the silicidation process.

Figure 3A:
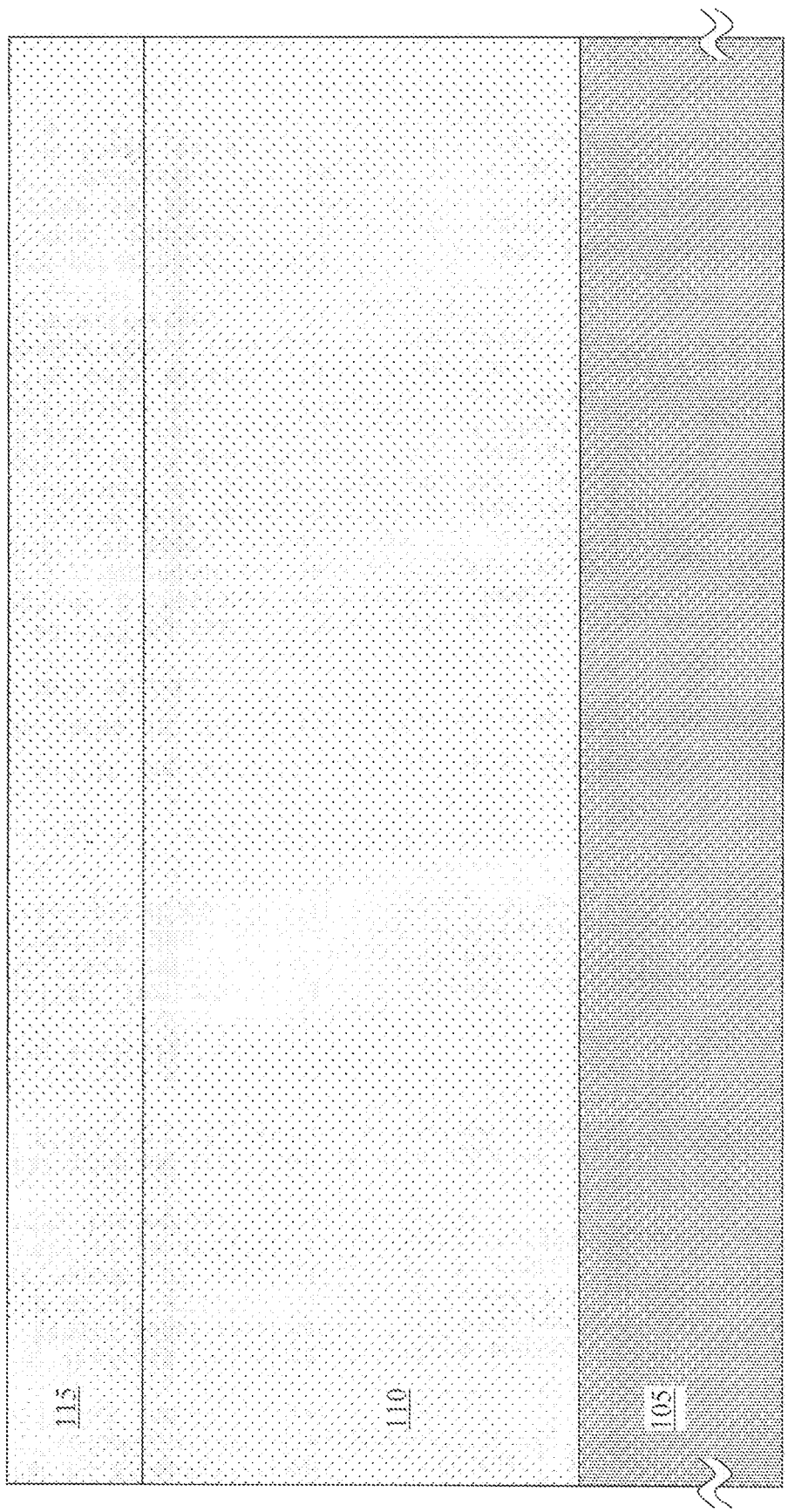
FIGS. 3A to 3Q are a series of cross sectional views for illustrating the processing steps for manufacturing a MOSFET device as shown in FIG. 2A wherein 3M-1 shows an alternate process for FIG. 3M
Figure 3B:
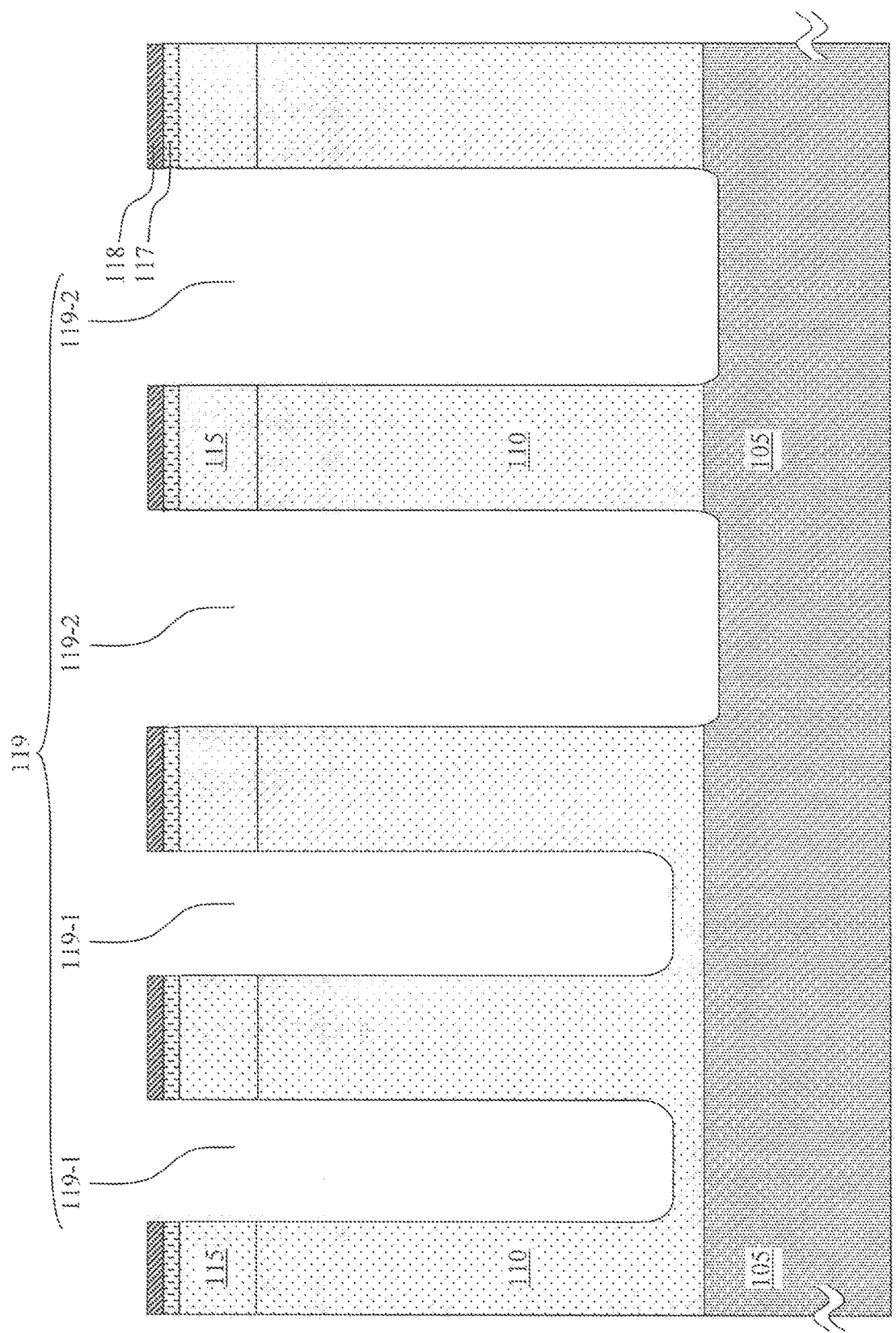
Figure 3D:
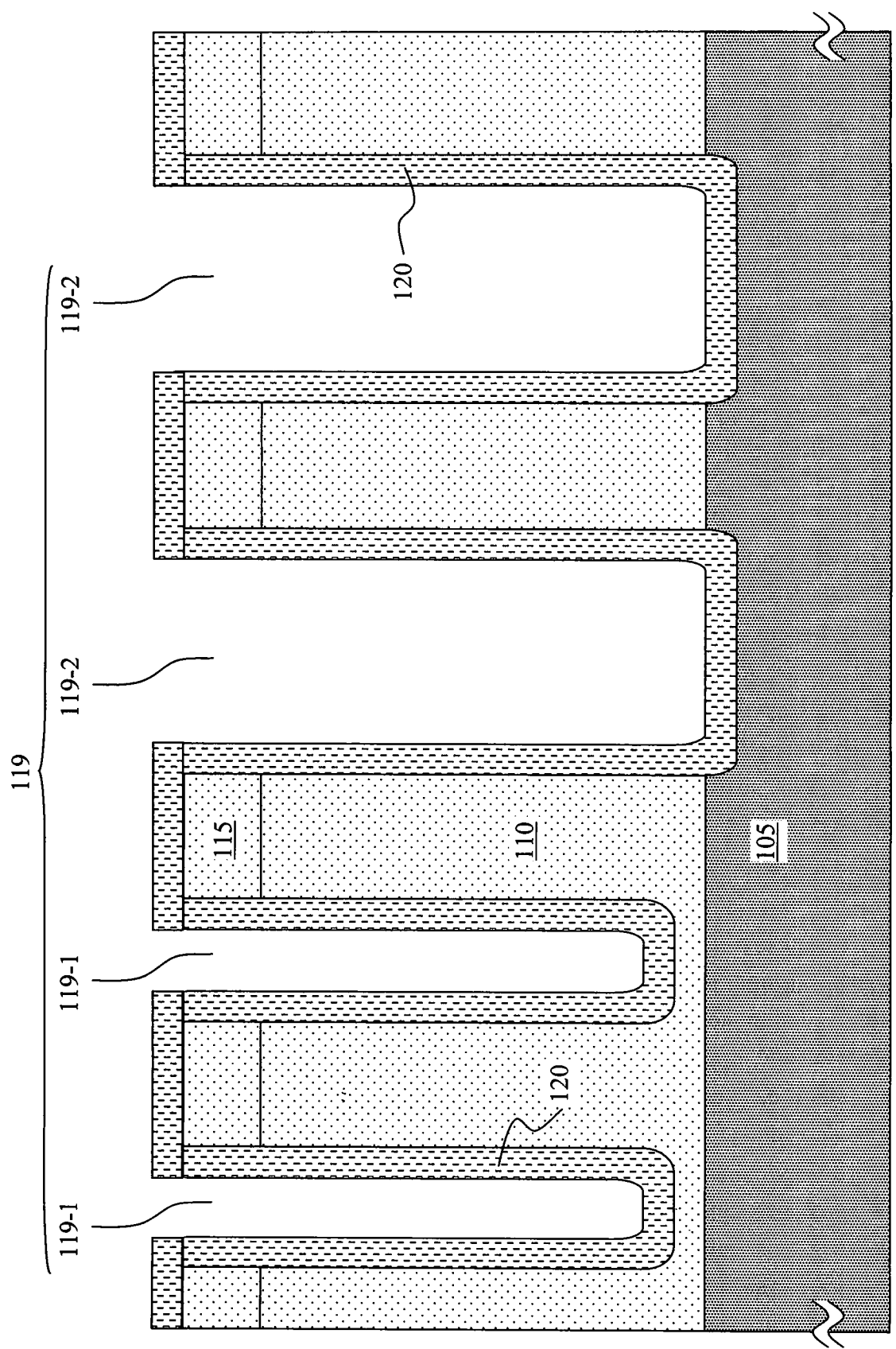
FIGS. 3D' to 3P' are a series of cross sectional views for illustrating processing steps to fabricate a MOSFET device with wide trench as a gate bus, shield electrode contact, and/or termination trench.
Figure 3D:
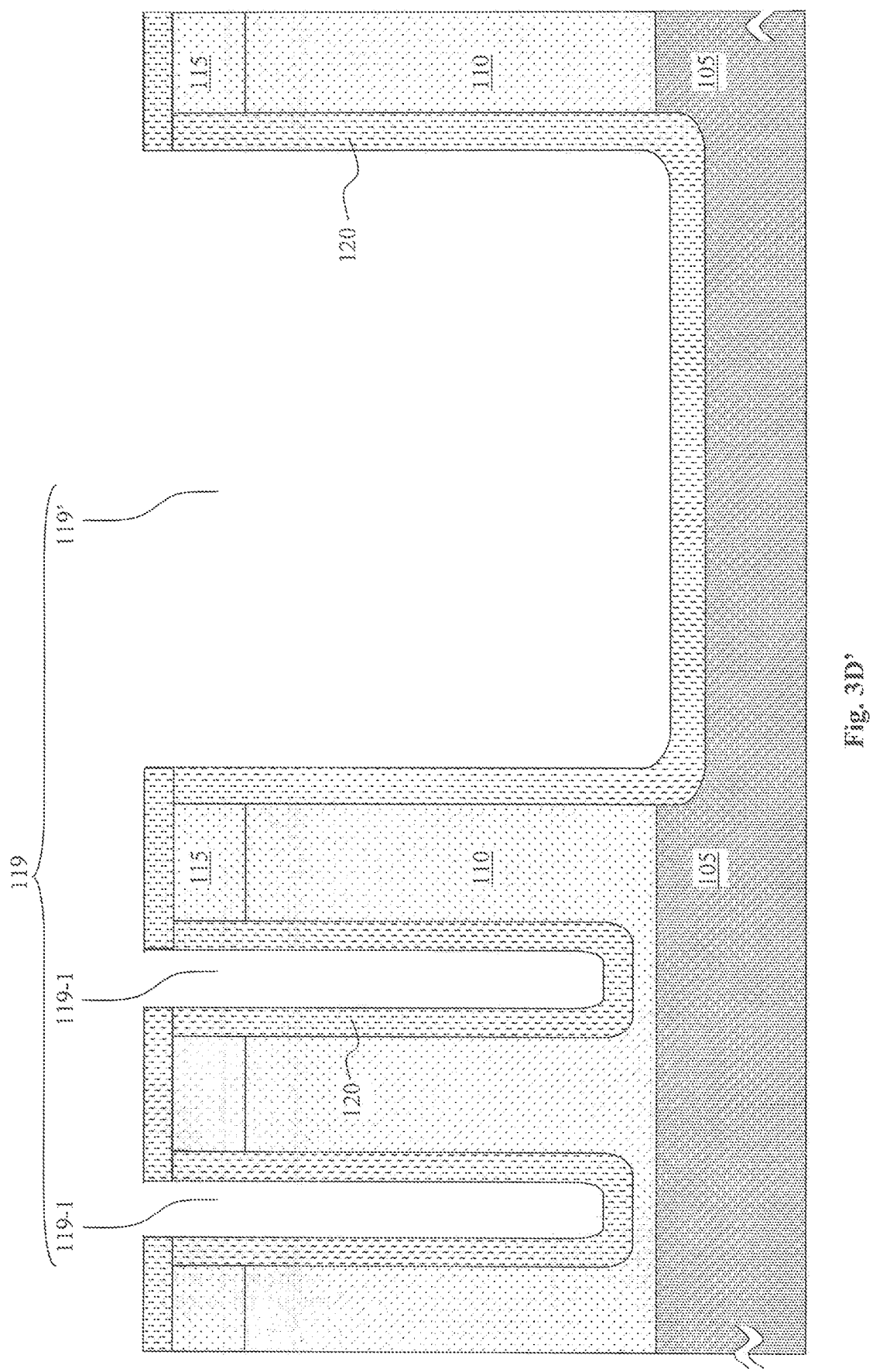
Figure 3E:
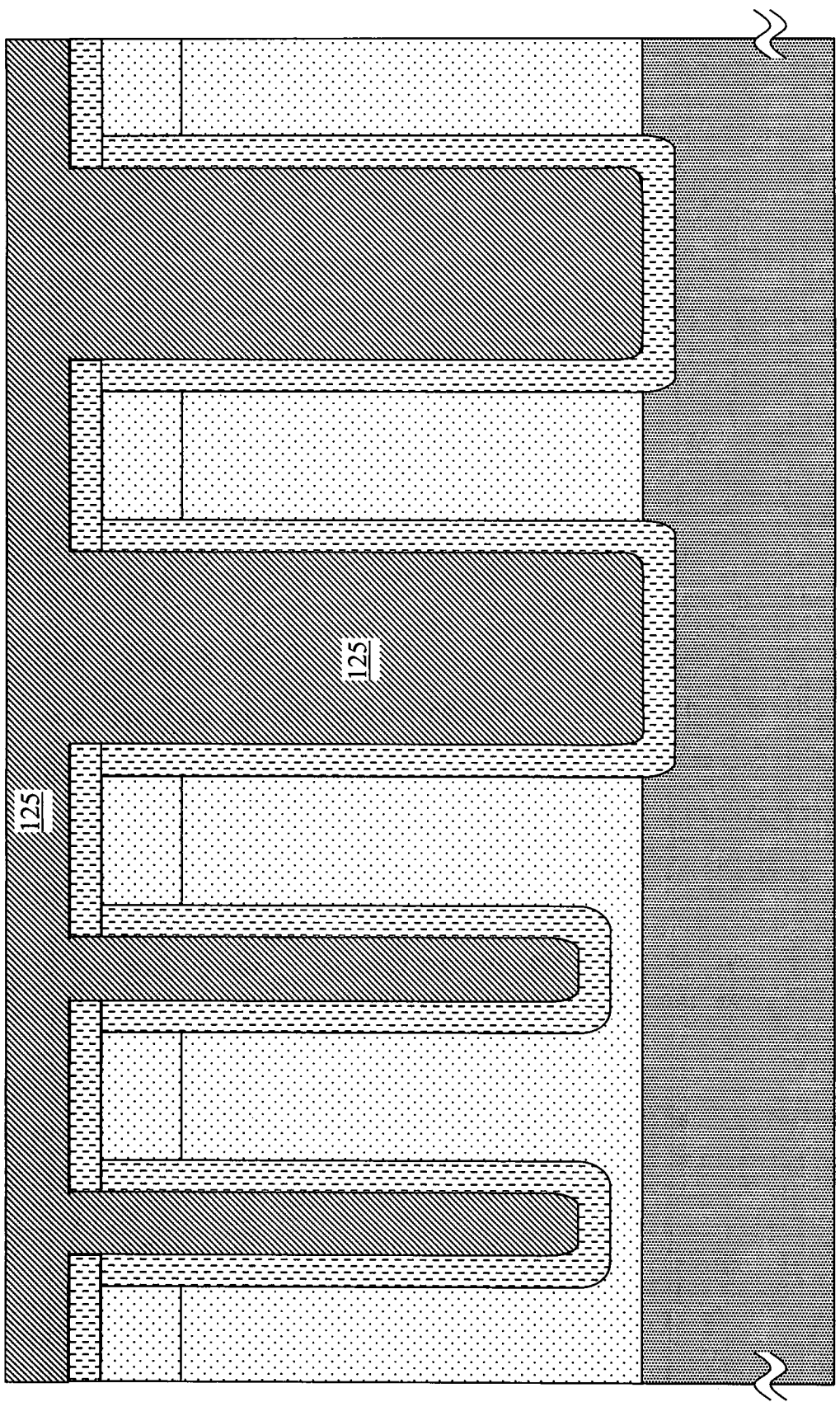
Figure 3E:
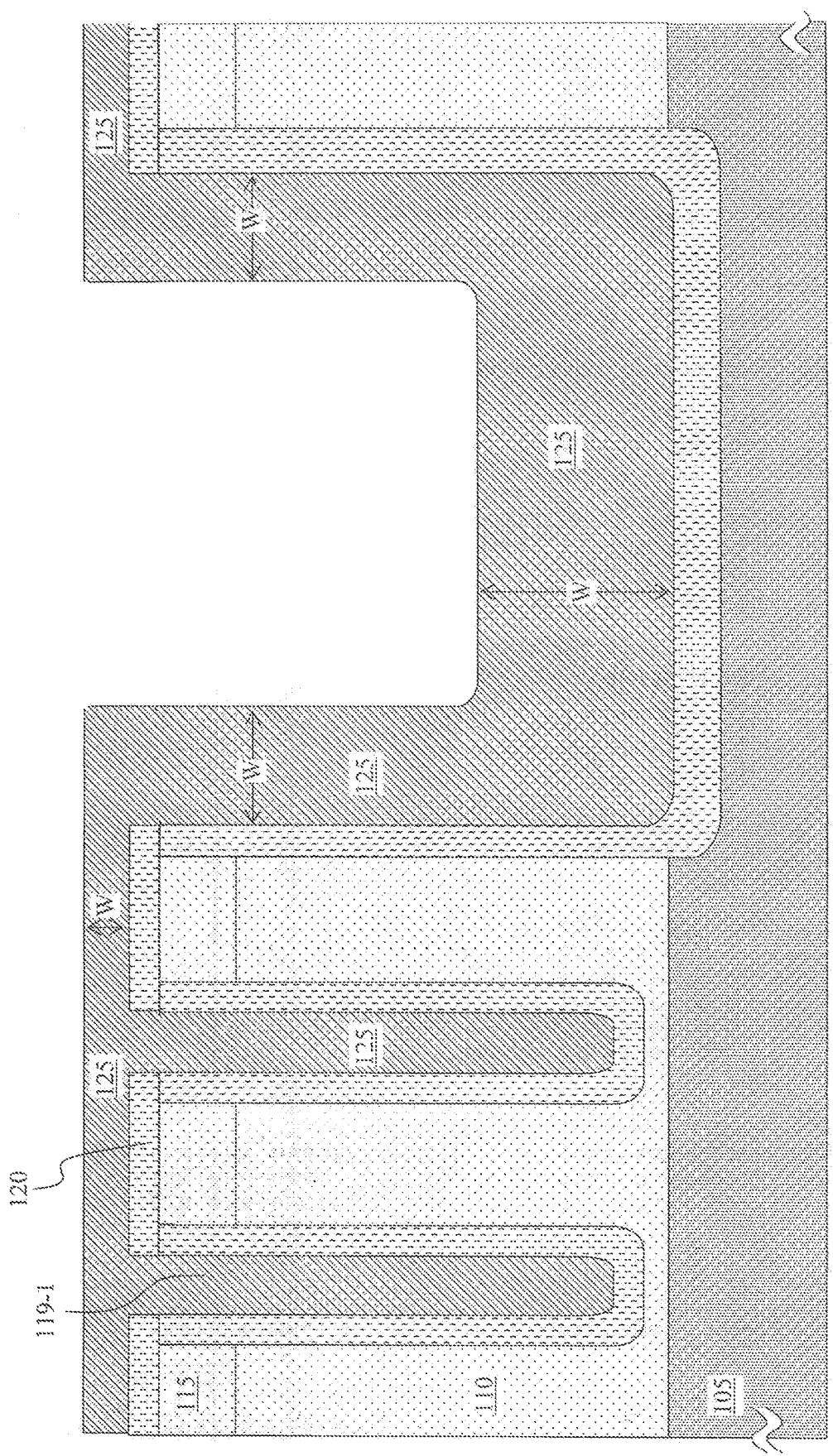
Figure 3E:
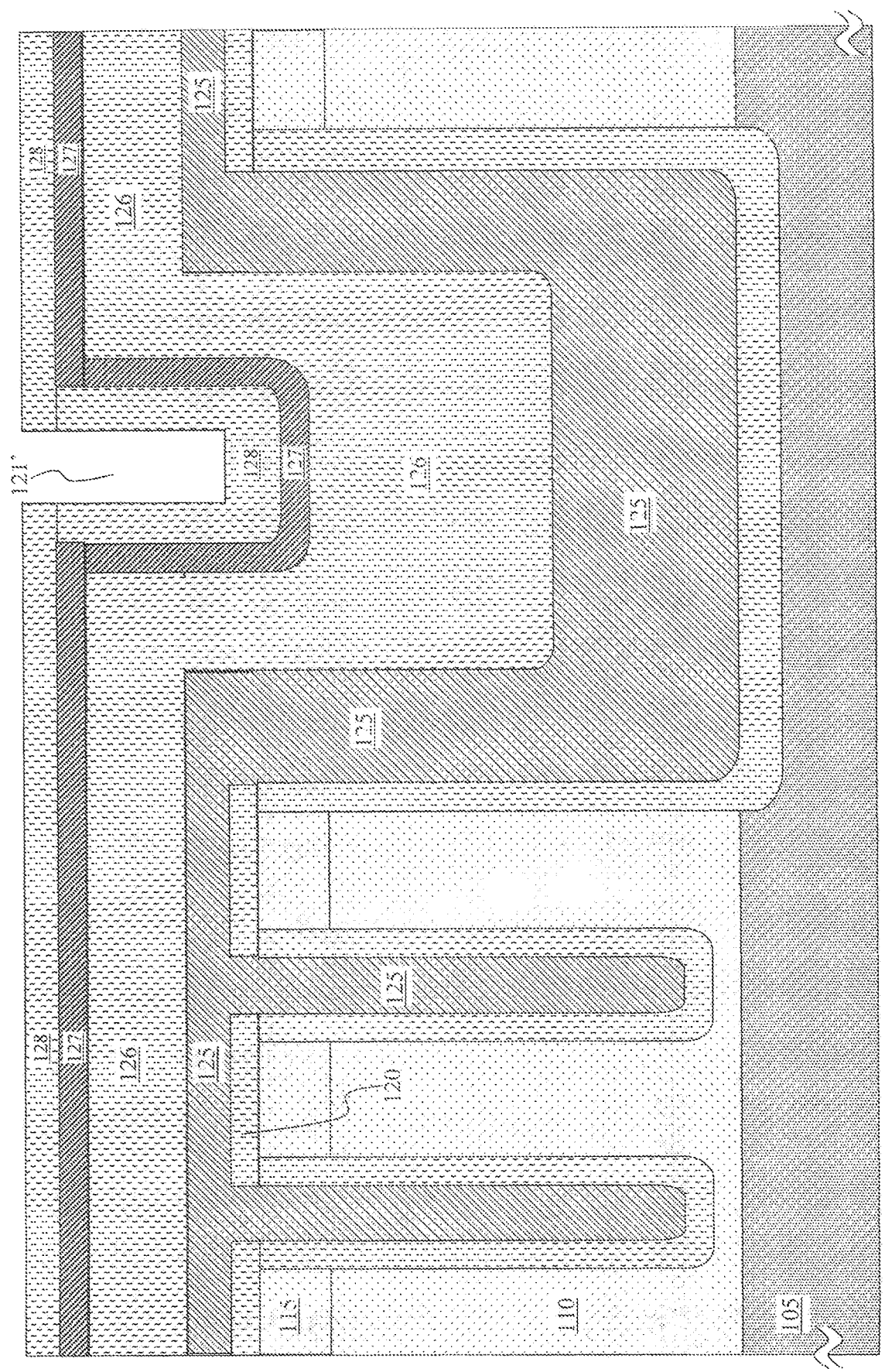
Figure 3E:
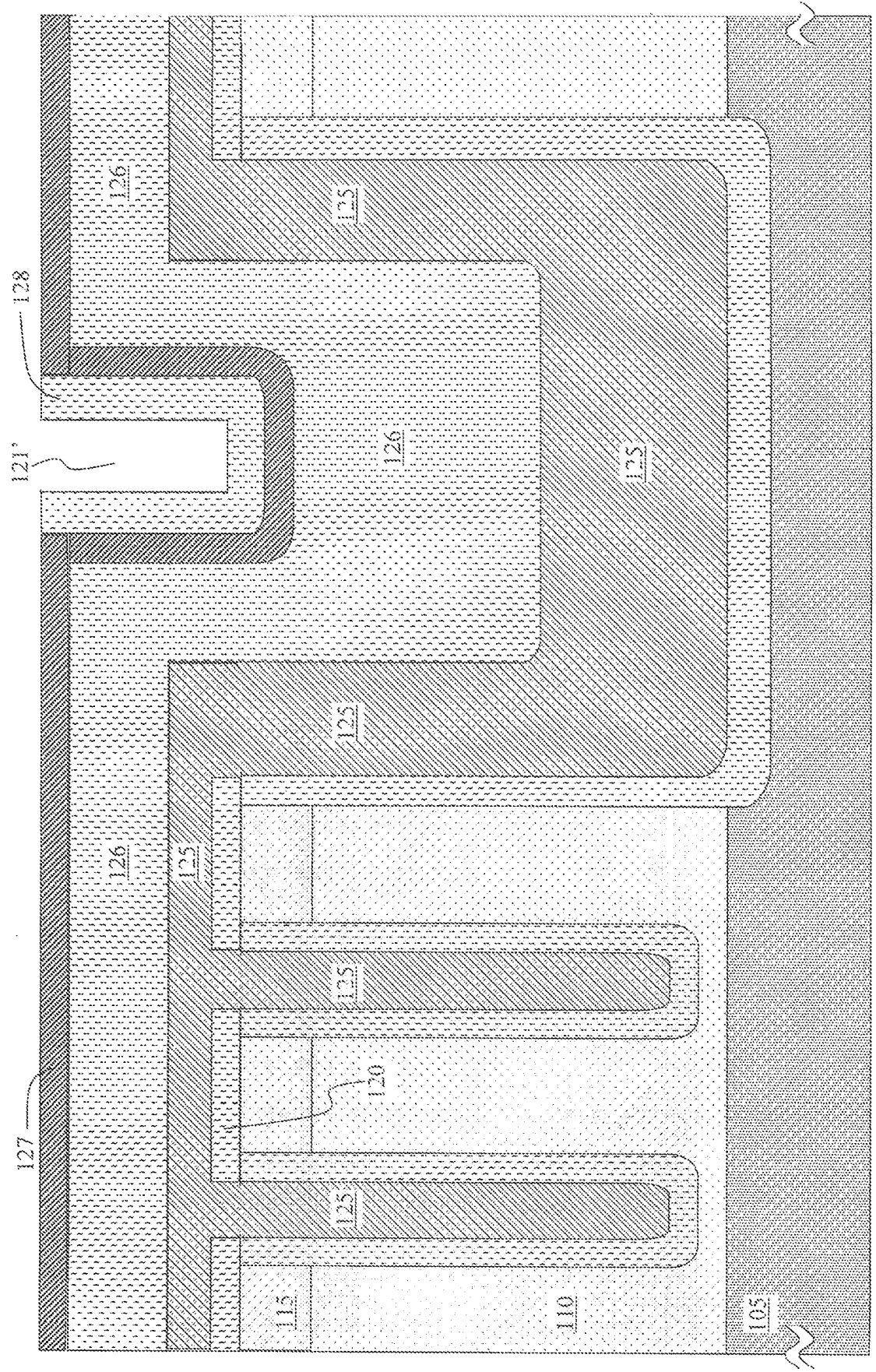
Figure 3E:
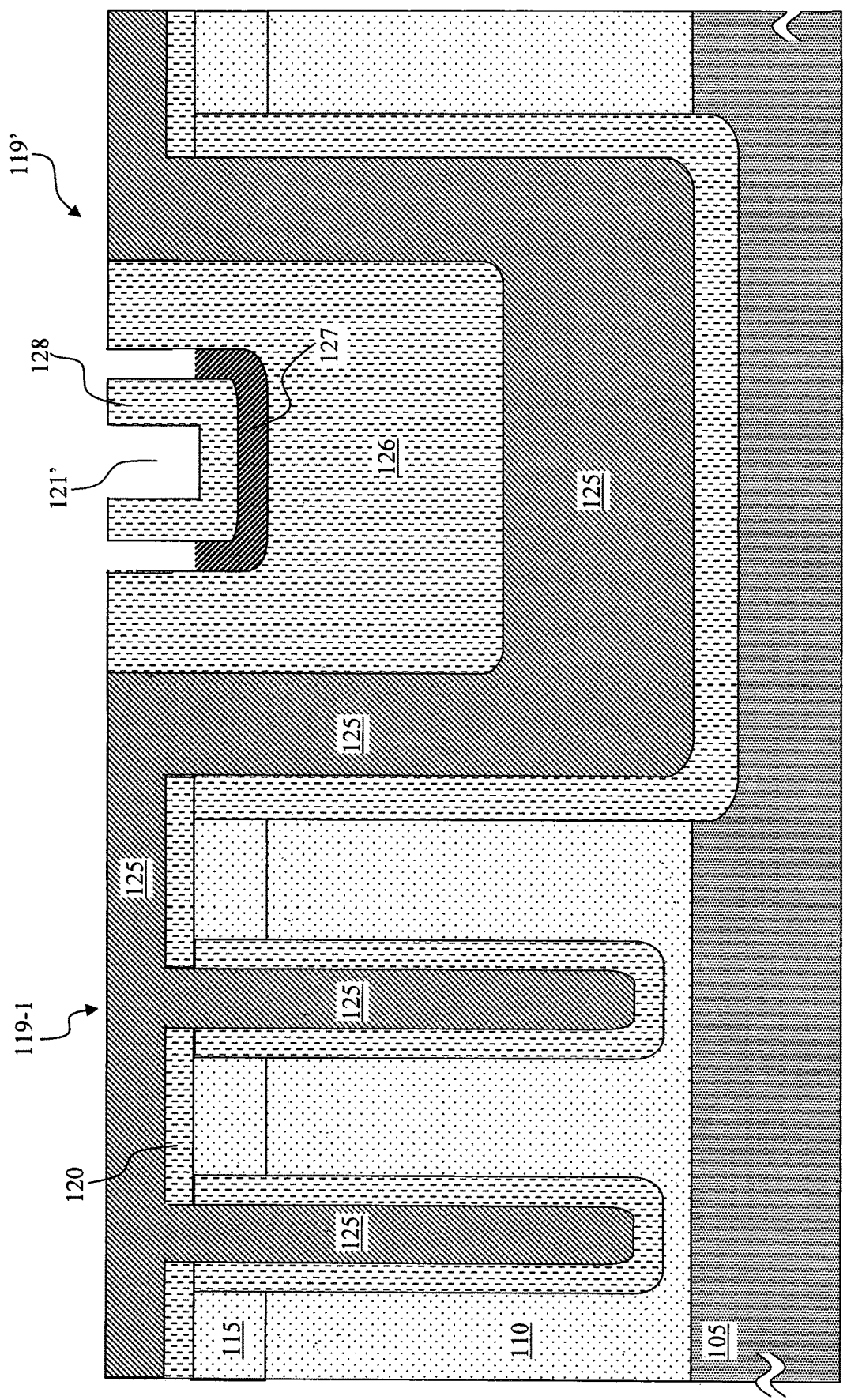
Figure 3F:
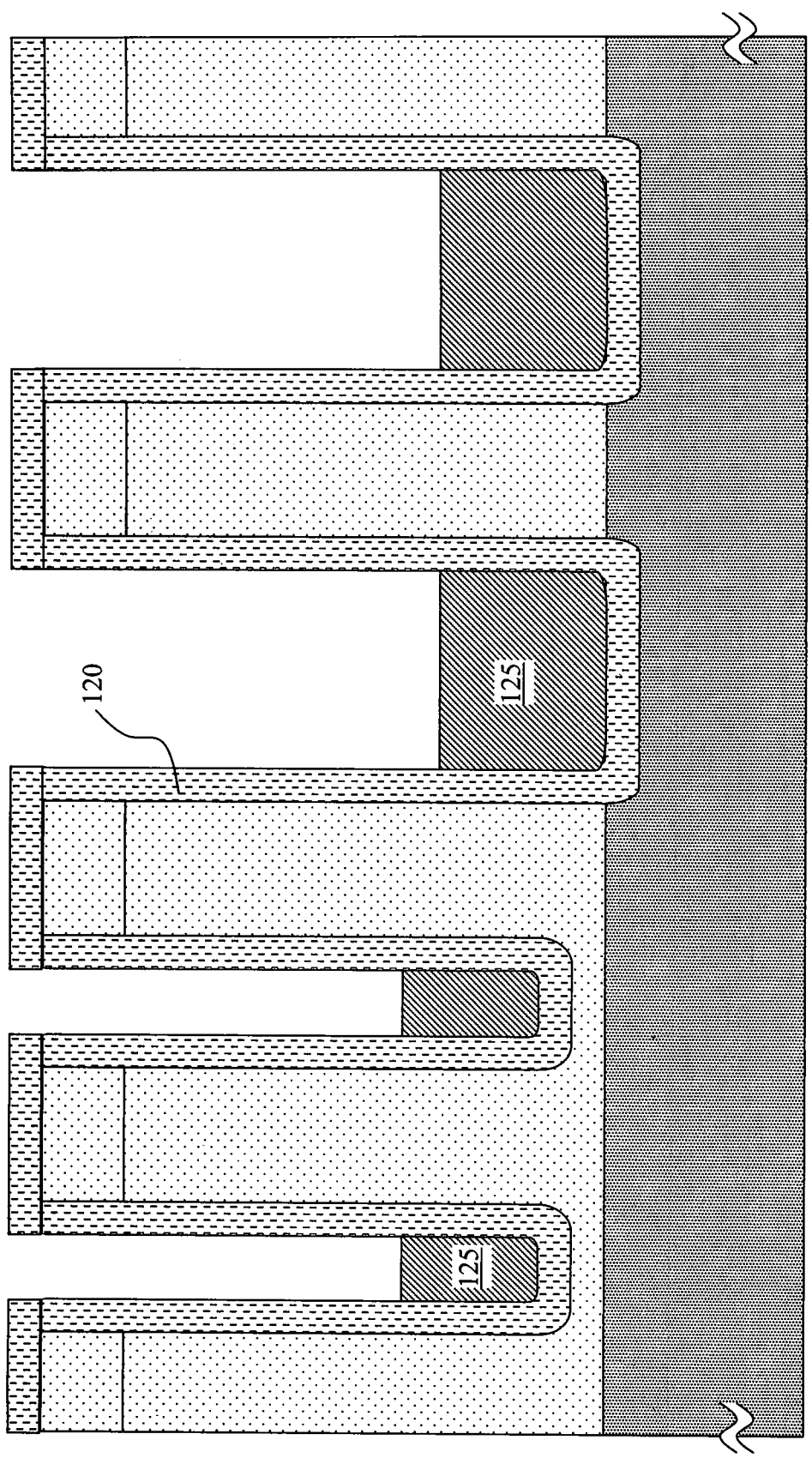
Figure 3F:
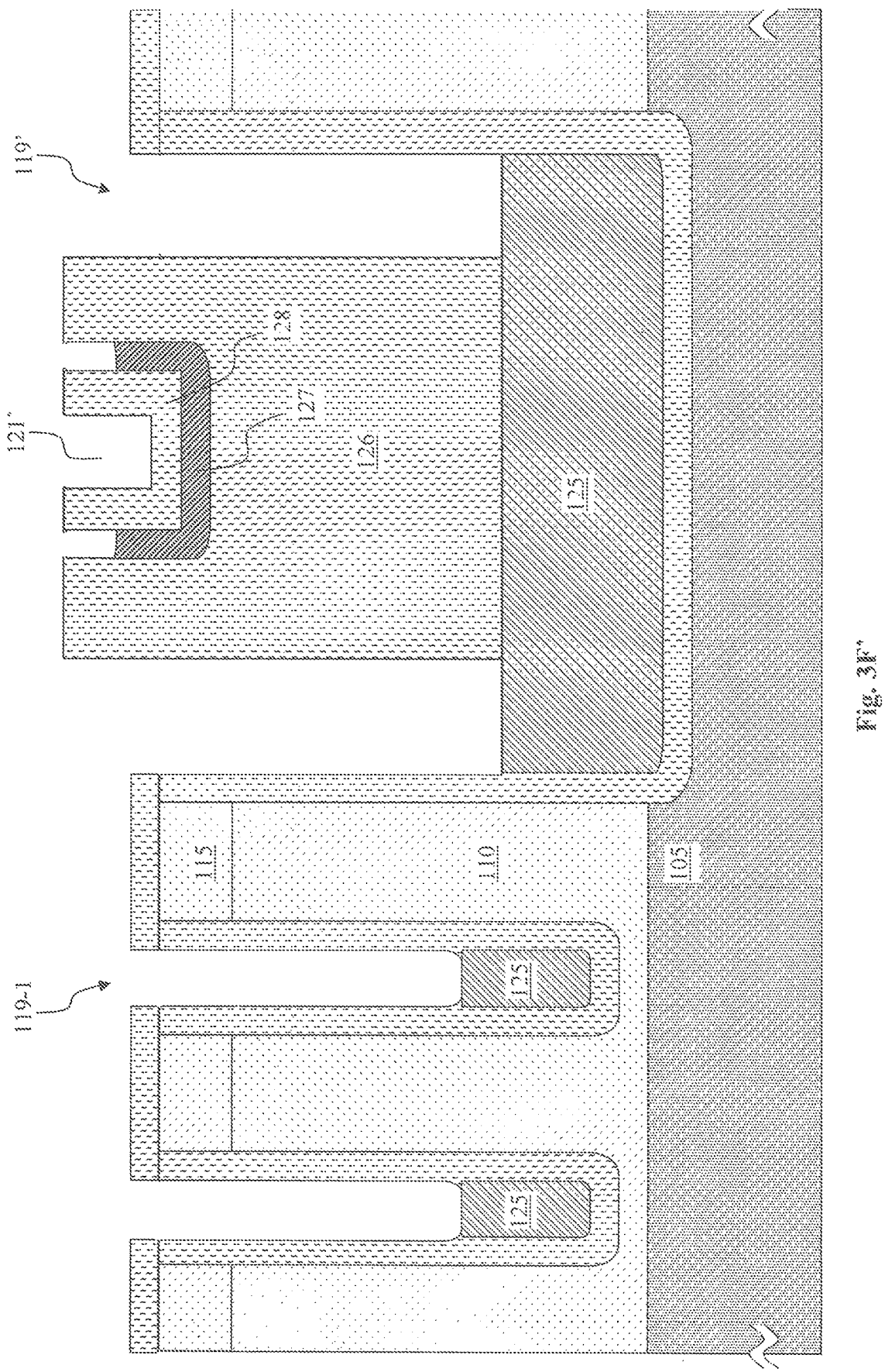
Figure 3G:
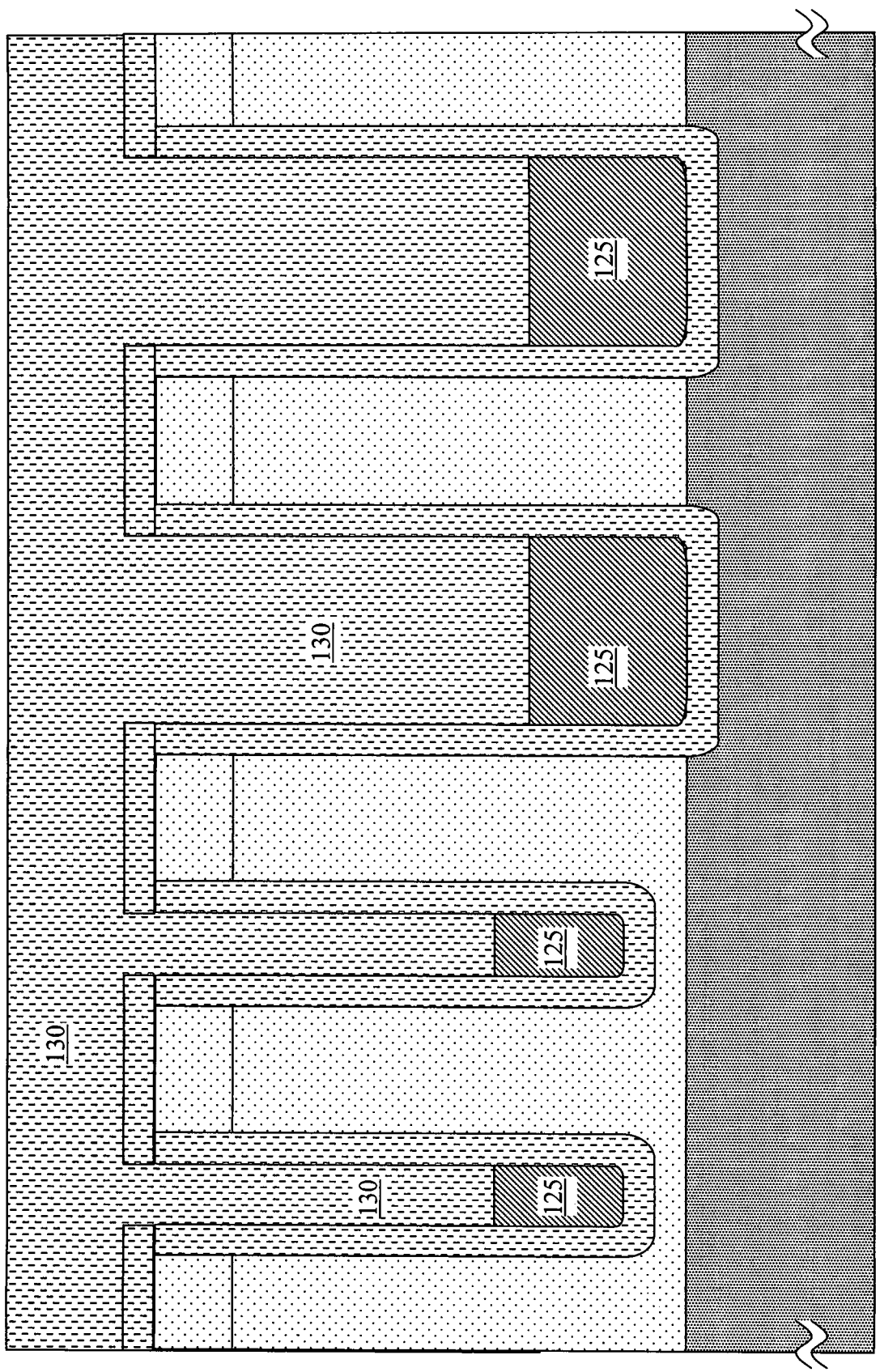
Figure 3M:
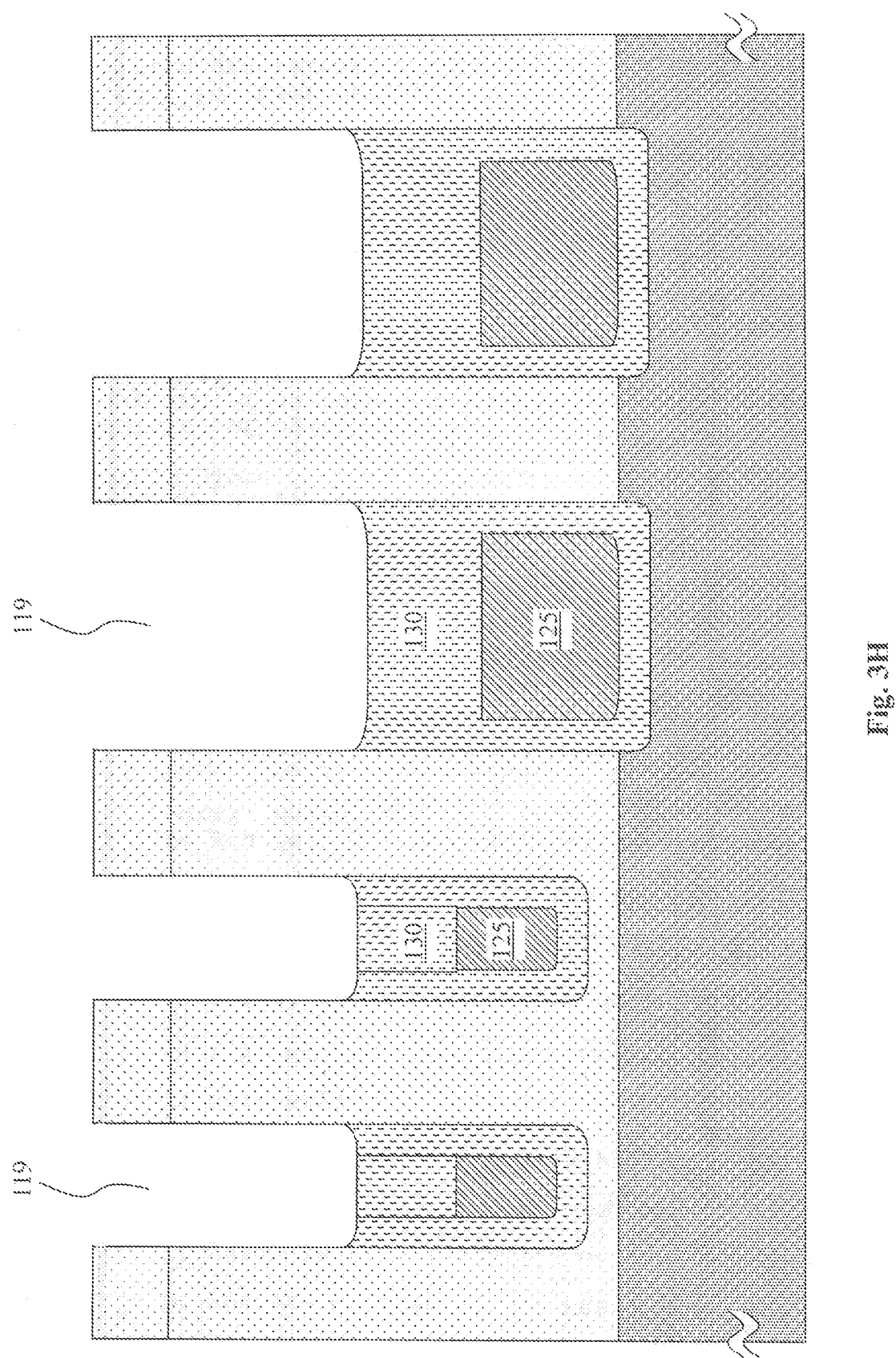
Figure 3H:
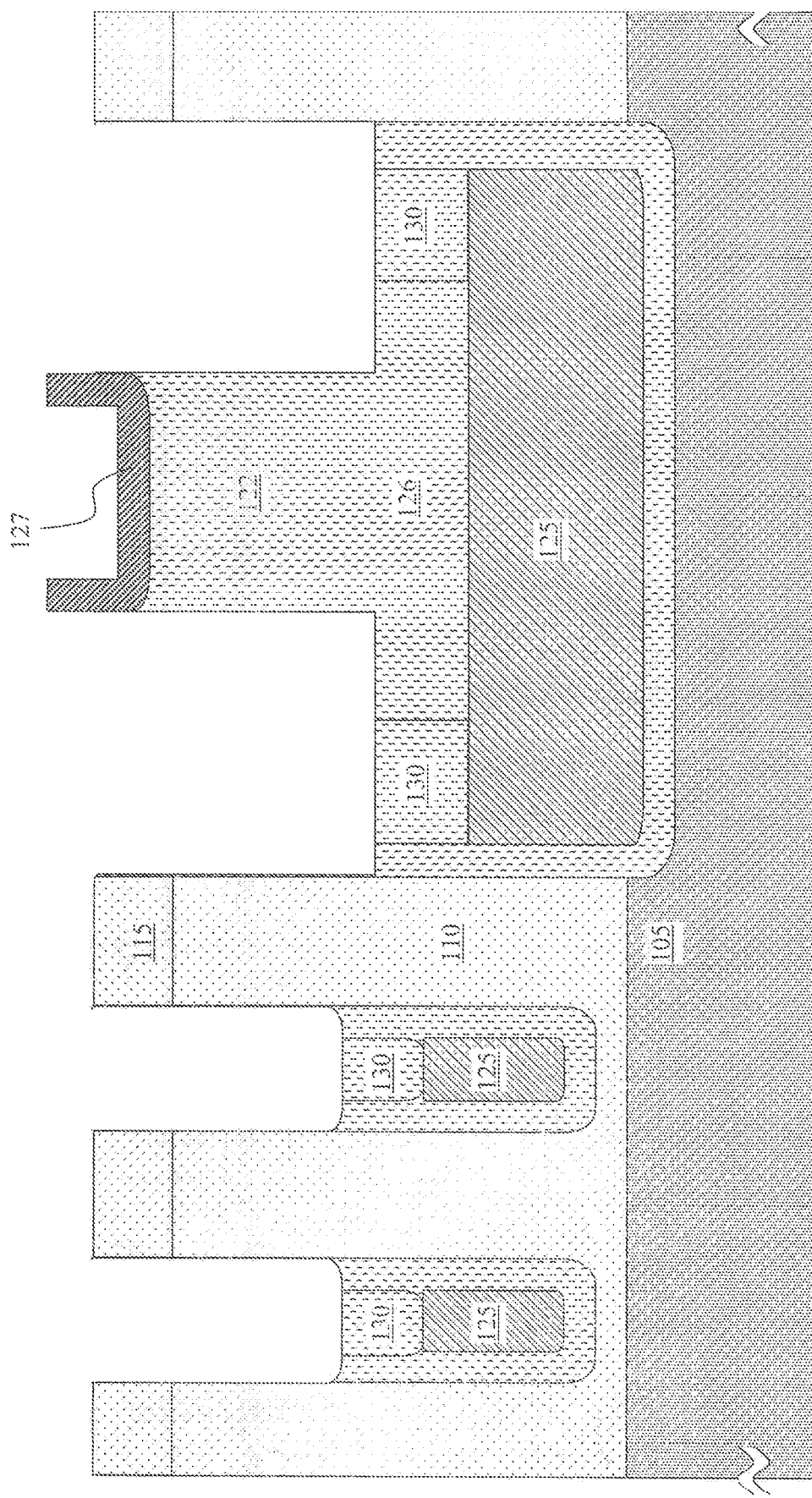
Figures 1, 3H:
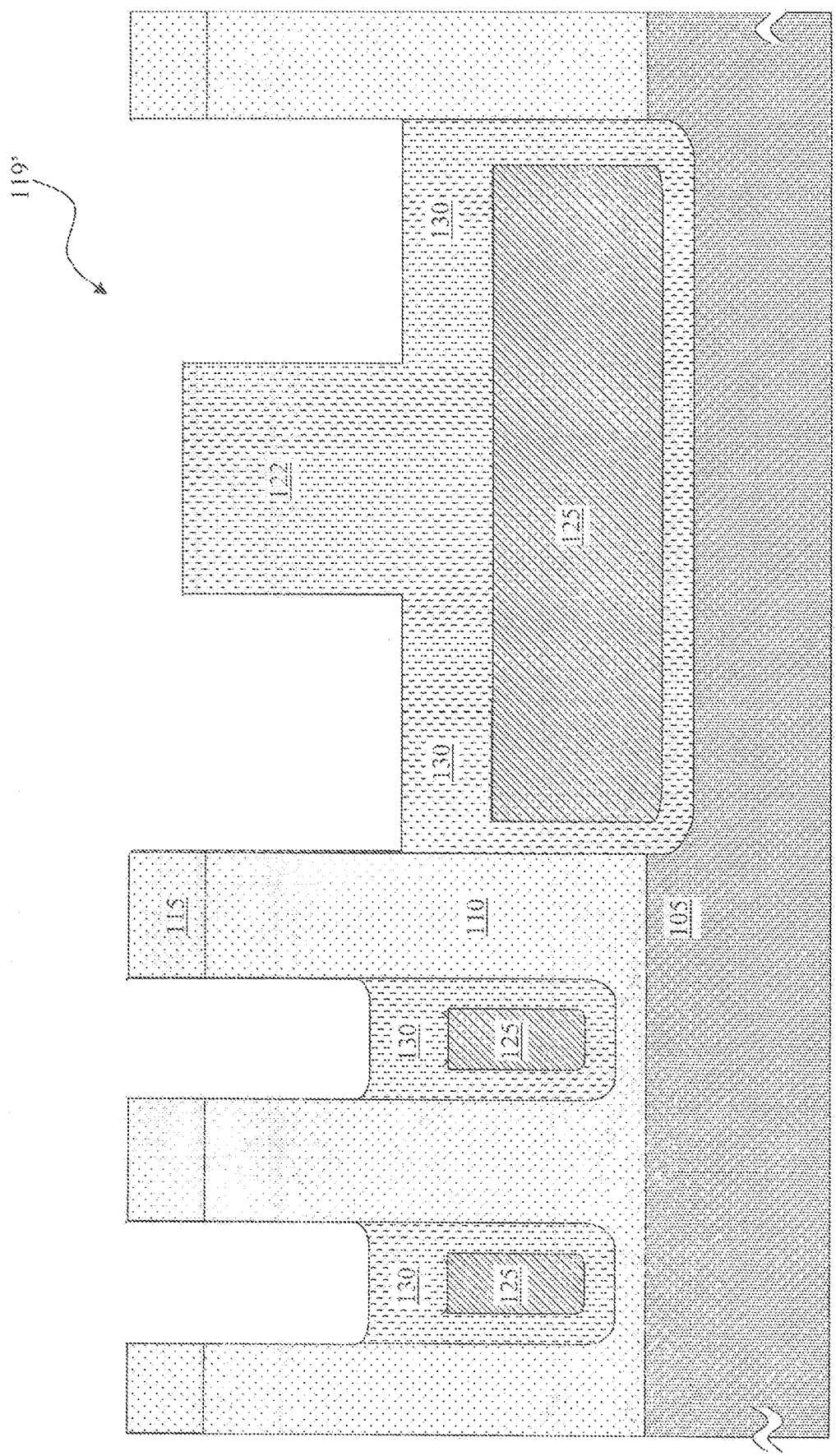
Figure 3I:
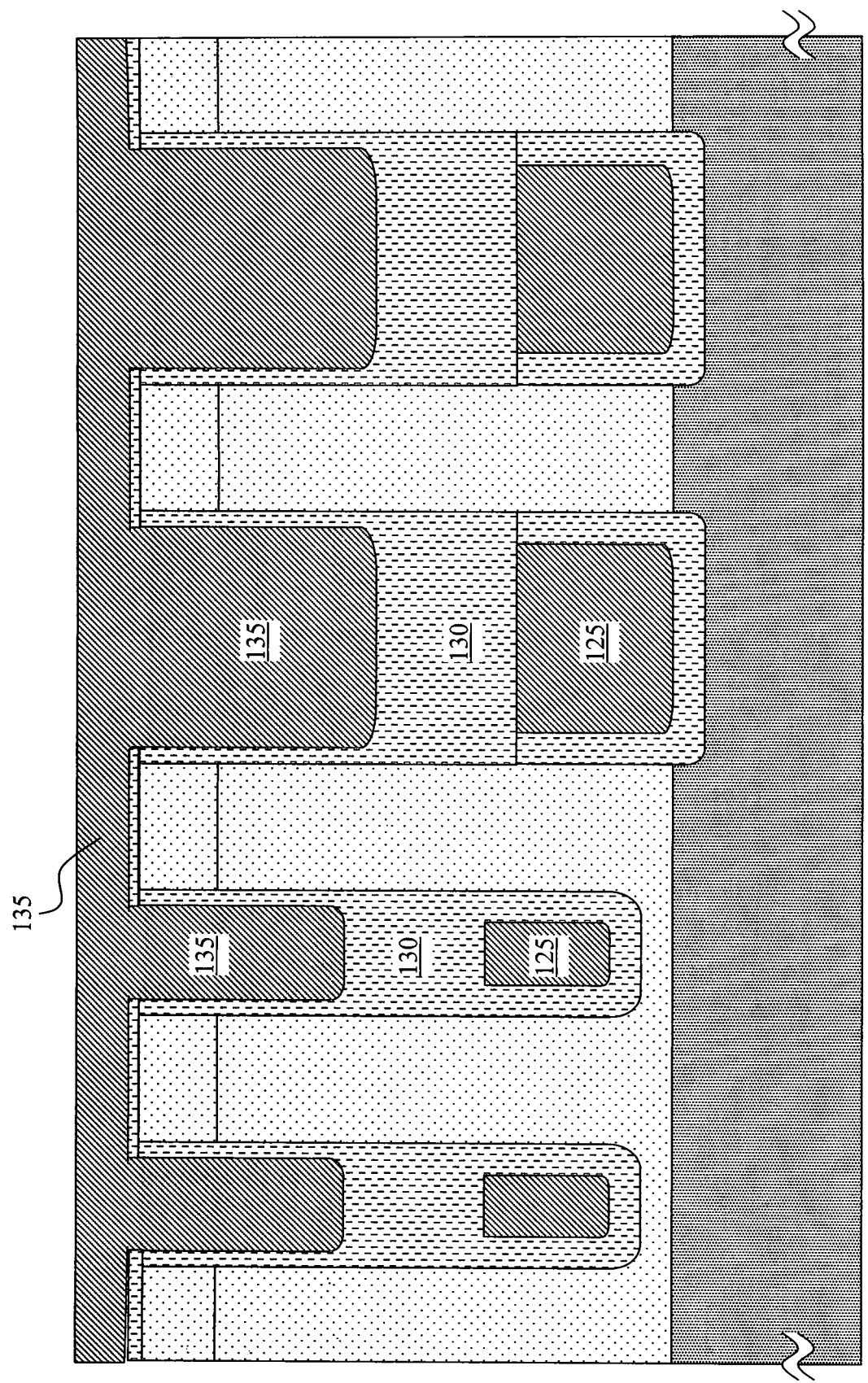
Figure 3P:
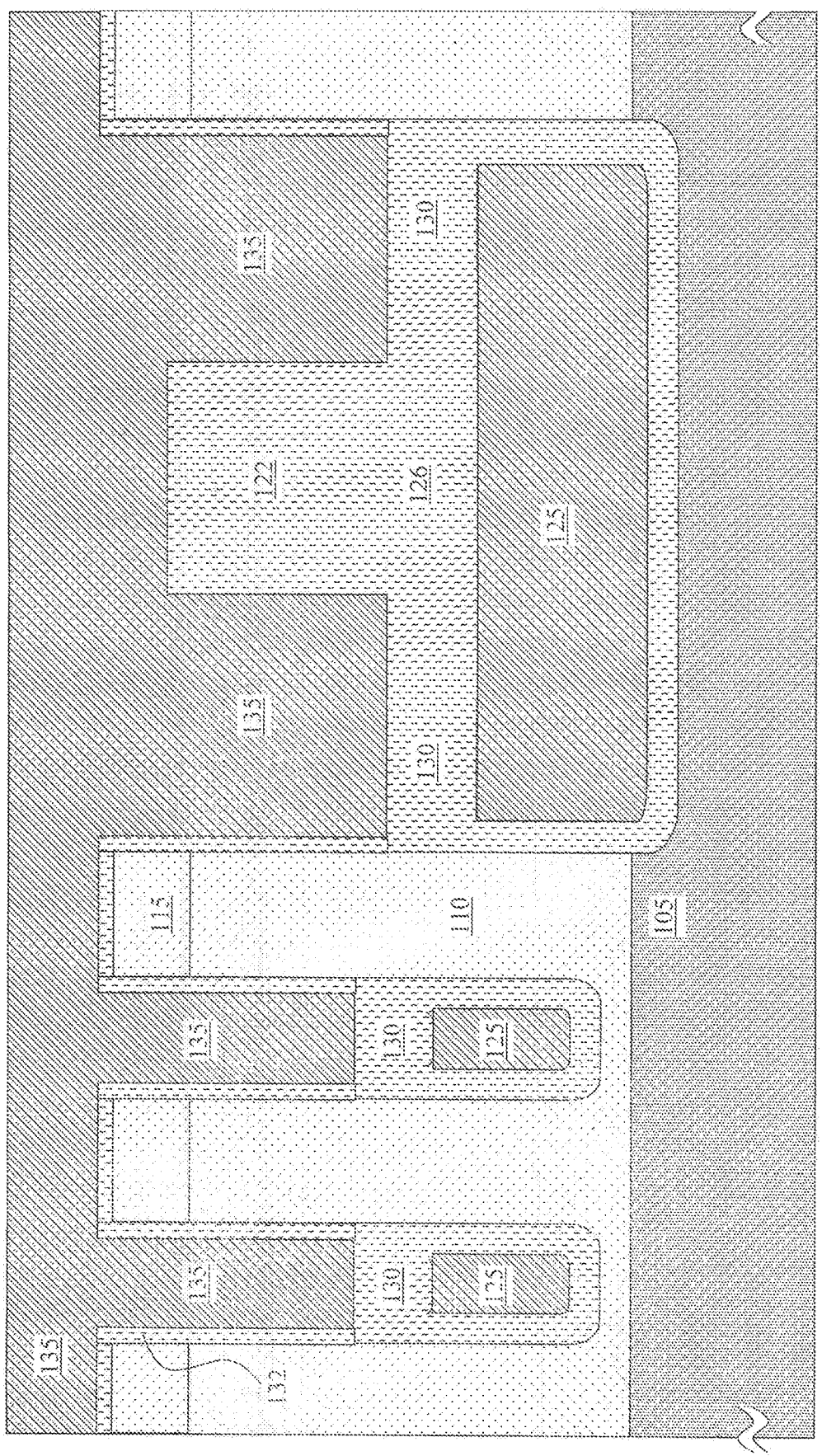
Figure 3J:
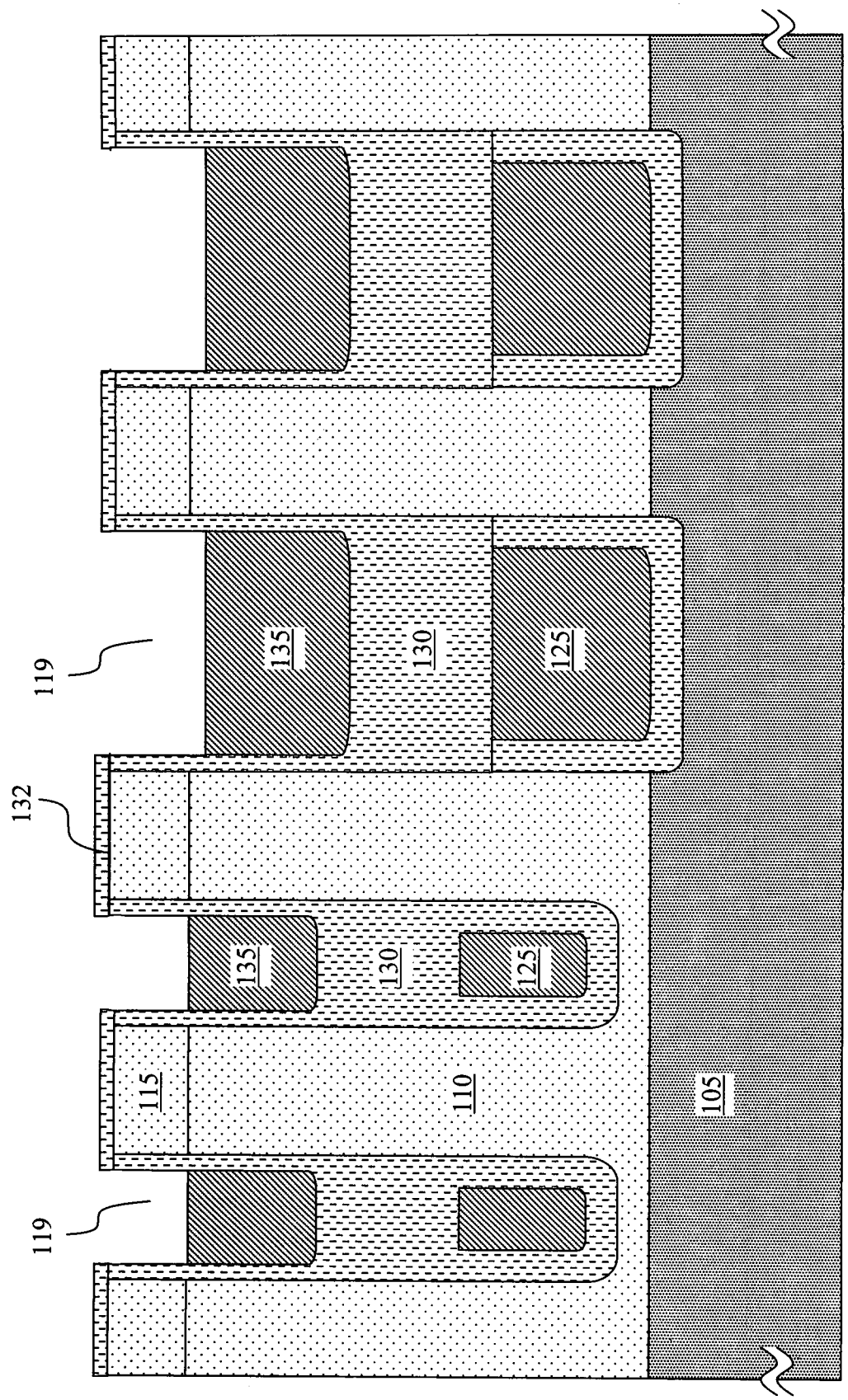
Figure 3J:
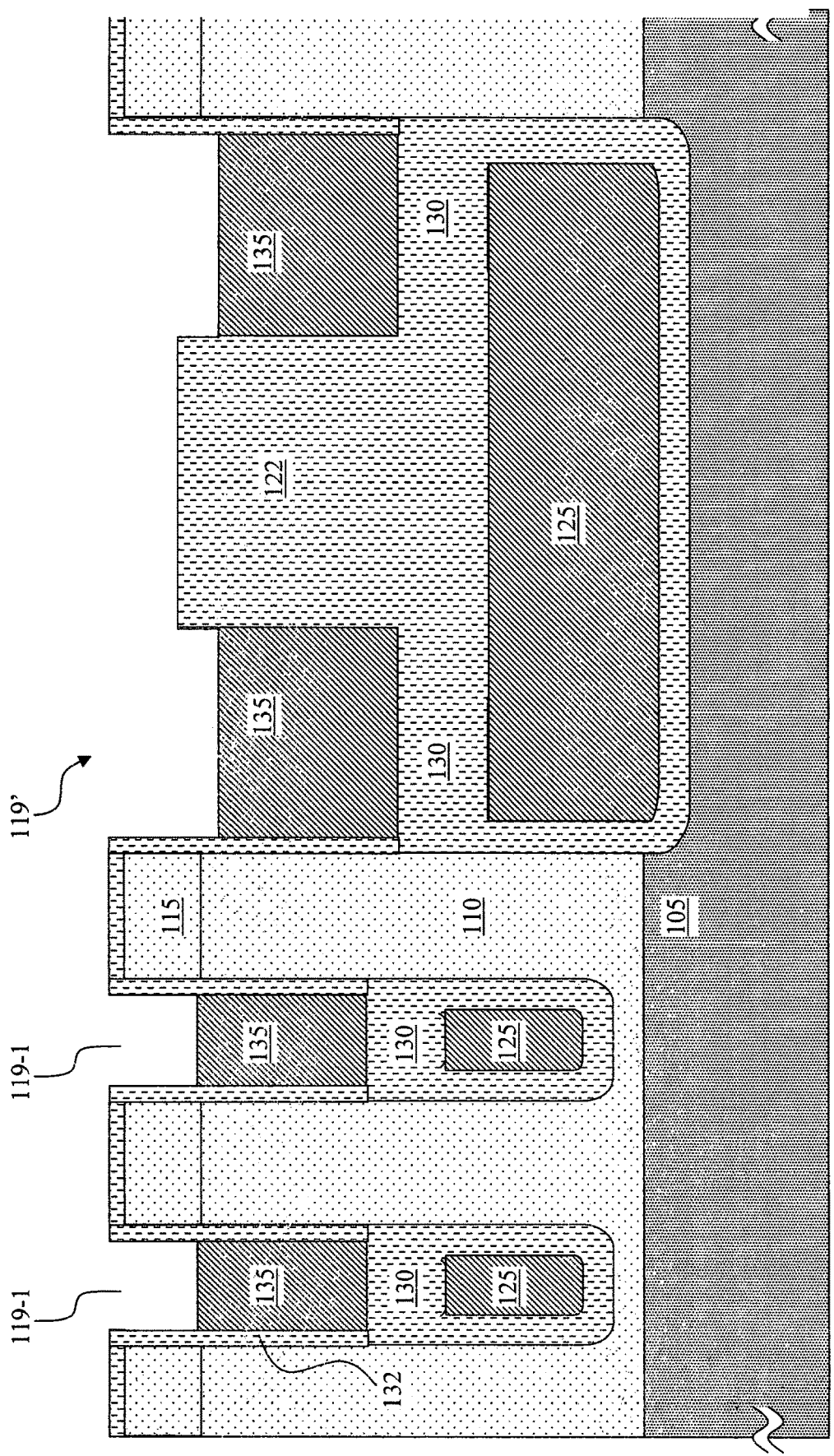
Figure 3K:
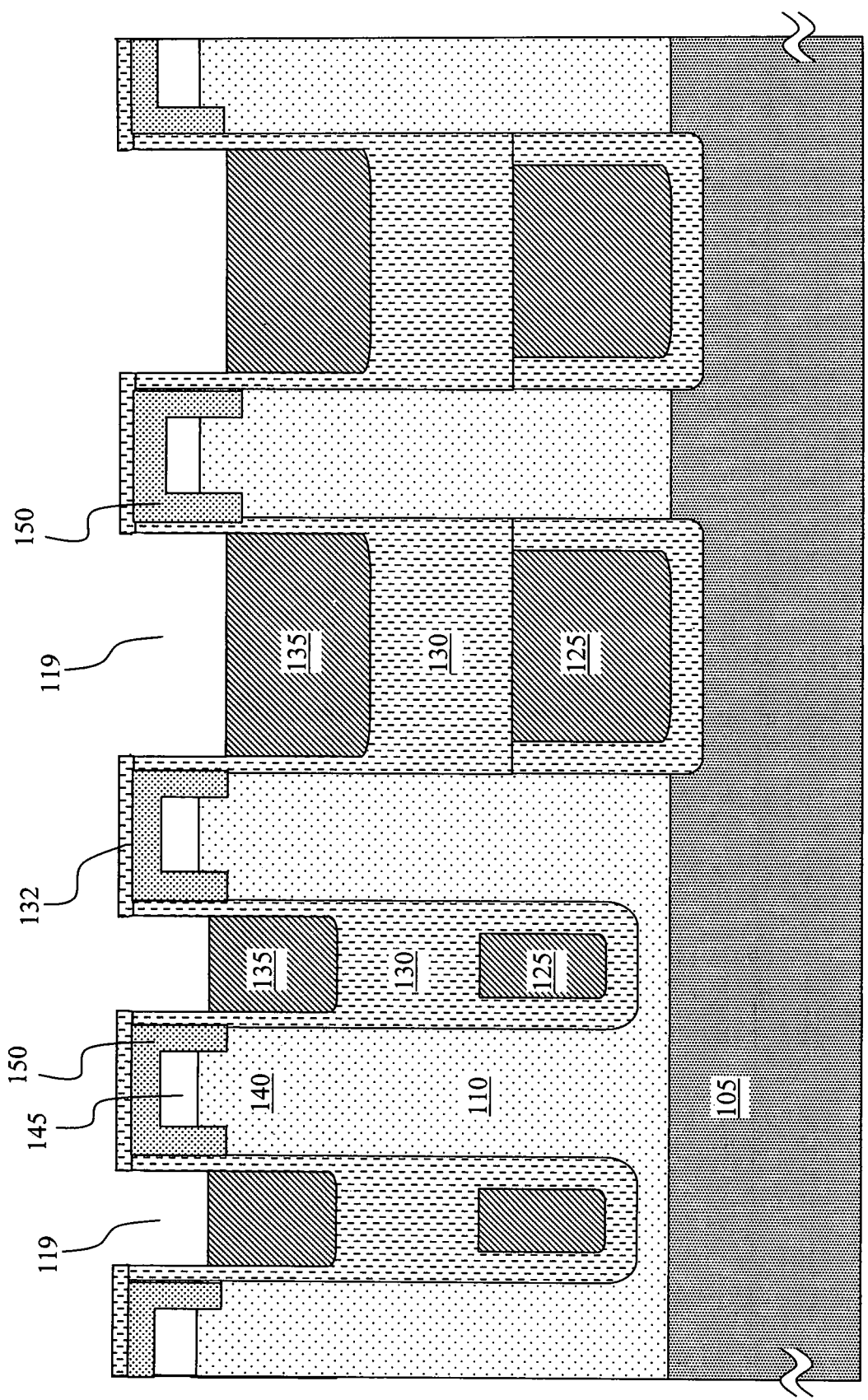
Figure 3K:
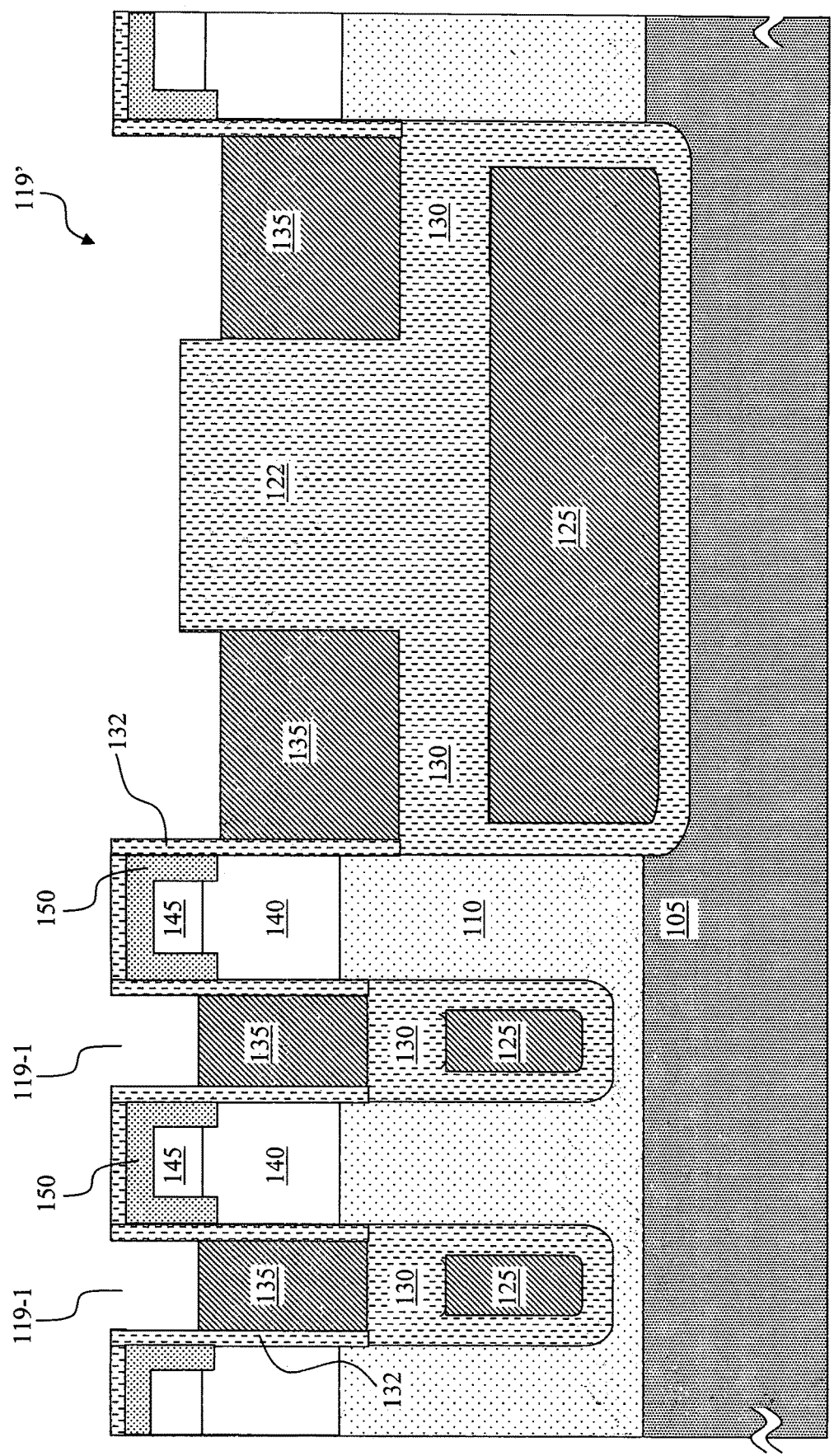
Figure 3L:
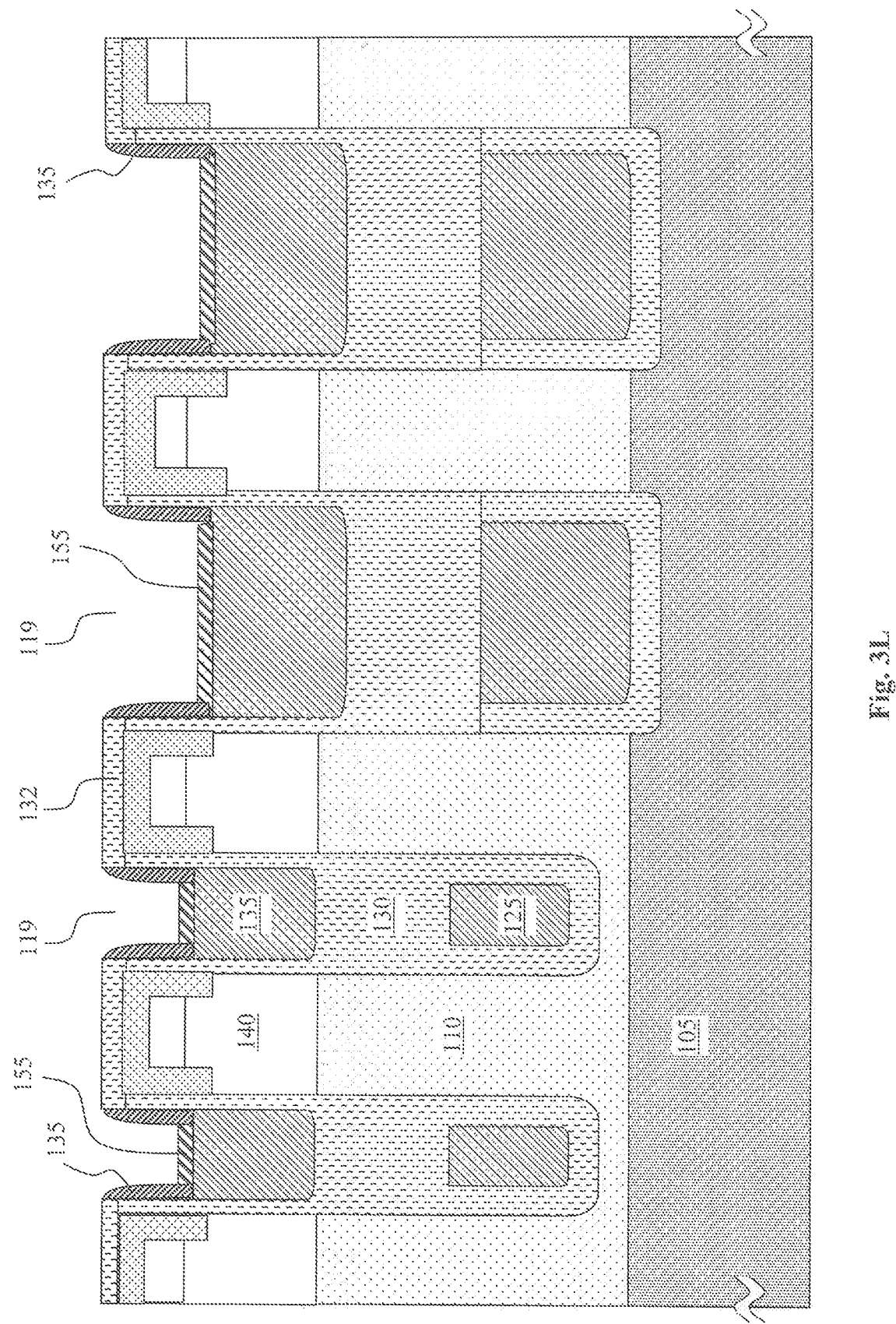
Figure 3L:
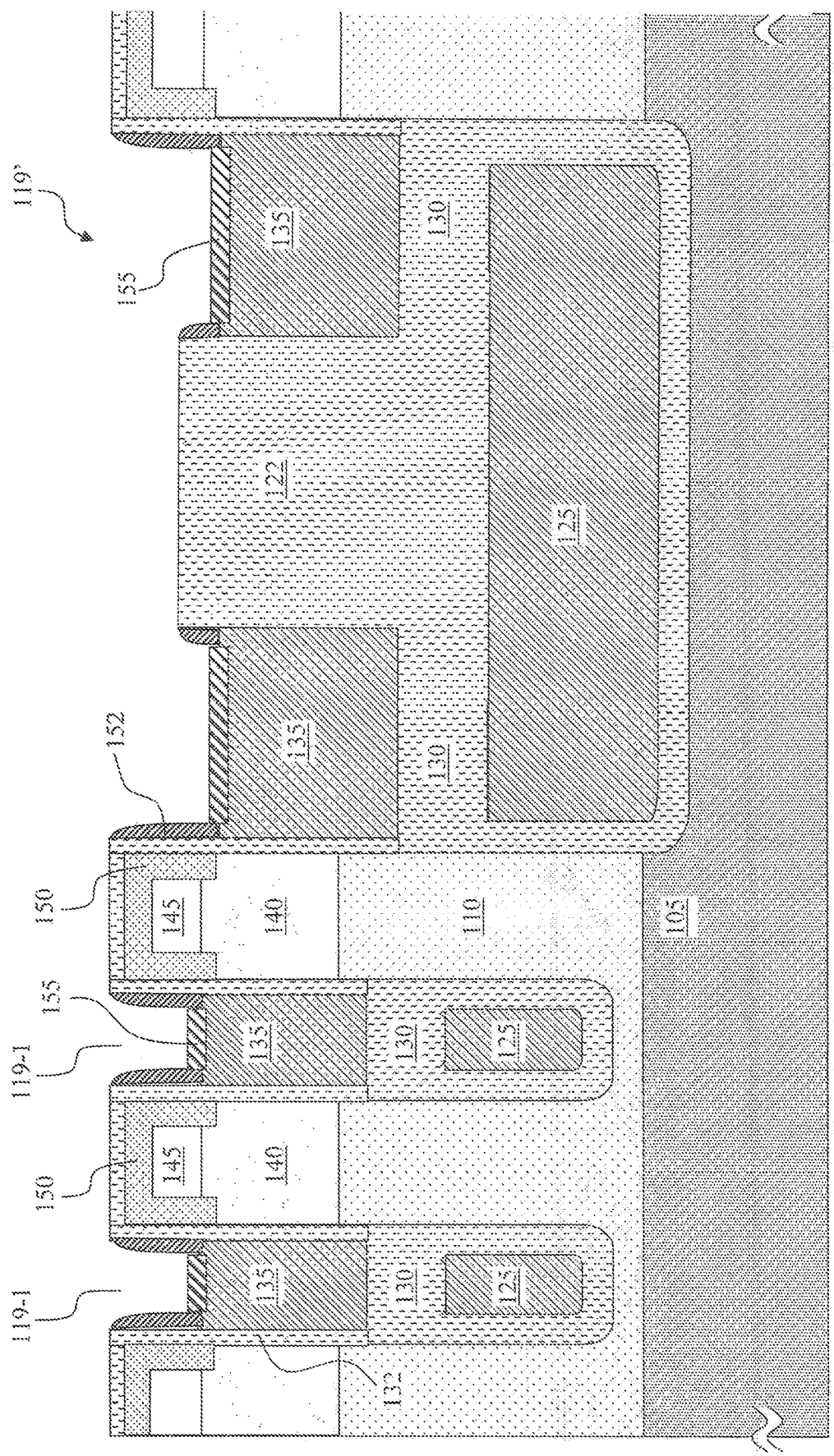
Figure 3M:
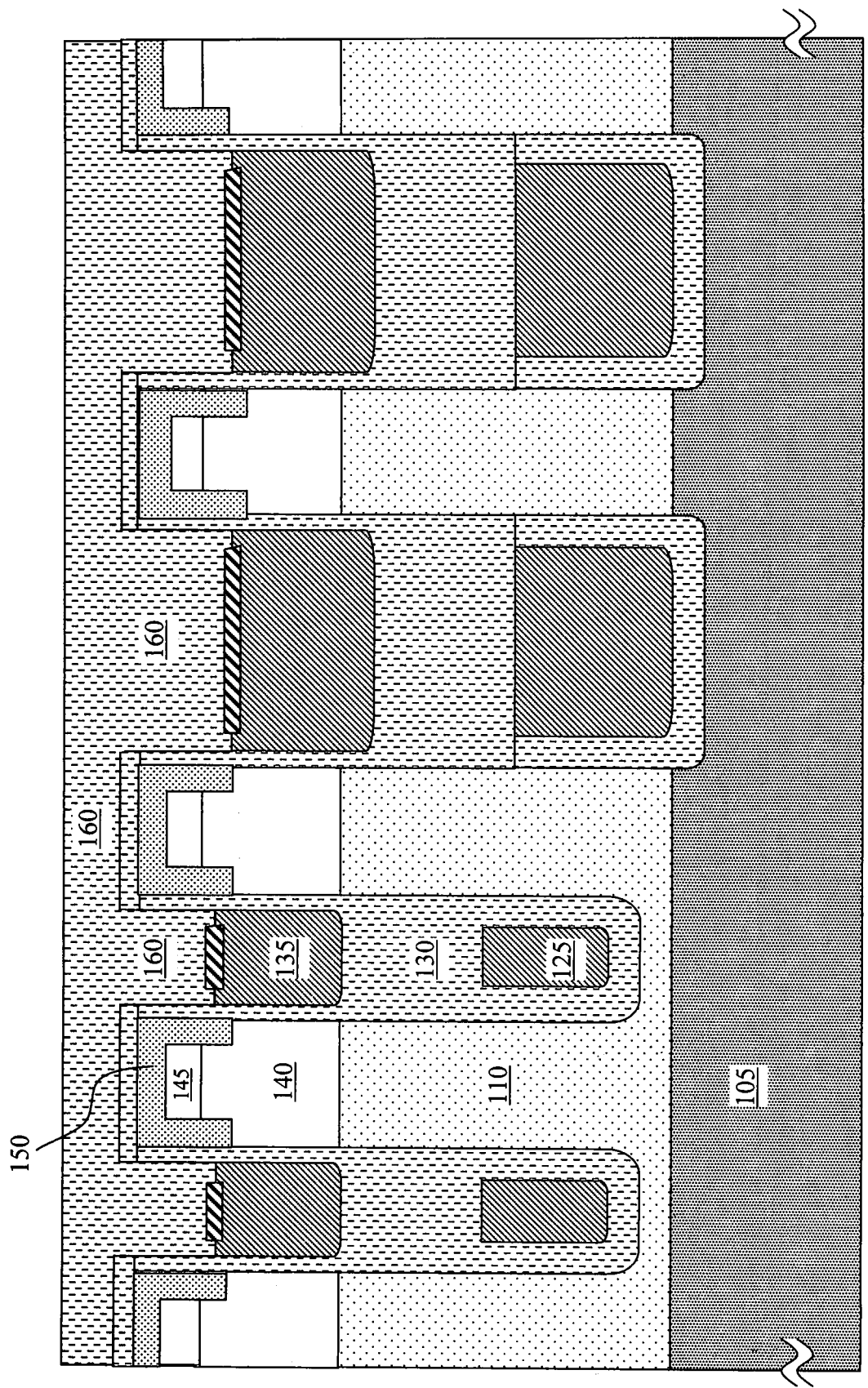
Figure 3M:
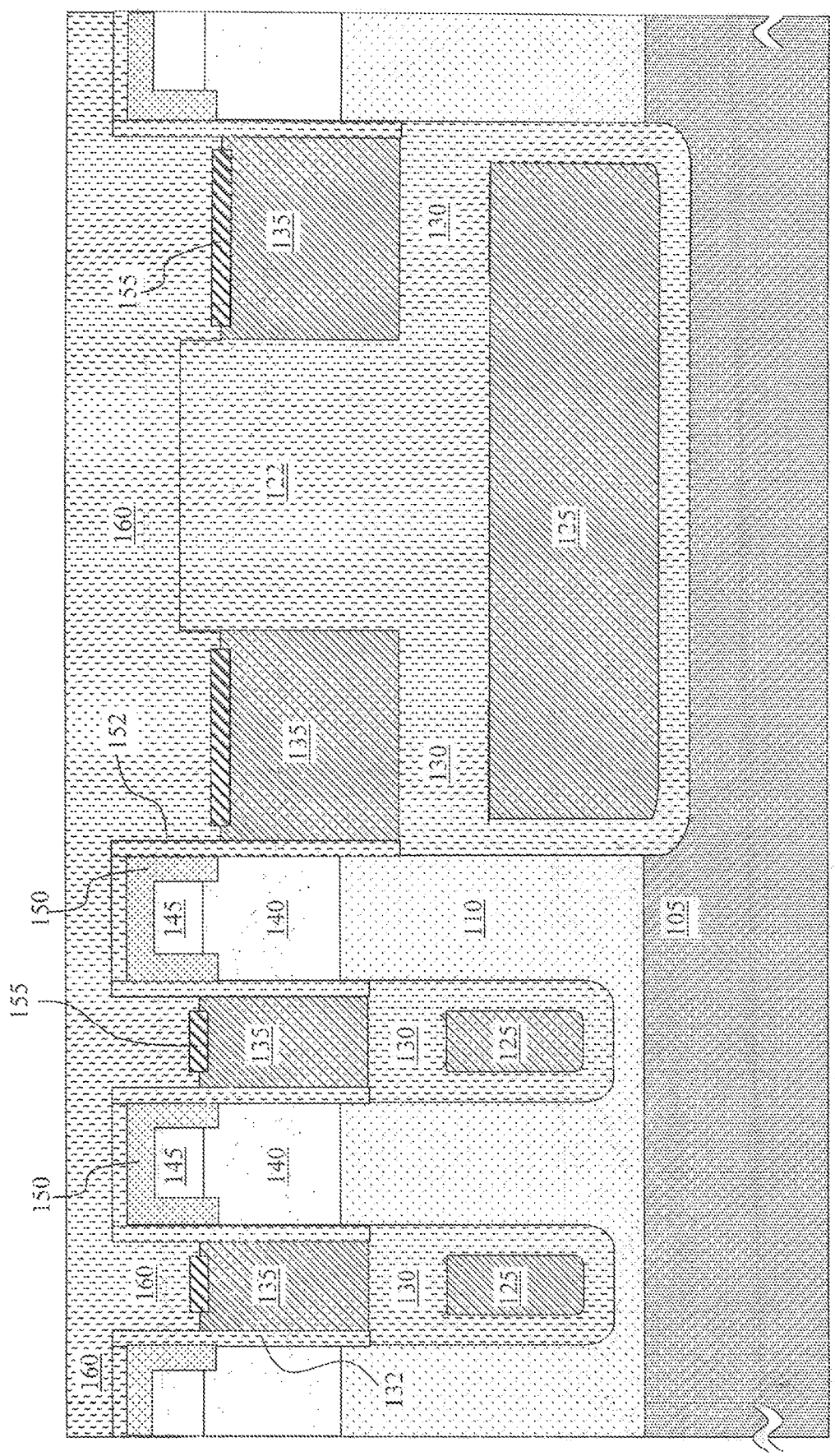
Figures 1, 3M:
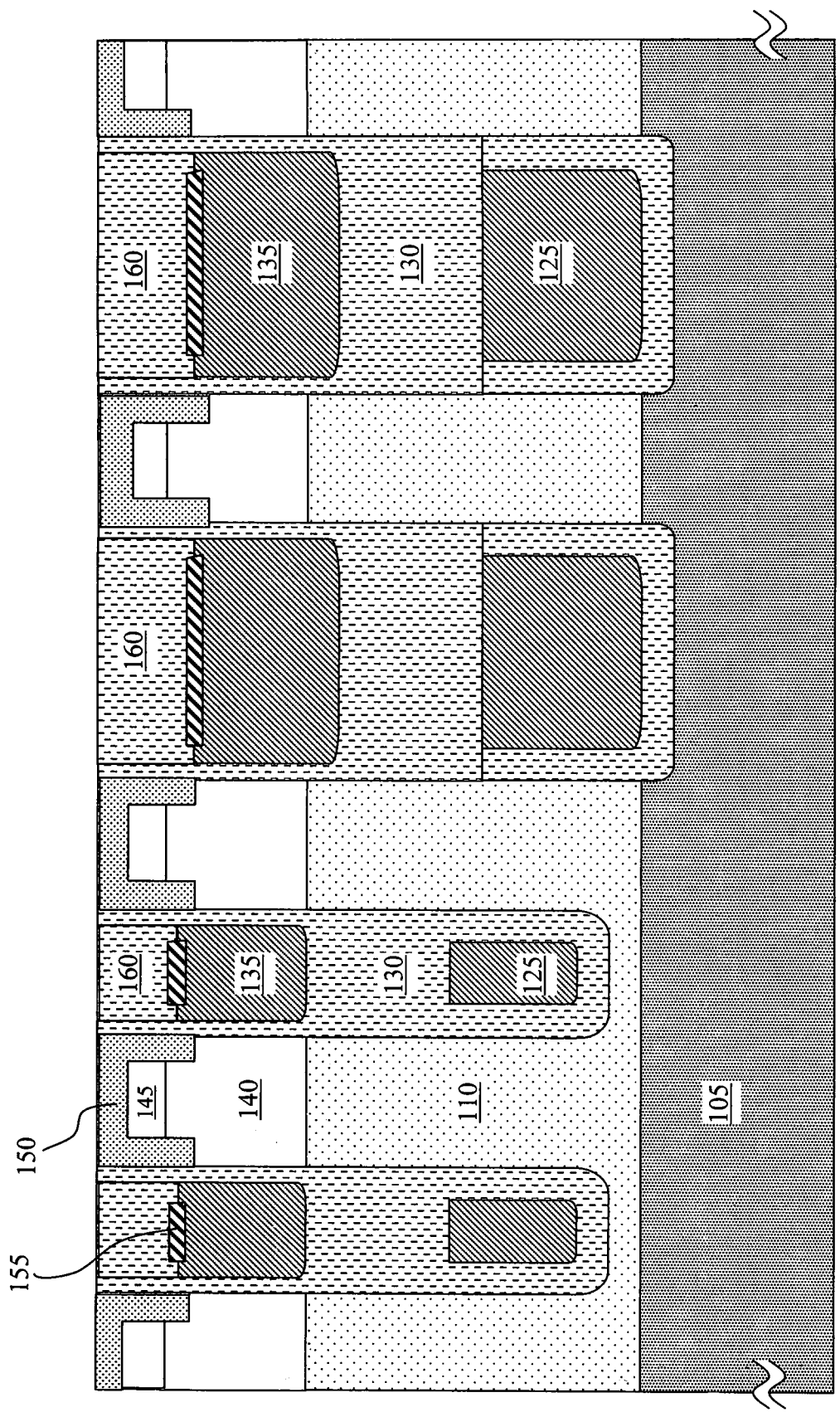
Figures 1, 3M:
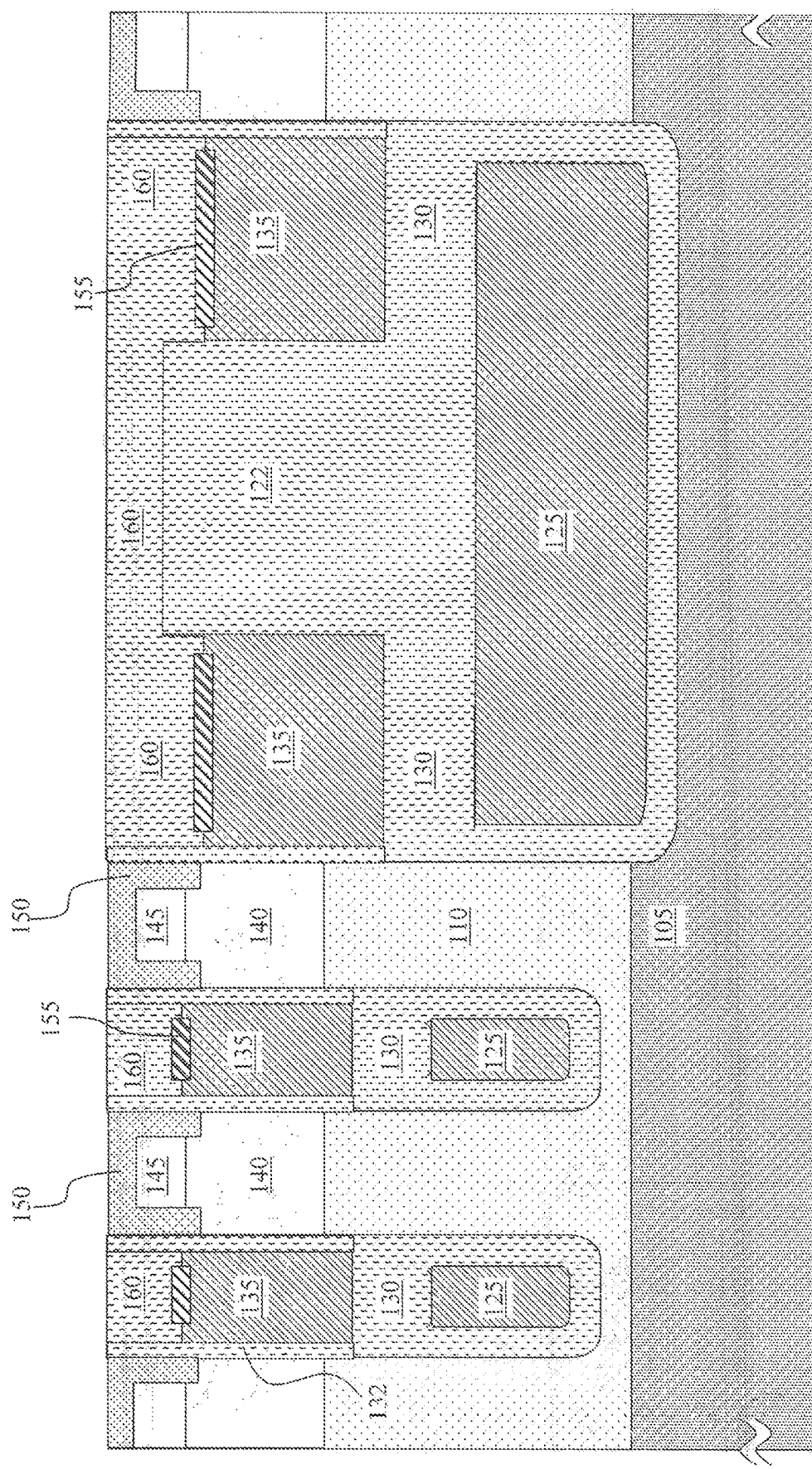
Figure 3N:
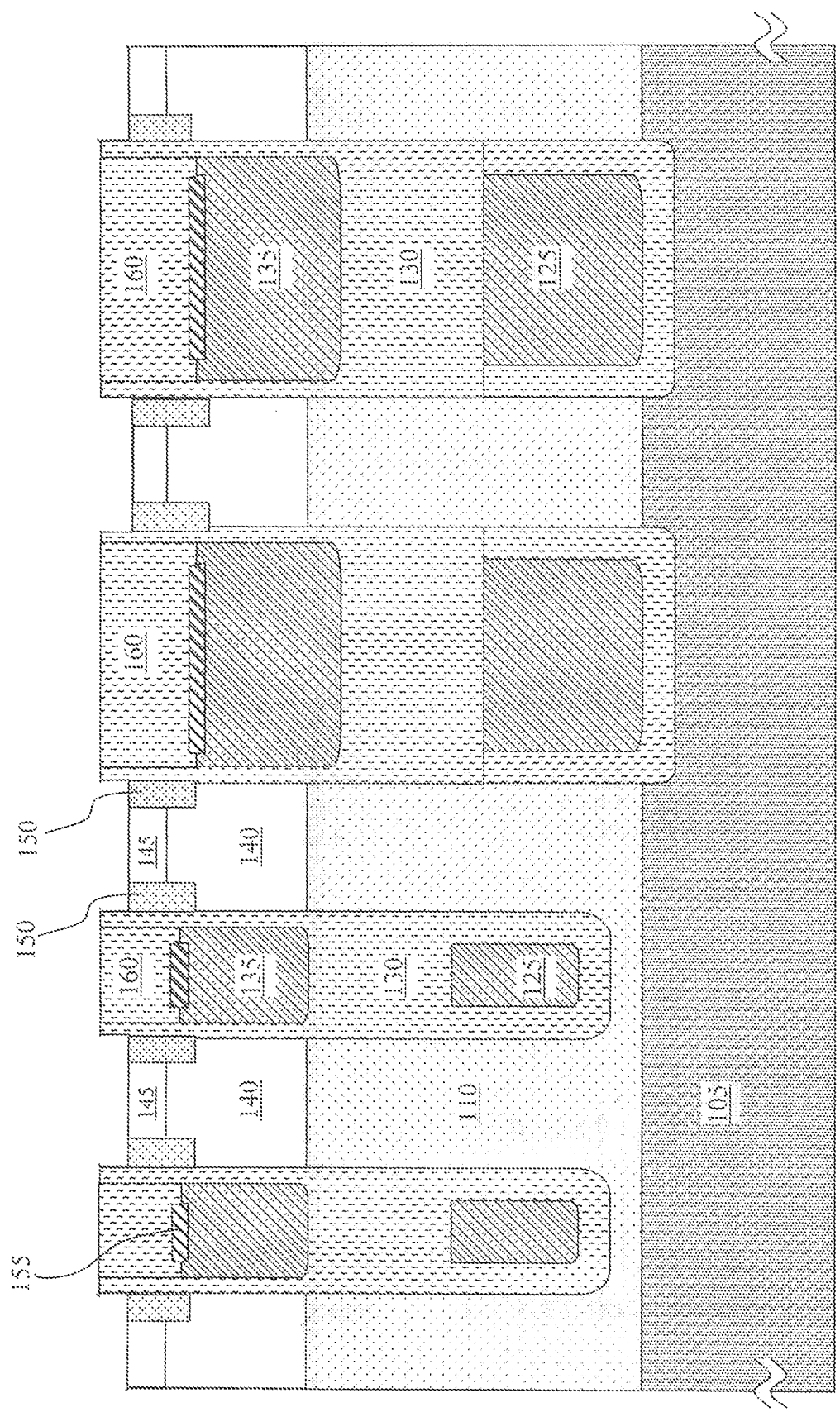
Figure 3N:
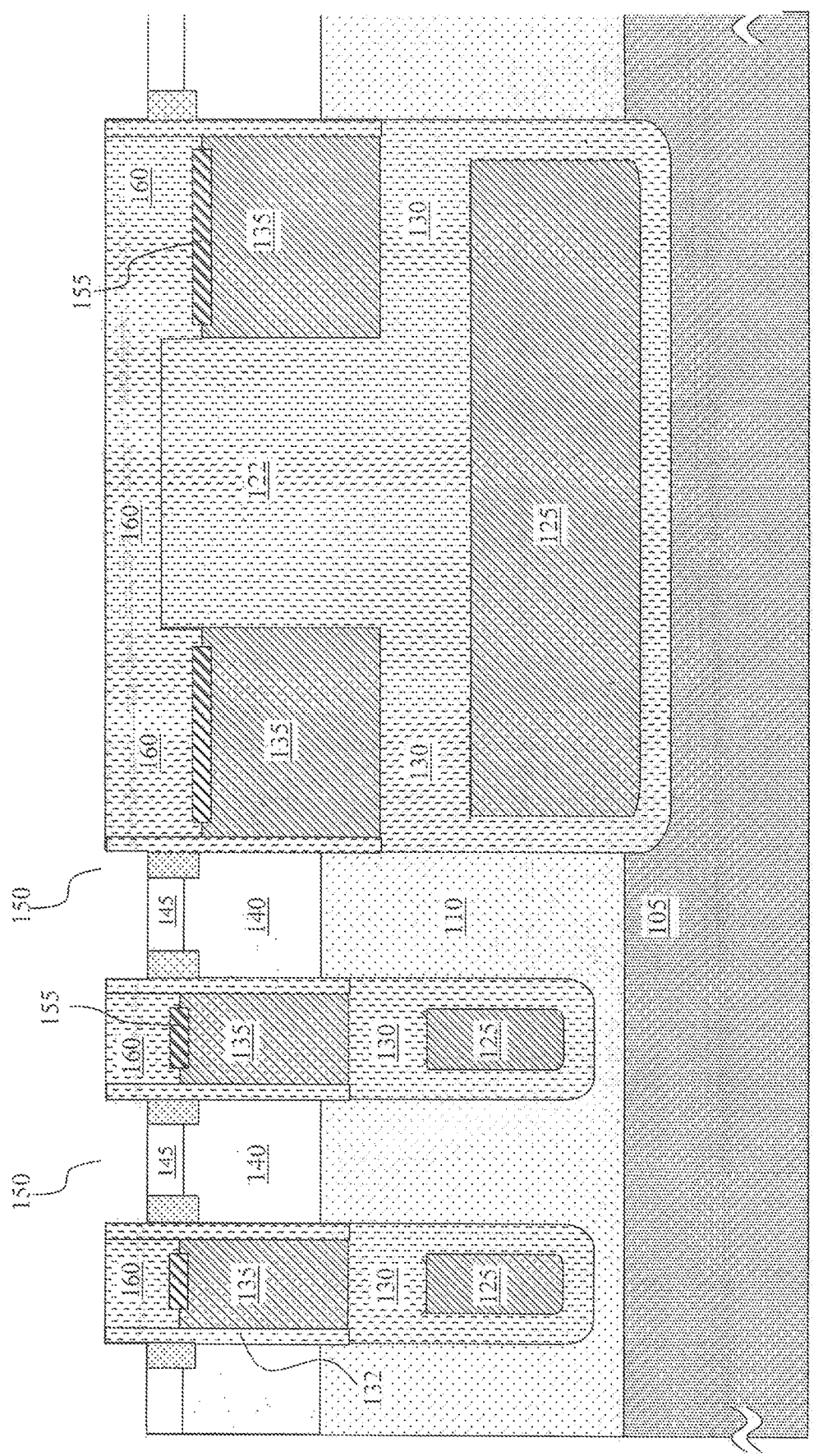
Figure 30:
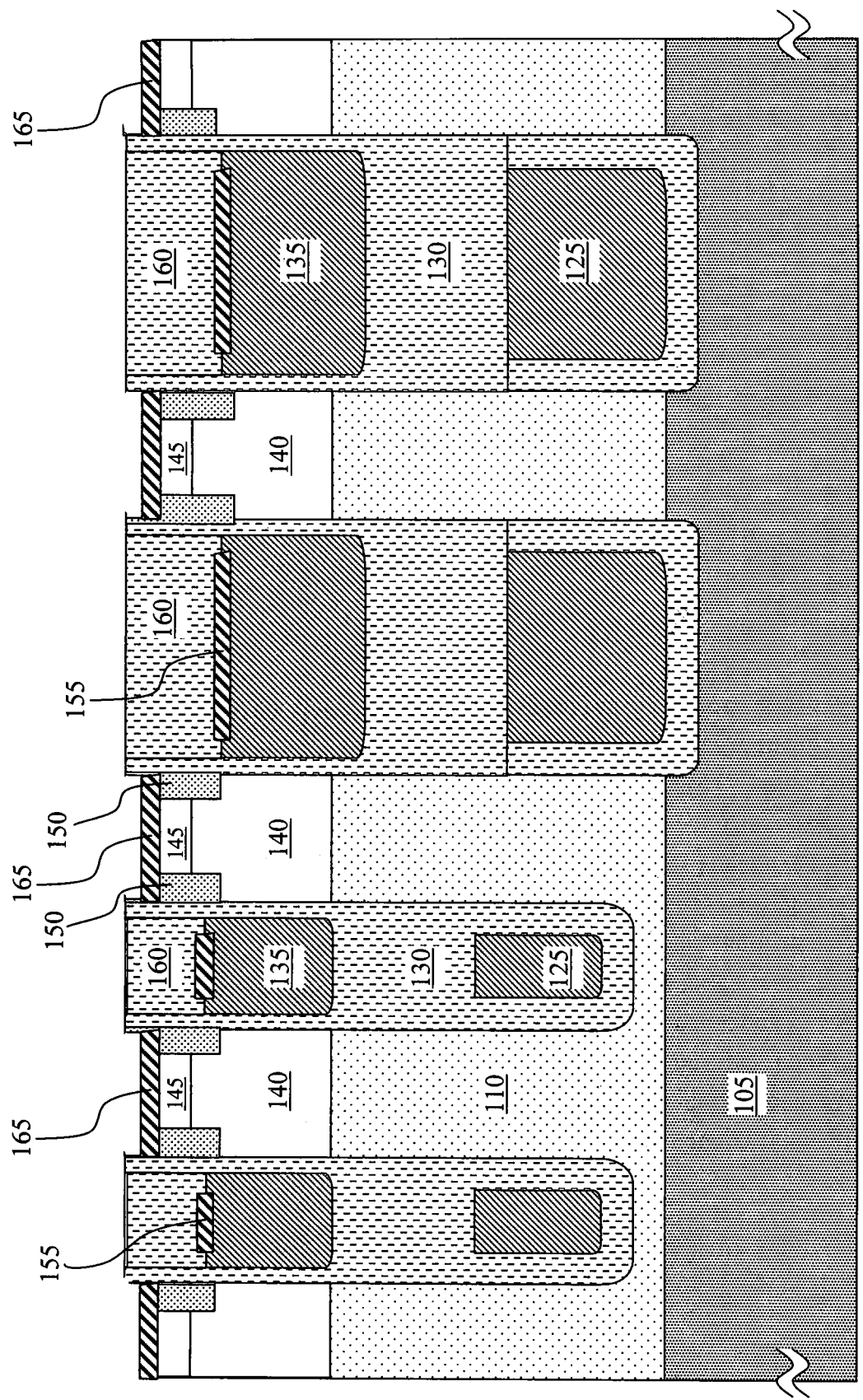
Figure 3O:
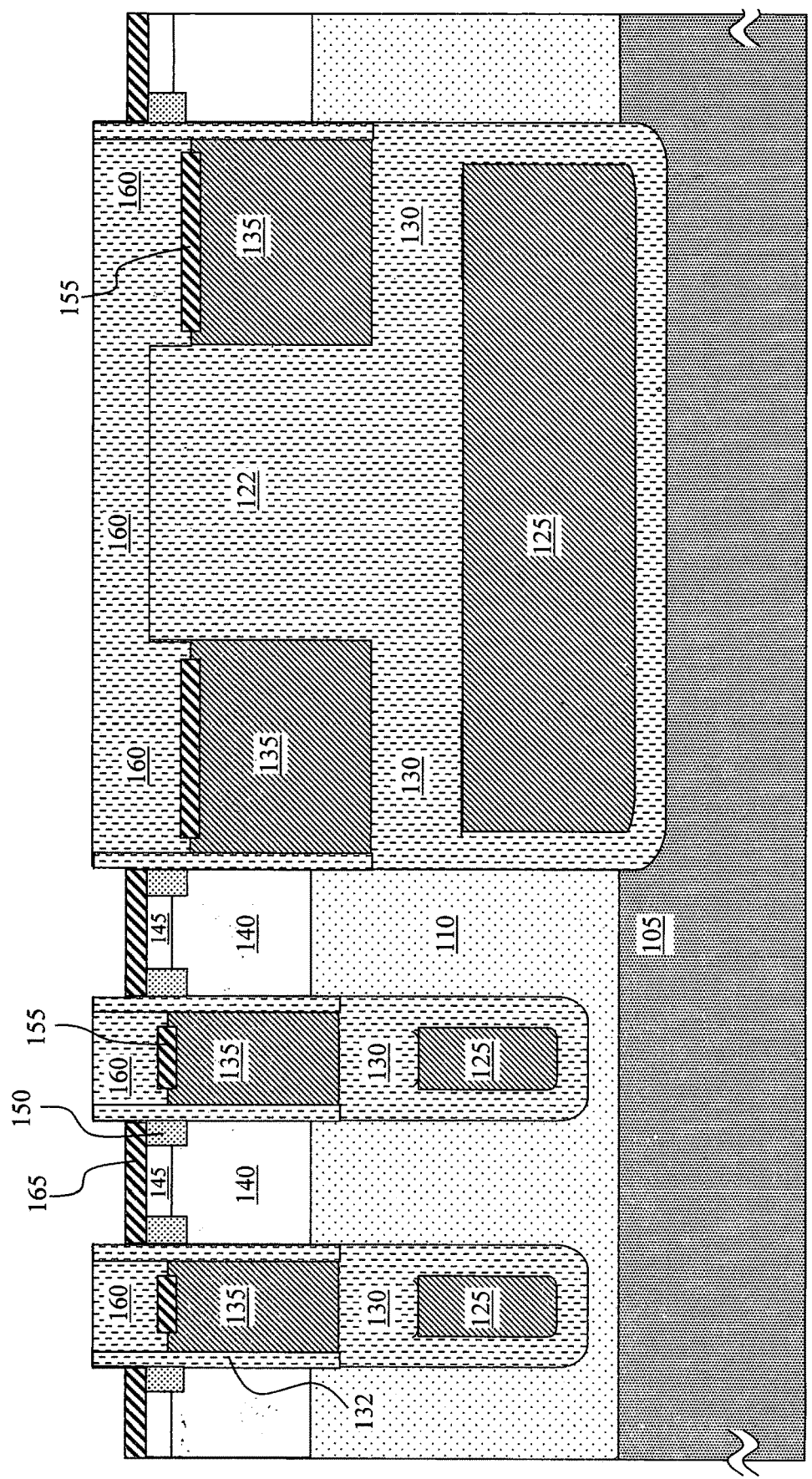
Figures 1, 3O:
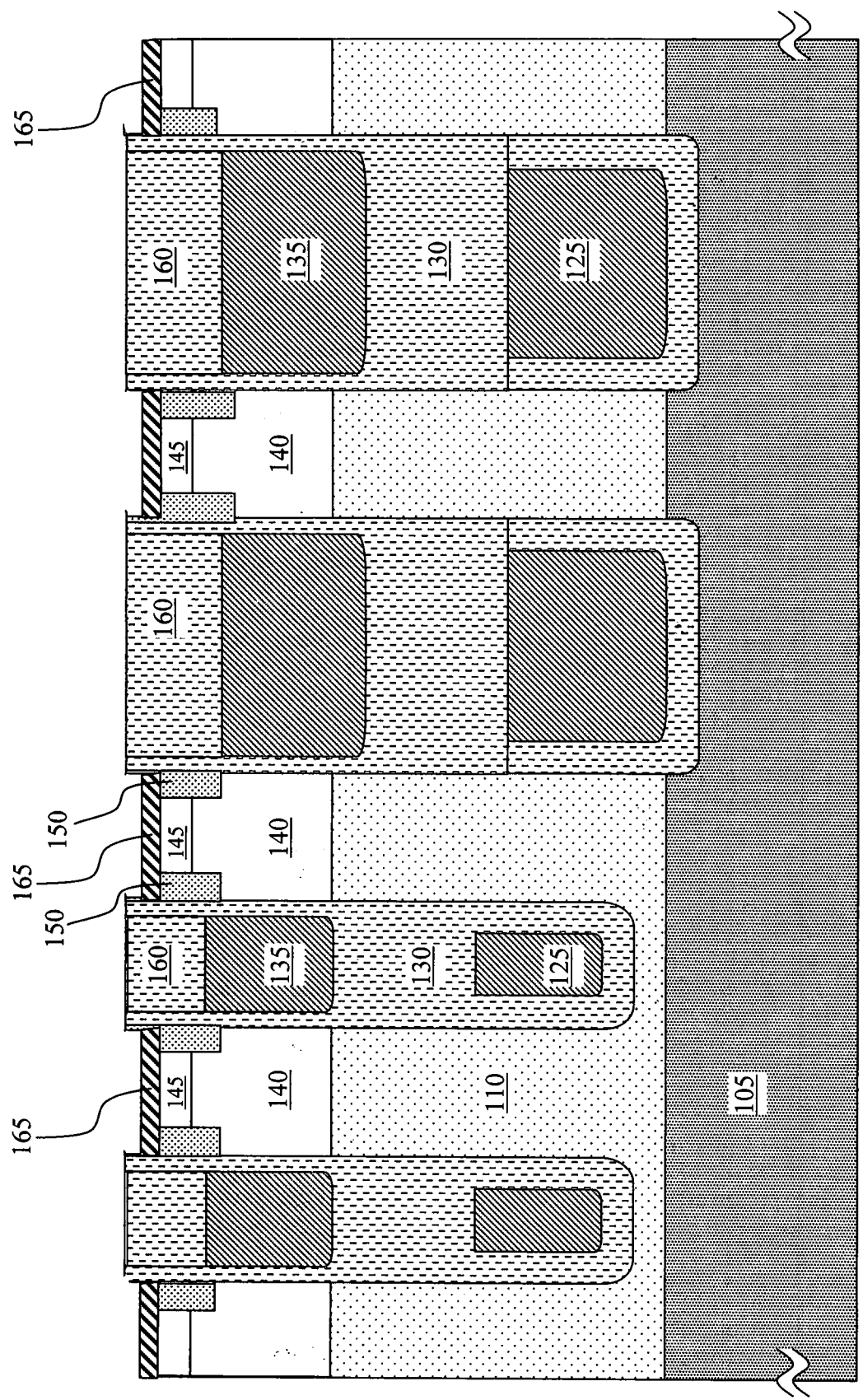
Figure 3P:
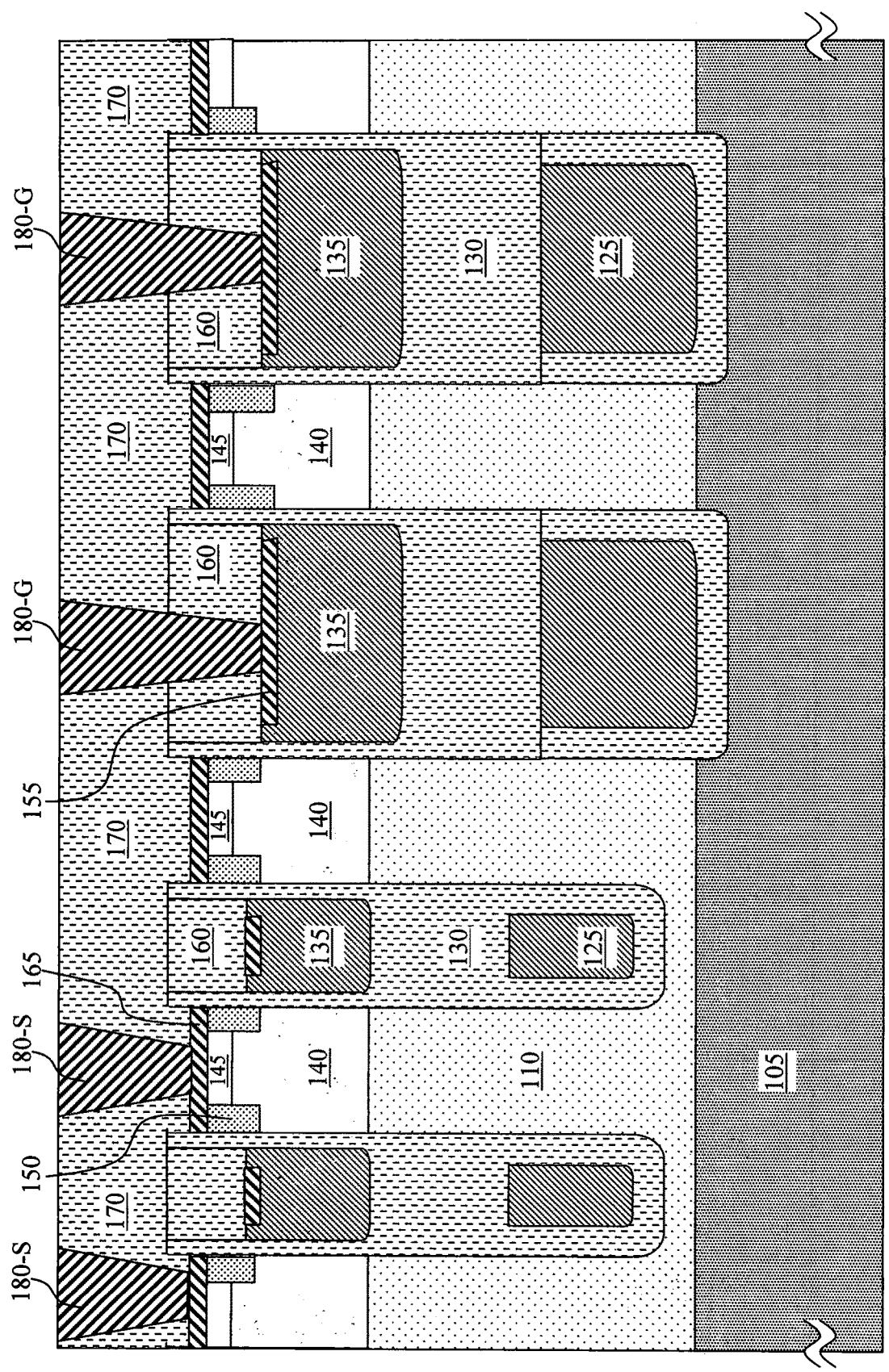
Figure 3P:
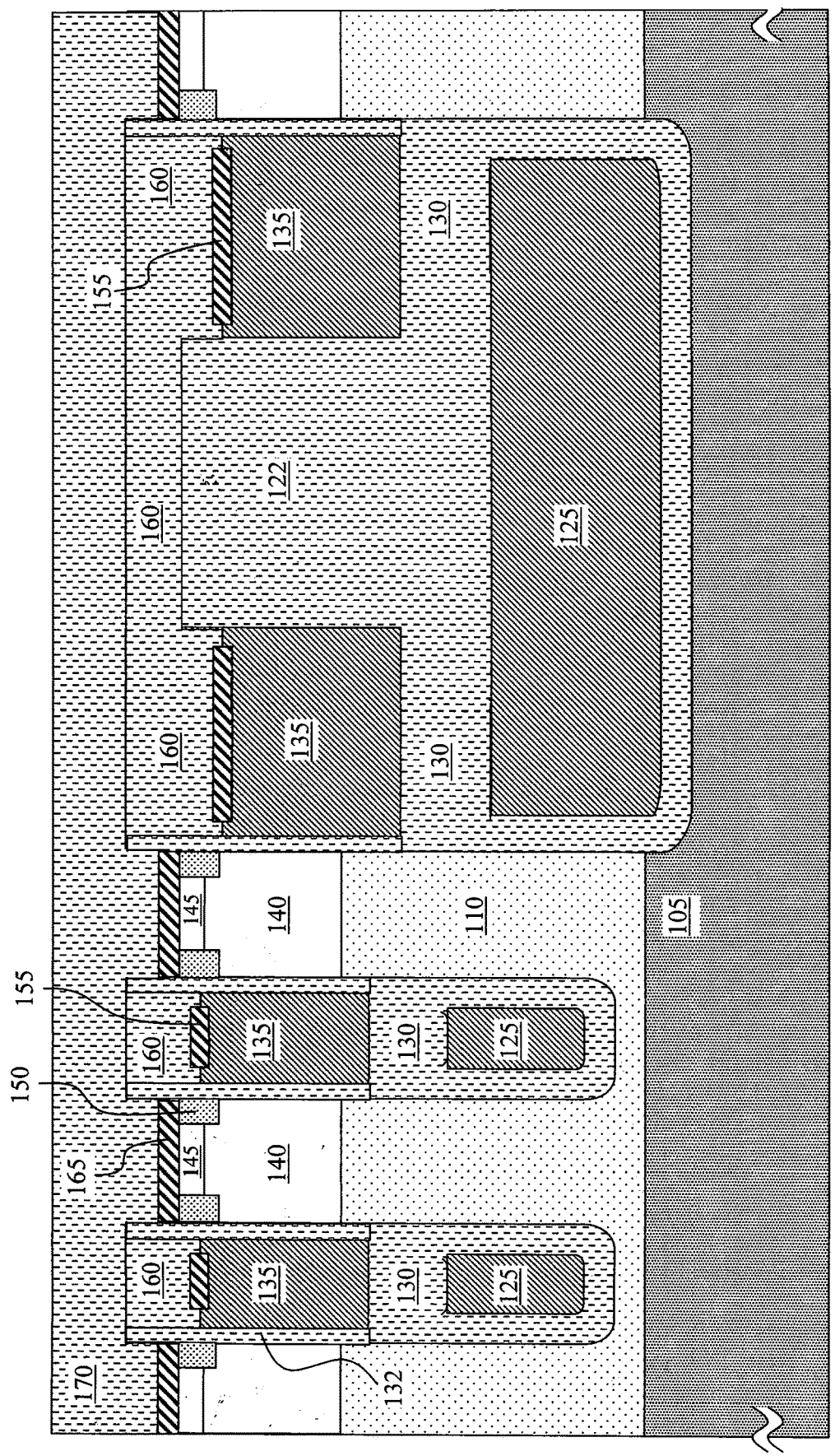
Figure 3Q:
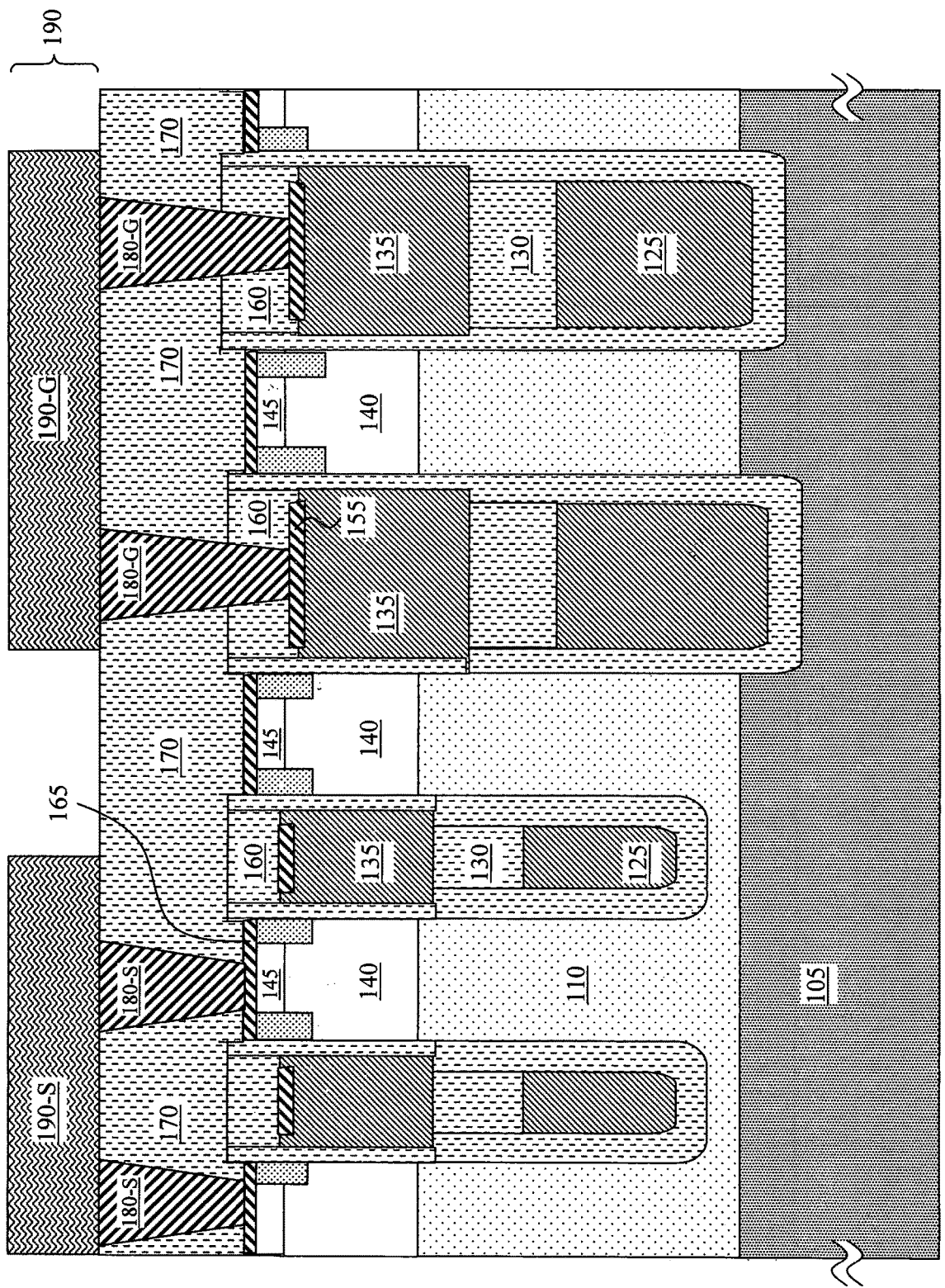

FIG. 3A to 3Q are a series of side cross sectional views illustrating the fabrication steps to form a self-aligned semiconductor power device 100 shown in FIG. 2A. Significant cost savings are achieved by applying the self-aligned processes as described below that use only three masks. In addition, the self-aligned process allows for greater accuracy and for a smaller cell pitch. FIG. 3A shows a starting N+ semiconductor substrate 105, i.e., a heavily N+ doped silicon substrate, supporting an N-type epitaxial layer 110 with a less heavily doped N– epitaxial layer 115 formed on top of the N-type epitaxial layer 110. The lightly doped N– epi layer 115 is optional feature, though it may be beneficial for the Schottky diode embodiment. The N-type epitaxial layer 110 and N– epitaxial layer 115 may optionally be grown having graded N type dopant concentrations with a graded increasing N-type dopant concentration along a top to bottom direction. In FIG. 3B, an oxide layer 117 and a silicon nitride (Si3N4) layer 118 are then formed to function as a hard mask. A trench mask (not shown) is applied to first etch the hard mask including the oxide layer 117 and the silicon nitride layer 118. Then a silicon etch is performed to open trenches 119 into the epitaxial layers 115 and 110, leaving semiconductor protuberances in between. The trenches 119 are opened to have different trench widths with the trenches 119-1 in the active cell area having a narrower trench width, e.g. 0.5 micrometers, and the trenches 119-2 in the gate bus/pad/finger area have a greater width. Furthermore, the narrow trenches have a shallower depth, e.g., 2 micrometers, which may extend to the lower epitaxial layer 110. The wider trenches 119-2 have greater depth which may reach the bottom N+ substrate 105. Wider trench naturally etch deeper than narrower trenches, even when etched the same amount of time. In an alternative embodiment, the wider trenches 119-2 do not reach heavily doped substrate 105. In FIG. 3C, the hard mask layers, i.e., the oxide layer 117 and the silicon nitride layer 118 are removed and in FIG. 3D, a shield oxide layer 120 is formed, e.g., with a layer of approximately 0.1 micrometer, e.g., by applying an oxide deposition process or thermally growing the oxide layer 120 or both on sidewalls and bottom of the trenches 119. Oxide layer 120 may also be formed on the top surface of epitaxial layer 115. In FIG. 3E, a first polysilicon layer 125 is deposited to fill in the trenches and cover over the top surface of the substrate optionally followed by applying a chemical mechanical planarization (CMP) process to planarize to top surface of the first polysilicon layer 125. At this point, an oxide-nitride-oxide (ONO) layer may be formed and partially removed in other portions of the semiconductor die, such as a termination trench as will be explained later; however, those operations will not have a net effect on the structure shown here in this region of the die.

In FIG. 3F, an etch back process is carried out on the first polysilicon layer 125 to remove the first polysilicon layer 125 from the top surface and from the top portion of the trenches 119 and leaving only a polysilicon block 125 filling the bottom portion of the trenches. In FIG. 3G, an inter-poly dielectric (IPD) (or inter-electrode-dielectric (IED)) layer 130 is deposited, followed optionally by performing a CMP process. In FIG. 3H, an (e.g. isotropic) etch is carried out to etch and remove the IPD layer 130 from the top surface above the trenches 119 and also from the top portion of the trenches 119 to leave an IPD layer 130 covering the first polysilicon layer 125 in the trenches 119. In FIG. 3I, a gate oxide layer 132 is grown followed by deposition of a second polysilicon layer 135 filling the top portion of the trenches and covering the top surface above the trenches. A CMP process can be carried out to planarize the top surface of the second polysilicon layer 135. Optionally, a sacrificial oxide (not shown) may be grown and removed before growing the gate oxide layer 132.

In FIG. 3J, a highly selective etch process is carried out to etch down the second polysilicon layer 135 below the silicon surface while leaving the gate oxide layer 132 intact such that the underlying silicon is protected. Alternatively, a CMP process can first be used to bring the second polysilicon layer 135 down to the top of gate oxide layer 132. The second polysilicon layer 135 is etched below the semiconductor surface. In FIG. 3K, an (e.g. angled or non-angled) implant of high energy boron ions is performed to form the P-body region 140. A low energy angled implant of boron ions may optionally also be carried out to adjust the threshold voltage. A low energy high concentration implant with boron is carried out e.g. non-angled to form a small P+ body contact region 145 on the top part of the body region 140. (This step may also be carried out after the formation of the source region 150 described below.) An angled implant of phosphorous ions with ion energy sufficient to penetrate through the gate oxide layer 132 is carried out to form the source regions 150 on top of the body region 140/145 and along the exposed sidewalls of the trenches 119. The bottom of the source region 150 is self-aligned to and slightly overlaps with the top of the second polysilicon layer 135. The bottom of the body region 140 extends below the bottom of the source region 150, since it was formed with a higher implant energy. This allows a channel region to be formed in the body region 140 under the source region 150 adjacent to the second polysilicon 135. The body contact region 145 is located under and between portions of the source region 150. The order of the implants can be changed, and the body implants, which do not need to be angled, can be performed earlier or later in the process.

Figure 1A:
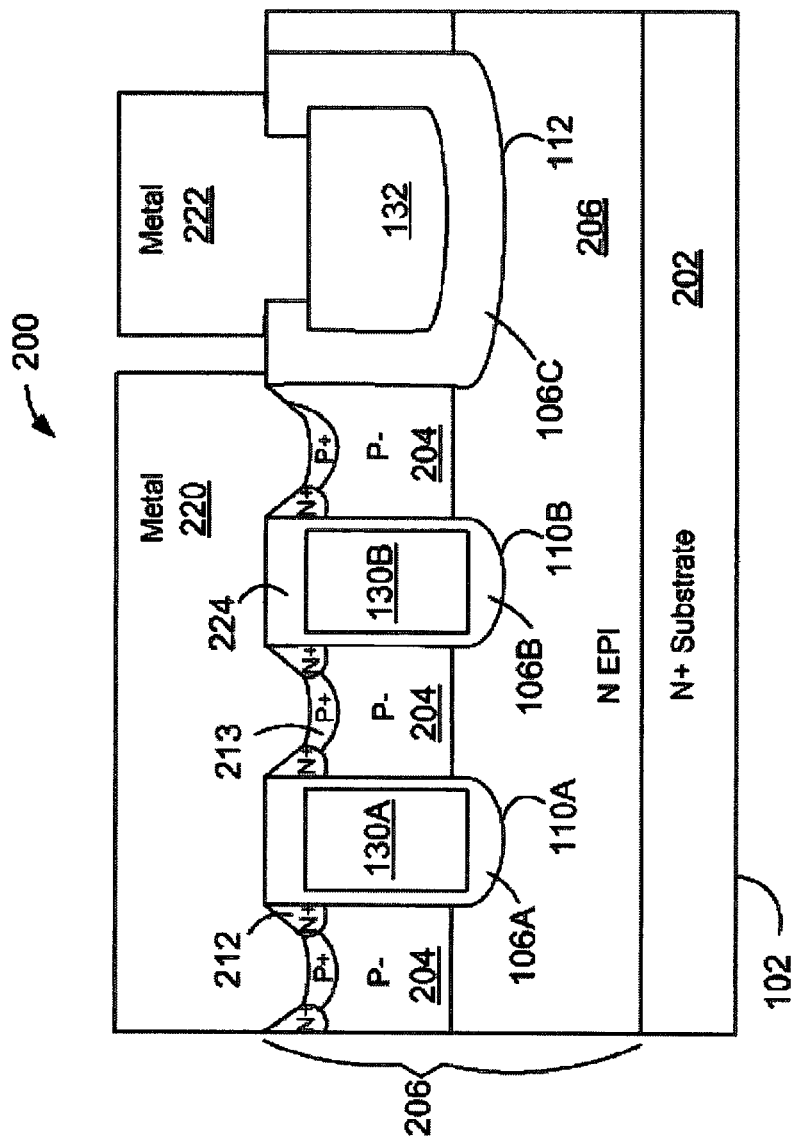
FIG. 1A is a cross sectional view for showing a conventional configuration of a vertical power device.
Figures 1, 1B, 2, 3:
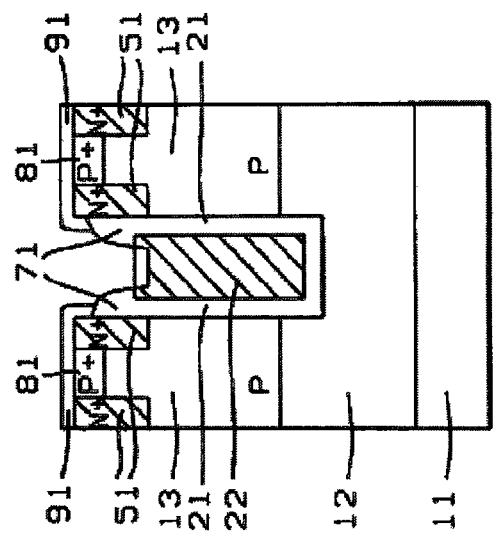
FIG. 1B-1 through 1B-3 are cross sectional views showing a method of forming a vertical power device of another prior art.
Figures 1, 1B, 2:
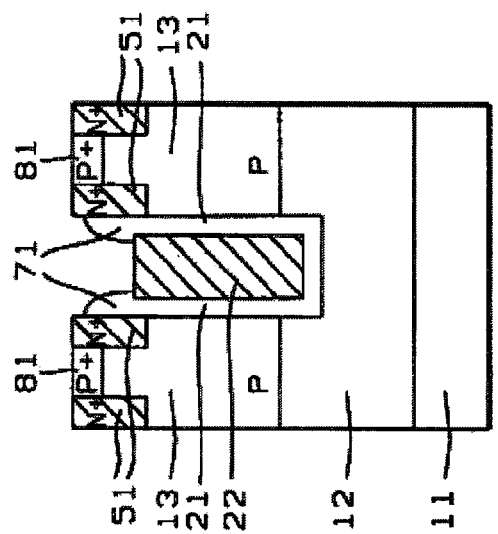
Figures 1, 1B:
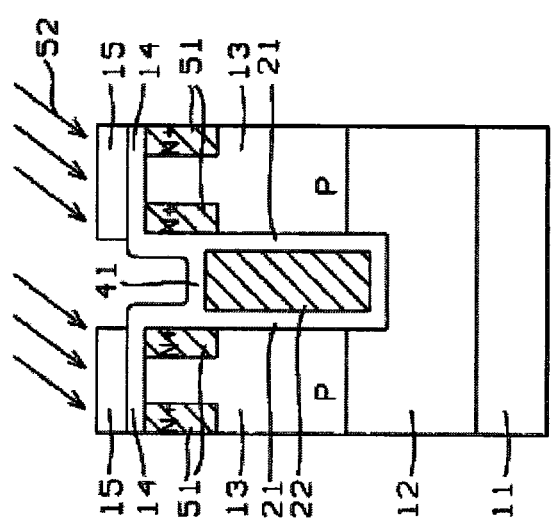

In FIG. 3L, a silicon nitride layer is formed and then anisotropically etched to form the spacer 152 along the exposed portions of trench sidewalls, above the second polysilicon 135 of trenches 119. A titanium metal layer is then deposited followed by a high temperature operation to form the silicide gate contact layer 155. Silicide 155 is formed wherever the titanium metal layer is in contact with silicon material—thus it is formed on top of the second polysilicon 135 between the nitride spacers 152, but not on the nitride spacers 152, or on the gate oxide layer 132. This is followed by an etch process to remove the un-reacted metal thus leaving silicide gate contact layer 155 formed on top of the second polysilicon layer 135 without the use of a mask. Other suitable metals for the silicide process may include but are not limited to tungsten, nickel, cobalt or palladium. The nitride spacers 152 are beneficial for ensuring that silicide 155 is only formed on the gate regions, and on the silicon along the trench sidewalls but in an alternative method, the gate silicide 155 may be formed without the use of spacers since there should be a thin gate oxide 132 blocking those regions. In FIG. 3M, the silicon nitride (Si3N4) spacers 152 are optionally removed and an oxide layer 160 is deposited on top to fill the trenches and cover the top surface of the substrate. Alternatively, the nitride spacers may be left in place. In FIG. 3M-1, a removal process, e.g. CMP, is carried out to remove the top portion of the oxide layer 160 and gate oxide 132 above the trench top surface and expose the source region 150 and silicon surface between the gate trenches 119, while leaving an oxide plug 160 over the second polysilicon 135. By way of example, the top of oxide plug 160 can be made co-planar with the top of the silicon between gate trenches. In FIG. 3N, an etch process, e.g., reactive ion etch (RIE), is carried out to etch down the silicon through the top, horizontal portion of the source layer 150 and expose the top surface of the P+ body contact region 145 through the source regions 150. The sidewall portions of the source regions 150 still remain. Thus the body contact region 145 is exposed in the center at the top of each semiconductor protuberance (semiconductor protuberances being the semiconductor material between trenches 119), and source regions 150 are exposed at the sides on top of the semiconductor protuberances. The etch may be performed such that the top silicon surface between gate trenches is substantially flat. Only a small portion of semiconductor material needs to be removed—just enough to reach through the width of the source region 150. By way of example, the source regions 150 may have a width of in range between 0.05 to 0.2 microns. In FIG. 3O, a silicidation process is carried out by depositing a titanium layer and reacting it, e.g. by a high temperature process, with the exposed semiconductor material and then etching away unreacted metal leaving the source/body silicide layer 165 covering and contacting the P+ body regions 145 and the source region 150. Thus a self-aligned silicide source/body contact 165 is formed to the body 145, 155 and source regions 150. Alternatively, instead etching the silicon down to expose the P+ body contact regions 145 in FIG. 3N, the silicon may be only partially etched, or not etched at all—instead a thick layer of titanium may be deposited on the silicon; the titanium layer is thick enough that during the high temperature process, enough silicon is consumed for the formation of the silicide to reach the body contact layer 155, as is illustrated later in the application. In another alternative method, the gate and source/body silicides may optionally be formed at the same time; however, forming the gate and source/body silicide at the same time may run the risks of electrical shorts or bridges forming resulting in leakage paths from the source to the gate. The nitride spacer 152 may not be enough isolation to block the gate-source voltage, also resulting in leakage and breakdowns. These problems are avoided by forming the gate silicide 155 and source/body silicide 165 in separate steps, with the oxide plug 130 isolating the two regions. In another alternative, as shown in FIG. 3O-1, the gate silicide 155 is not formed at all; instead the oxide plug 160 is formed over the gate electrodes 135 without first forming a gate silicide; this can be done to ensure that there is no chance of a source/gate short due to the silicidation process and would result in the final structure 100b shown in FIG. 2B. In FIG. 3P, an oxide layer 170 is deposited on top and a CMP process is performed if needed for small contact alignment. A contact mask (not shown) as the second mask is applied to form the contact trenches followed by filling the contact trenches with a conductive plug such as tungsten to contact the source/body and gate regions as source contact 180-S and gate contact 180-G. The process window is fairly large for making forming the contact trenches to the source/body regions, because the contact trench can reach any part of a semiconductor protuberance and be routed to the source and body regions by the self-aligned source/body silicide 165. This improves the reliability and throughput of the manufacturing process, and allows for ever smaller cell pitches. In FIG. 3Q, a metal layer 190 is formed and patterned, e.g. using a third mask (metal mask); on the top surface to form the gate metal 190-0 and the source metal 190-S.

FIGS. 3D' to 3P' are a series of cross sectional views for describing processing steps to fabricate another portion of a MOSFET device 100' as shown in FIG. 3P' below with a wide trench 119' with the option of forming a specially configured termination area. By way of example, these figures may be taken in a termination area near the edge of the device. FIG. 3D' shows a cross section having gone through the same process as FIGS. 3A-3D. However, in FIG. 3D', a wide trench 119' has been formed, e.g. having a width of 4-8 microns and is lined with shield oxide 120 just like the active gate trenches 119-1. The thinner active gate trenches 119-1 are also shown in these figures. The processing steps shown in FIG. 3E'-1 to 3E'-4 are processing steps carried out between the steps shown in FIGS. 3E and 3F above. As shown in FIG. 3E'-1, the wide trench 119' is partially filled with the first polysilicon layer 125. Because the wide trench 119' is much wider than the active gate trenches 119-1, the first polysilicon layer 125 completely fills the active gate trenches 119-1, but only lines the sidewalls and bottom of the wide trench 119', with a thickness of W (e.g. 0.9 microns), leaving a groove in the middle of the trench. Though the figure is not to scale, the thickness W of the first polysilicon layer 125 should be about the same throughout the device, i.e., on the wide trench sidewalls, on the wide trench bottom, on top of the semiconductor surface, etc. In FIG. 3E'-2 an oxide layer 126 is filled into the partially filled trench 119' covering over first polysilicon layer 125 followed by depositing a silicon nitride layer 127 and another oxide layer 128 to form an ONO (oxide nitride oxide) stack. Because the wide trench 119' is so wide, the ONO layers 126, 127, 128 leave a gap space 121' at the center of the wide trench 119'. Once again, though the figure is not to scale, the oxide layer 126 should have a uniform thickness, i.e. same thickness on the bottom and sidewalls of the wide trench 119' and over the top of the semiconductor protuberances. In FIG. 3E'-3 the top oxide layer 128 is mostly removed from the top of the silicon nitride layer 127 by applying a CMP process, leaving a U-shaped portion of the top oxide layer 128 in the middle of the wide trench 119-1 surrounding the gap space 121'. In FIG. 3E'-4, an silicon nitride etch process is performed to remove the silicon nitride layer from the top surface and leaving a U-shaped oxide layer 128 on top of the etched-back silicon nitride layer 127 (which may also be U-shaped) at the center of the wide trench 119'. The oxide layers 126, 128 are then CMP down to the first polysilicon layer 125, as shown in FIG. 3E'-4. Note that in the other areas outside of the wide trench 119' (e.g., the active area around active gate trenches 119-1), the ONO layers 126, 127, 128 have been removed. Only in the center of the wide trench 119', do the ONO layers 126, 127, 128 remain; they form a U-shape at the center of the trench. In FIG. 3F' a polysilicon etch is performed (as also shown in FIG. 3F) to etch back the first polysilicon layer 125 leaving only the bottom segment in the bottom portions of the trenches. In FIG. 3G', an inter-poly dielectric layer 130 is deposited and optionally CMP. In FIG. 3H', an etch back of the IPD layer 130 is performed which in the wide trench 119' recesses the IPD layer 130 and oxide layer 126 around the nitride layer 127, leaving an oxide protuberance 122, and removes the remaining portions of oxide 128. Note that if the etch back process is isotropic, there will be some undercut (not shown) of the oxide protuberance 122 under the edges of the nitride layer 127. The width of the trench 119' will need to take this undercut into account. In FIG. 3H'-1, the silicon nitride layer 127 is removed leaving an oxide protuberance 122 in the center portion of the wide trench 119'. This may be followed by growing and then removing a sacrificial oxide layer (not shown) to repair the sidewall surfaces of the trenches 119. In FIG. 3I', a gate oxide layer 132 is grown, then a second polysilicon layer 135 is deposited and a CMP process may be performed to planarize the top surface. In FIG. 3J', the second polysilicon layer 135 is etched down to recess below the sidewalls of the trenches 119-1 and 119' as well as below the top of oxide protuberance 122 for forming trench gate electrodes. Thus in the wide trench 119', two polysilicon electrodes 135 are formed, separated by the oxide protuberance 122 in the middle. The trench gates as described above formed with the self-aligned silicide processes are configured as recessed gates with the sidewalls extending above the top surface of the gate electrodes 135. The processing steps shown in FIGS. 3K' to 3O' are the same and correspond to the processing steps described in FIGS. 3K to 3O above including forming the source 150, body 140, and body contact 145 regions in FIG. 3K', nitride spacers 152 and gate silicide 155 in FIG. 3L', oxide plug 160 in FIGS. 3M' and 3M'-1, etching back the silicon in FIG. 3N', and forming the source/body contact silicide 165 in FIG. 3O'. Then, in FIG. 3P' the oxide layer 170, e.g., LTO and BPSG, is formed on the top surface and optionally planarized by CMP.

In an alternative embodiment, it may be possible to omit the second oxide layer 128 of the ONO stack. In FIG. 3E''-3, which is similar to FIG. 3E'-3, the first oxide layer 126 is deposited, and then CMP back to polysilicon 125 surface, then nitride 127 is deposited. The nitride 127 can also be CMP back to the polysilicon 125 surface as shown. From here, the previously explained steps can be continued including etching back the first polysilicon layer 125, and etching back the first oxide layer 126, using the nitride 127 as a hard mask to leave an oxide protuberance 122 remaining from oxide layer 126.

FIG. 3Q'-AA shows a possible MOSFET termination that may be formed from a structure similar to that shown in FIG. 3P'. This can be used for a high voltage termination configuration. The termination metal 190-T is electrically connected to the silicide layer 165 on the die edge 199 of the MOSFET 100' by trench contact 180-T-2 and to the outermost second polysilicon electrode 135-2 in the wide trench 119' by trench contact 180-T-1. Since the die edge 199 is at drain potential, the outermost poly 135-2 is shorted to drain potential. The innermost second polysilicon 135-1 in the wide trench 119' is connected to the gate metal 190-G by gate contact 180-G. The oxide protuberance 122' can be designed to be wide enough to support the blocking voltage across it. For high voltage devices, the termination trench can surround the active area thus terminating the device.

Another optional layout is shown by FIG. 3Q'-BB wherein another portion of the MOSFET 100' includes the source metal 190-S electrically connected to the first polysilicon layer 125 disposed on the bottom portion of the wide trench 119' through a trench contact 180-S. The bottom gate polysilicon 125 is connected to the source metal 190-S to act as the shield gate electrode for a shield gate trench (SGT) MOSFET. This structure may be formed from a structure similar to that shown in FIG. 3P' by placing the contact hole for shield contact 180-S' in the oxide protuberance 122' of wide trench 180-S', between the second polysilicons electrodes 135-1, 135-2. The bottom poly 125 of wide trench 119' may be connected to the other bottom poly 125 in the active trenches 119-1 in a third dimension.

FIG. 3Q'-CC shows another optional embodiment where the gate contacts 180-G may be formed from a gate metal 190-G to the gate electrodes 135-1 in the wide trench. A MOSFET device 100' is therefore formed as shown in FIG. 3Q'-CC similar to the device 100 shown in FIGS. 2 and 3Q, except that the oxide protuberance 122' is filled in the middle portion of the wide trench 119' of the device 100'.

Figure 4A:
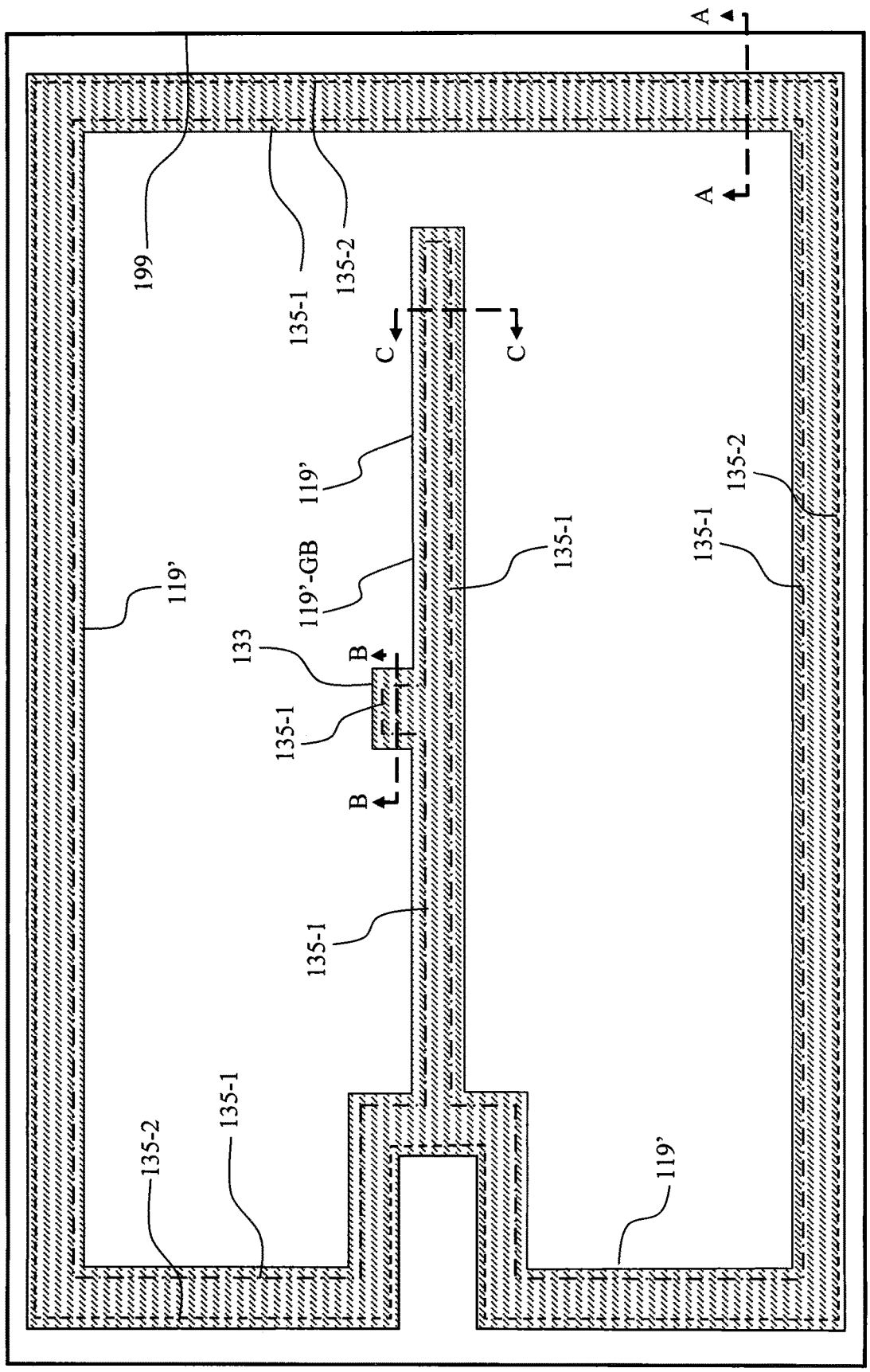
FIGS. 4A. 4B to 4B'-1 are top views showing possible layouts of the MOSFET device of this invention.
Figure 4B:
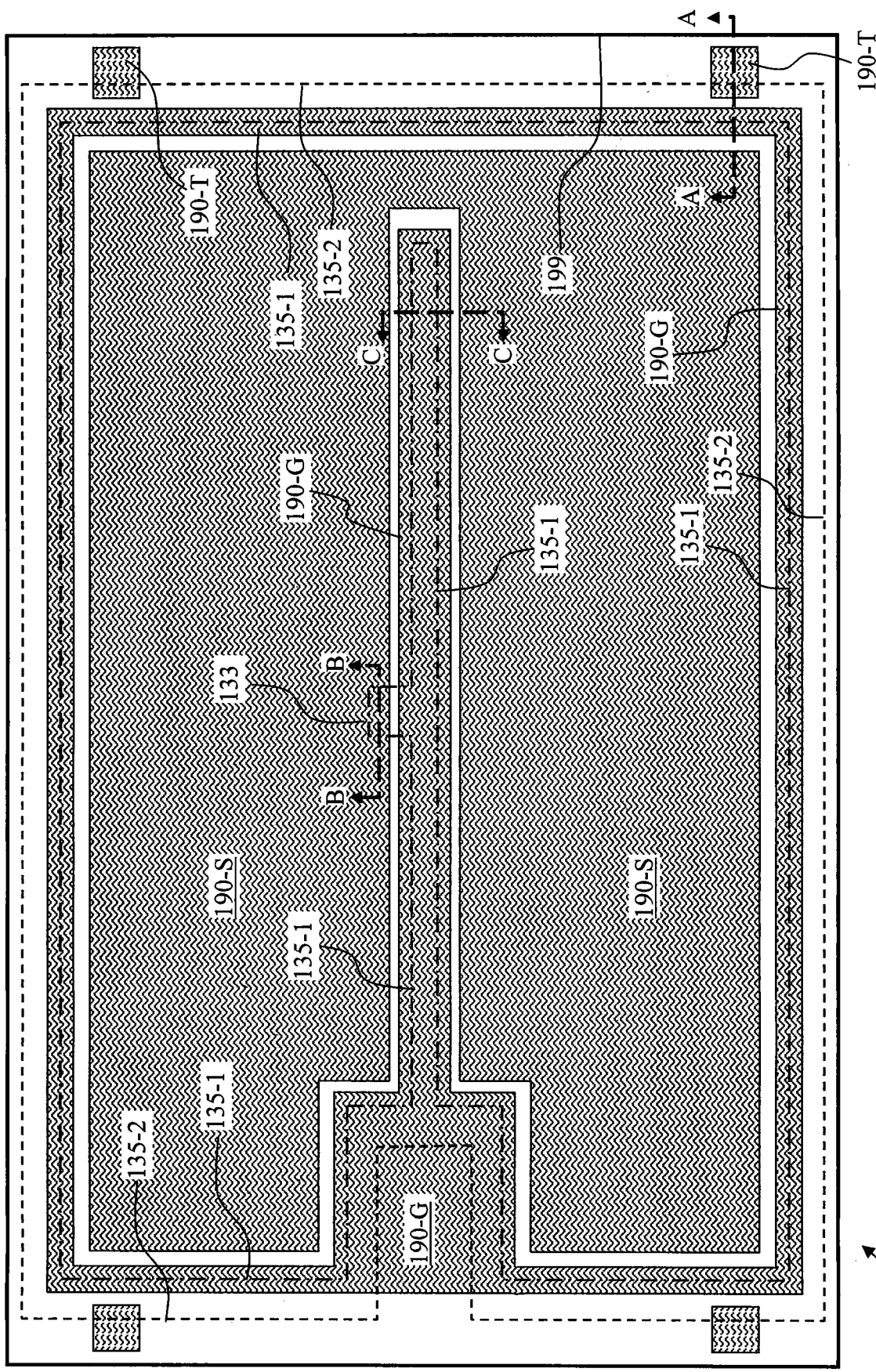
Figure 4B:
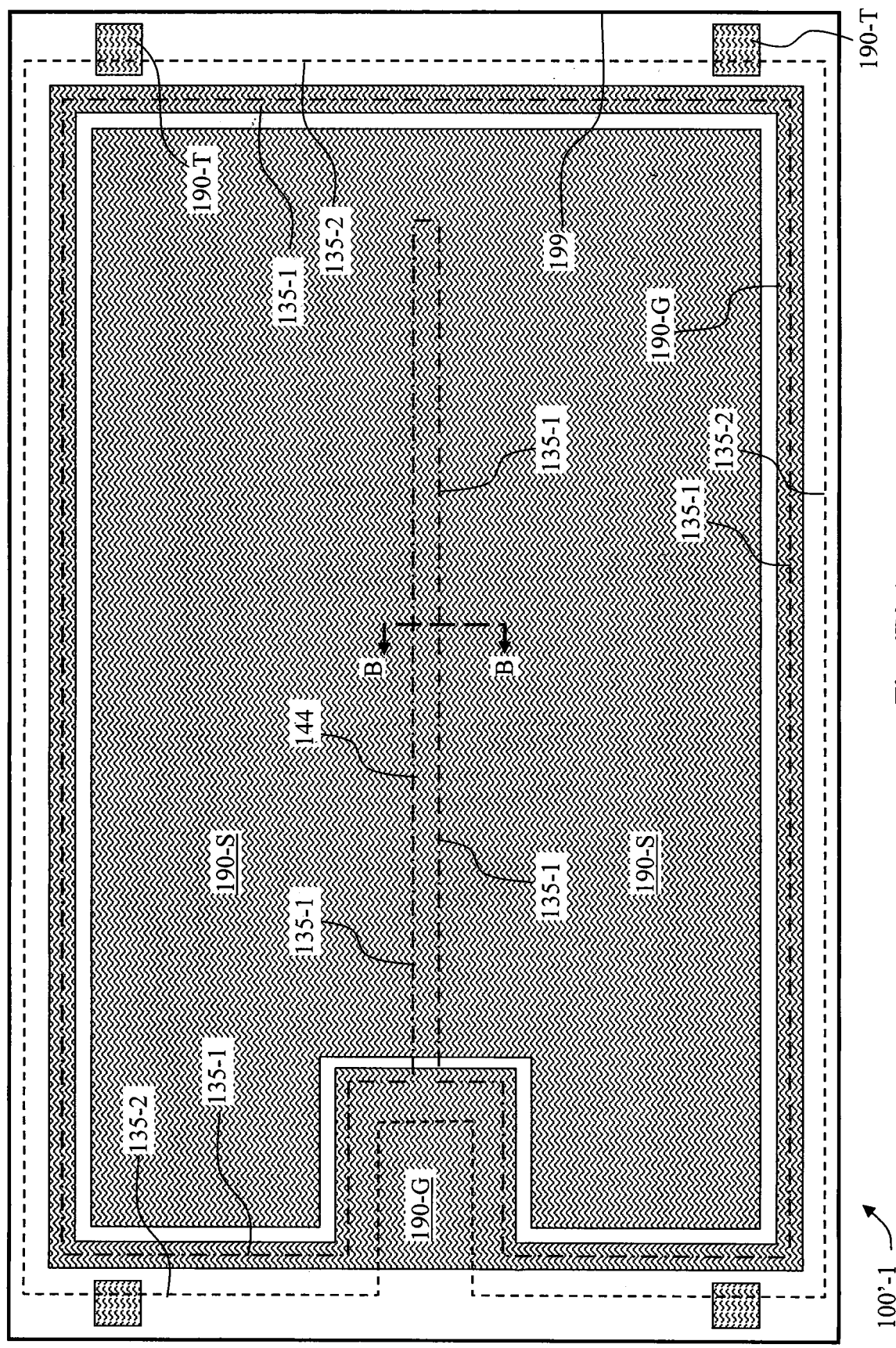

FIGS. 4A-4B are top views of a schematic layout of the device 100'. The cross sectional figures of FIGS. 3Q'-AA, 3Q'-BB and 3Q'-CC are taken from cross section lines A-A, B-B, and C-C, respectively of FIGS. 4A-4B. FIG. 4A shows a possible schematic layout for wide trench 119'. The two second polysilicons 135-1 and 135-2 line the edges of the wide trench 119'. The inner polysilicon 135-1 is on the inner side of wide trench 119', and its position is indicated by a dash-dot line. The outer polysilicon 135-2 is on the outer side of the wide trench 119' and its position is indicated by a dashed line. Though not specifically shown, the oxide protuberance 122 is located between the inner and outer polysilicon 135-1 and 135-2. FIG. 4B shows the metal layout of a device 100', and also shows the location of polysilicons 135-1, 135-2 of wide trench 119'. The wide trench 119' is mostly located near the die edge, surrounding the device 100', but has occasional protrusions which allow structures like a gate bus 119'-GB to be formed. The gate bus 119'-GB is a protrusion of just the inner side of the wide trench 119', so only the inner electrode 135'-1 is present there as shown in cross section C-C (see FIG. 3Q'-CC). Another protrusion, as shown in cross section B-B (see FIG. 3Q'-BB) allows for the source metal to connect to the first polysilicon layer 125 under the oxide protuberance 122. Both of the second polysilicon layers 135 in wide trench 119' are the inner polysilicon 135-1 in the cross section figures of FIGS. 3Q'-BB and 3Q-CC. Note that contacts can be made from the metal to the underlying structure wherever desired, so even though a structure runs under a metal, e.g., the outer poly 135-2 briefly runs under the gate metal 190-G, contact does not need to be made from the metal to that structure. The active area of the device is located under the source metal 190-S. A gate metal runs along the top of inner poly 135-1. In certain locations termination metal 190-T shorts the outer poly 135-2 to the source/body regions at the periphery of the die (see cross section A-A of FIG. 3Q'-AA).

In an alternative layout as shown in FIG. 4B'-1, the cross sectional figure of FIG. 3Q'-BB is taken along the line B-B of FIG. 4B'-1. The MOSFET device 100'-1 is similar to MOSFET device 100', except that the wide trench has a protrusion so that an inner gate runner 144 is formed extending through the active area (though gate metal 190-G is not formed over inner gate runner 144, having inner trench 135-1, and no second protrusion 133 is formed on the gate runner. Instead source metal 190-S covers the inner gate runner 144 so that a contact can be made from the source metal 190-S to the bottom electrode 125 at the cross section B-B along the inner gate runner 144.

Figure 5B:
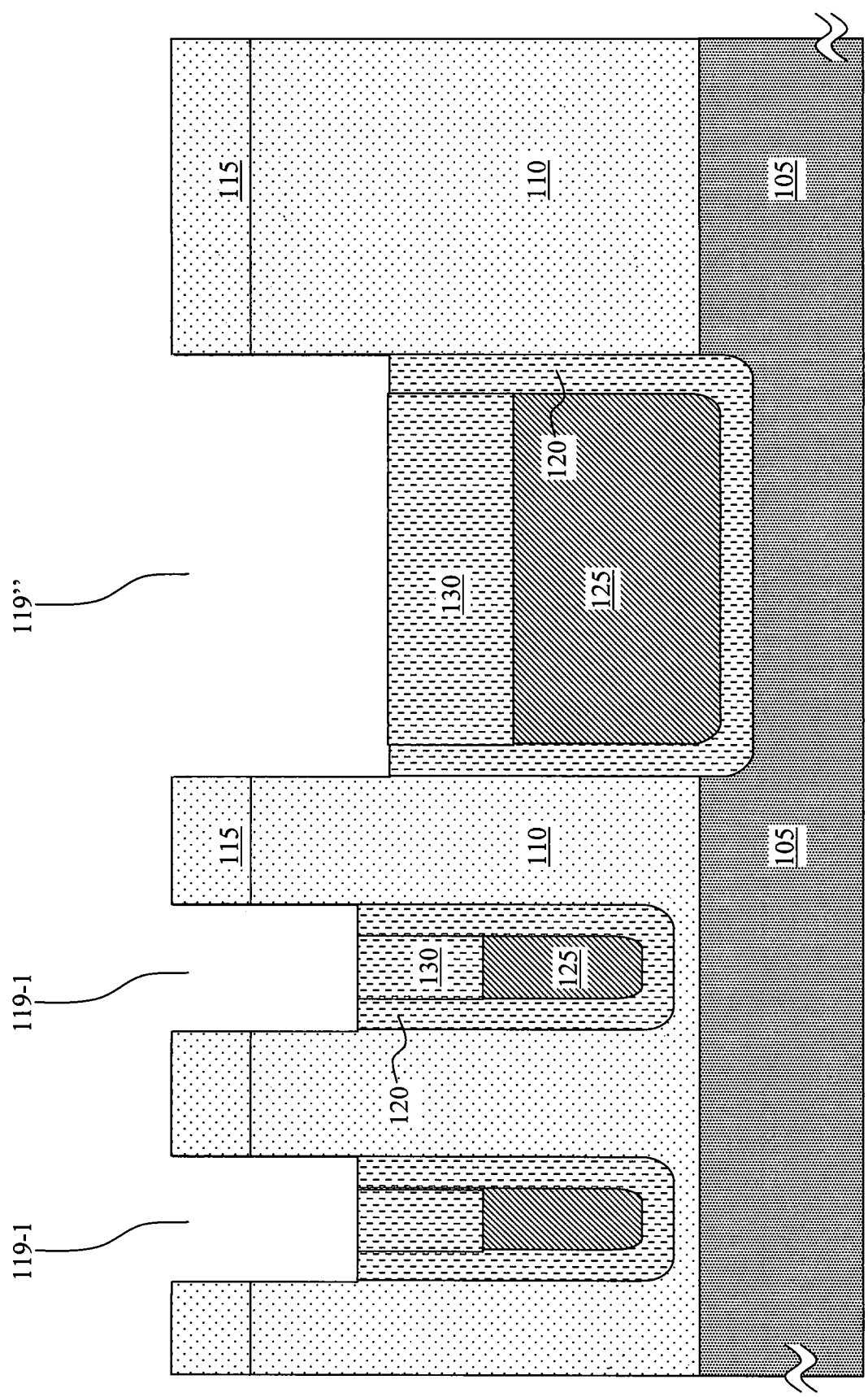
Figure 5C:
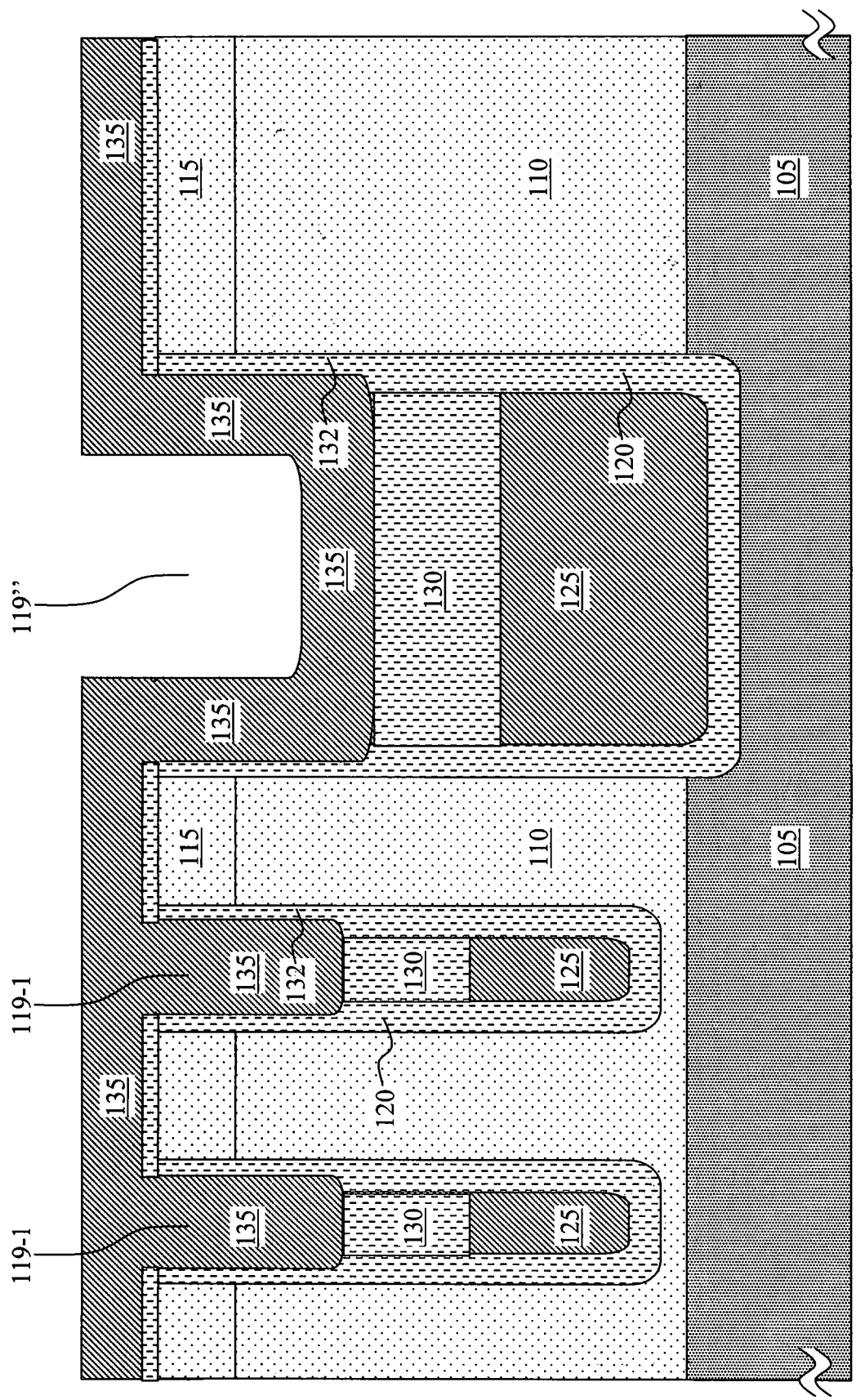
Figure 5D:
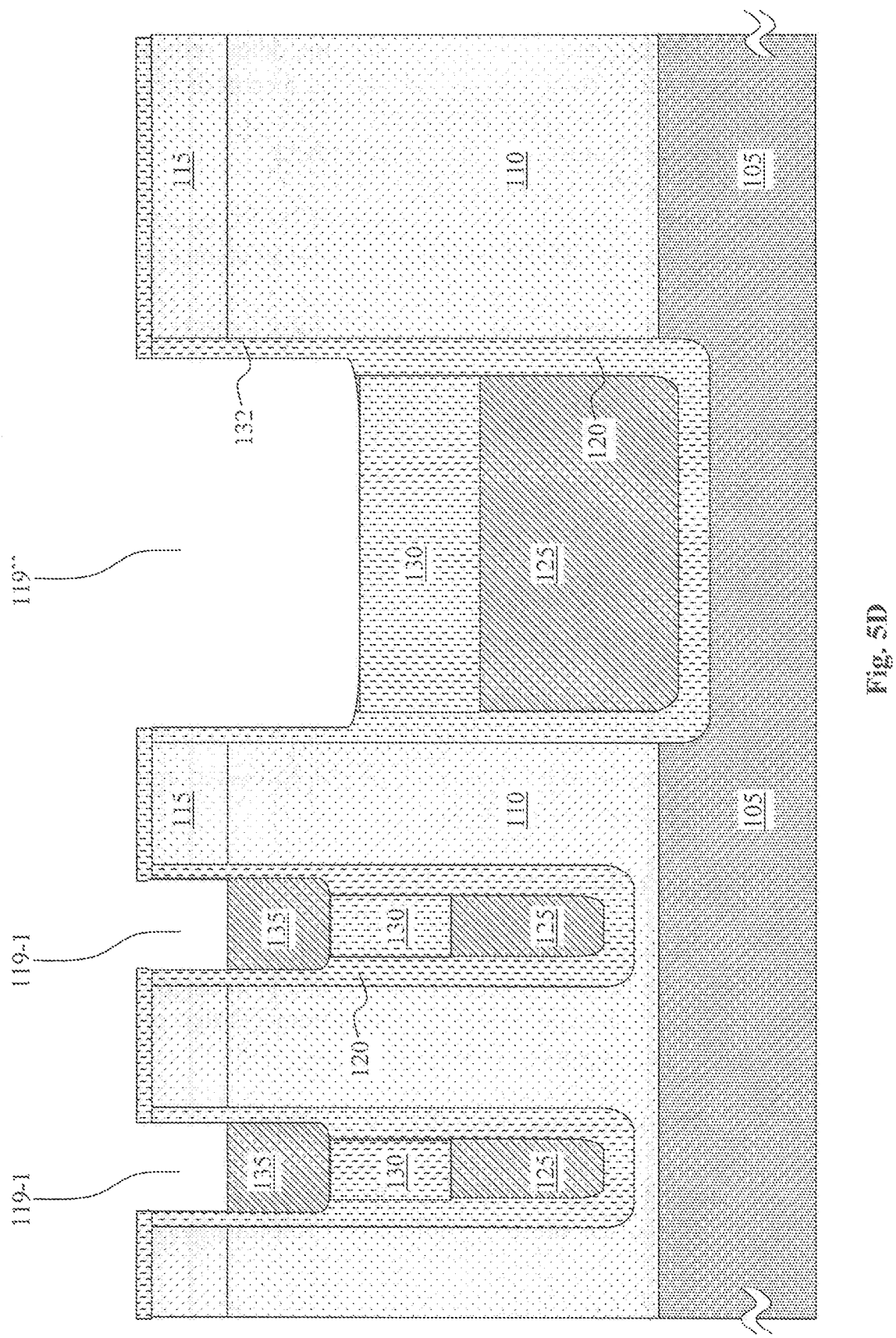
Figure 5E:
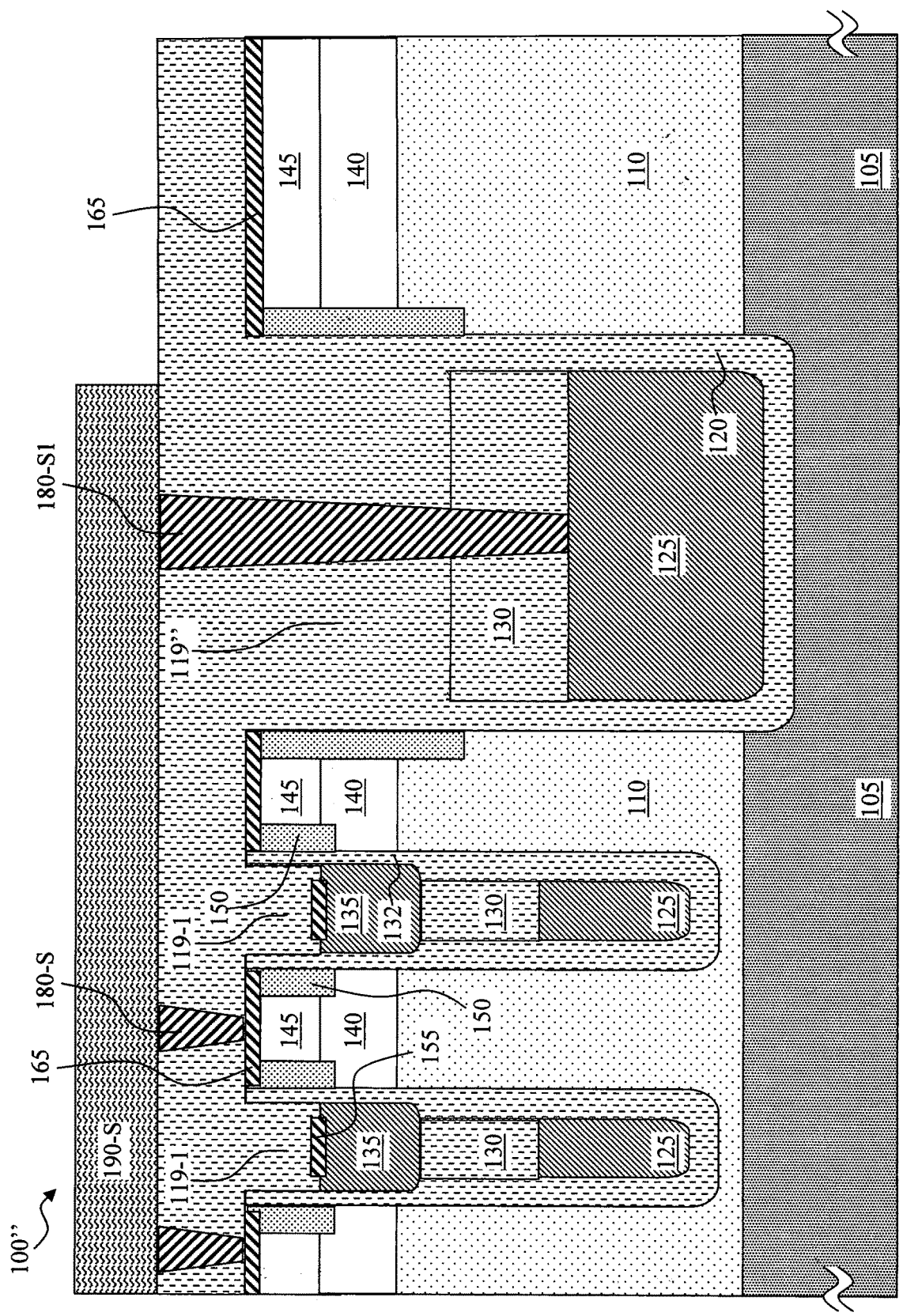

In an alternative embodiment, which is similar to one shown in U.S. application Ser. No. 12/583,192 filed Aug. 14, 2009, a simpler termination and shield electrode contact can be made as shown in FIGS. 5A-5E which may be made formed using the same process steps shown in FIGS. 3A-3Q. In FIG. 5A, which picks up at the step shown in FIG. 3E, active trenches 119-1, and a wider trench 119" have been formed in the semiconductor substrate and lined with oxide 120; the first polysilicon layer 125 is deposited thick enough to fill in all both active trench 119-1 and wide trench 119". In FIG. 5B (corresponding to the step of FIG. 3H), the first polysilicon 125 is etched back to form a bottom polysilicon electrode 125 at the bottom of the trenches, and an IPD 130 is similarly formed over it. In FIG. 5C (corresponding with FIG. 3I), a gate oxide layer 132 is grown and the second polysilicon layer 135 is deposited on the device. The second polysilicon layer 135 has such thickness that completely fills the active trench 119-1, but only lines the sidewalls and bottom of wide trench 119". An isotropic etch may then be carried out, which completely removes the second polysilicon layer 135 from the top surface of the device and from the wide trench 119" but leaves second polysilicon 135 at the top of the thinner active trenches 119-1, as shown in FIG. 5D. The rest of the steps described previously may be carried out to form a MOSFET device 100" shown in FIG. 5E which is similar to device 100. If needed, the body regions 140 can be formed using angled implants. However, the wide trench 119" does not contain a second polysilicon 135 at its top region which enables a shield contact 180-S1 to be formed from the source metal 190-S to the first polysilicon 125 at the bottom of wide trench 119".

Note that in forming the above described structures of this invention shown in FIGS. 2-5, only three masks are needed—trench mask, contact mask, and metal mask.

Figure 6B:
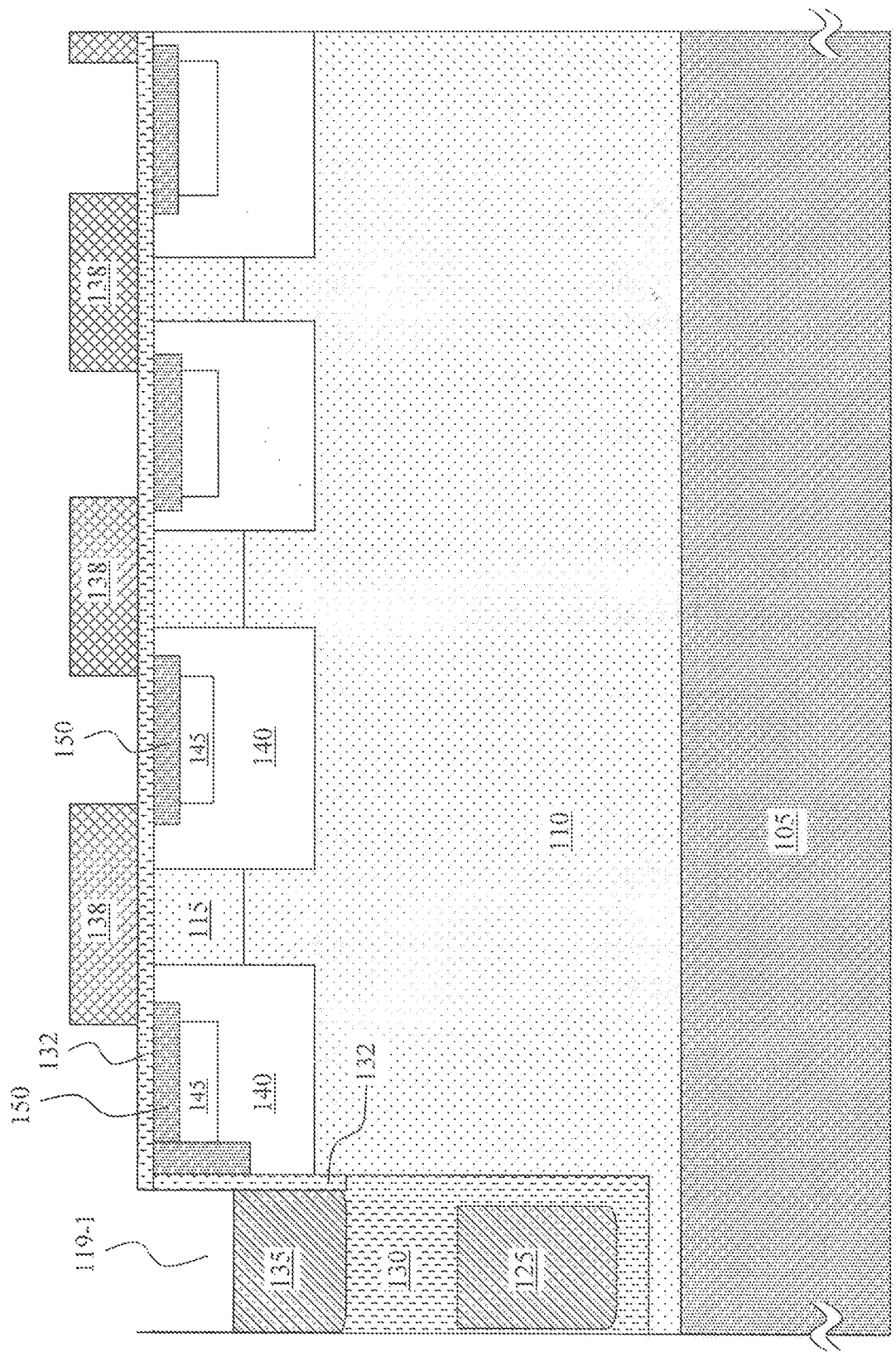
FIGS. 6A to 6D are a series of cross sectional views for illustrating the processing steps for manufacturing a MOSFET device integrated with Schottky diodes by applying self-aligned processes to reduce the required number of masks.
Figure 6D:
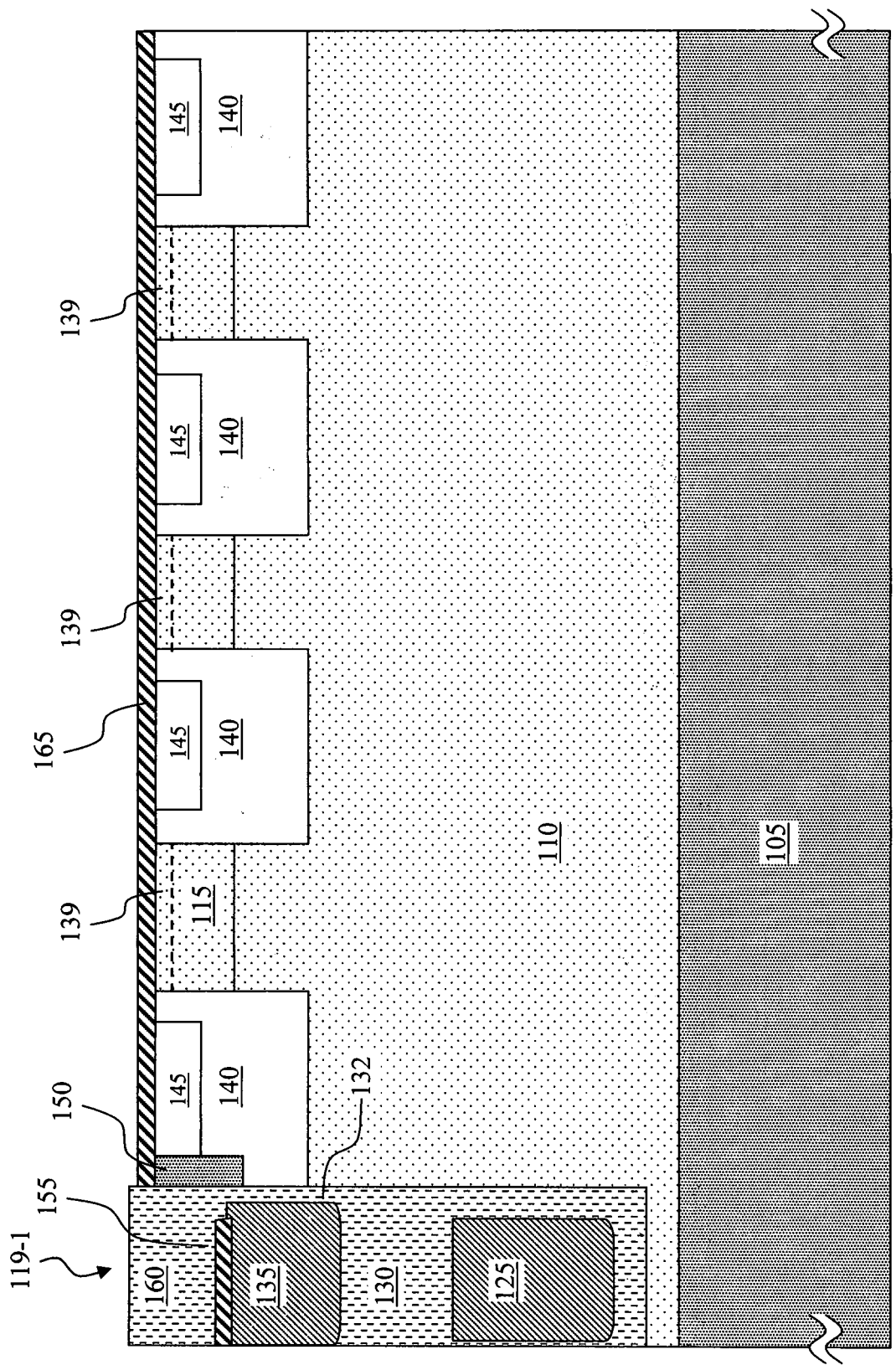
Figure 7:
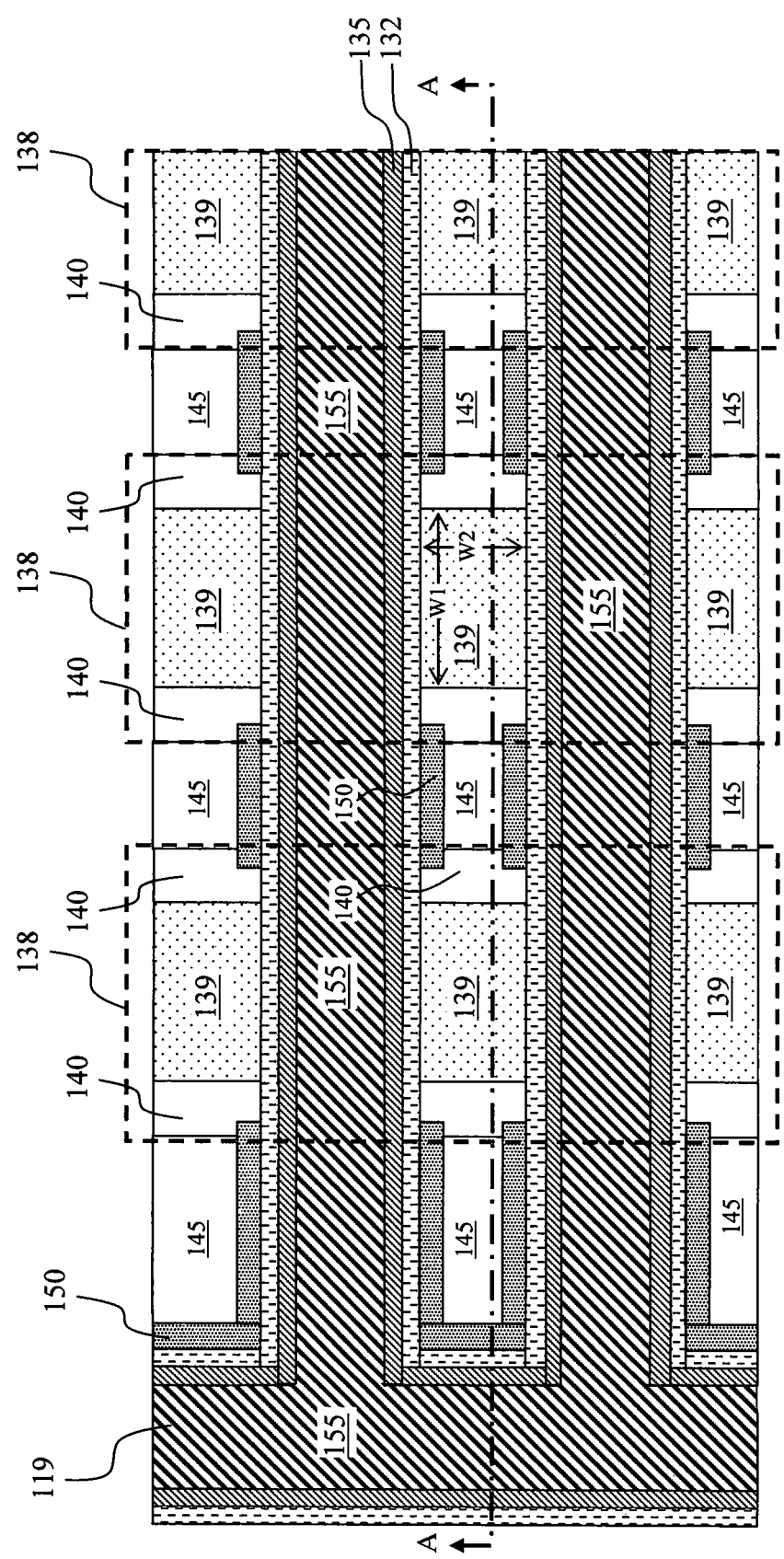
FIG. 7 is a top view to illustrate the layout configuration of the MOSFET device integrated with Schottky diodes, as described in FIGS. 6A to 6D.

FIGS. 6A to 6D are a series of cross sectional views to illustrate the processing steps for forming a Schottky diode integrated with the MOSFET device simultaneously manufactured on the semiconductor substrate 105. FIG. 6A shows the fabrication process starting from the step of the partially manufactured MOSFET device shown in FIG. 3J. A partially formed active gate trench 119-1 is shown on the left side of the cross section. An area designated for the Schottky region is shown to the right of the gate trench 119-1. The second polysilicon layer has just been etched back to leave second polysilicon 135 at the top of active trench 119-1. In FIG. 6B, a Schottky mask 138 is applied followed by the processes like those shown in FIG. 3K to form the body regions 140 and 145 and the source regions 150, though in a staggered pattern here because of Schottky mask 138. In FIG. 6C, the Schottky mask 138 is removed and the processing steps as shown in FIGS. 3L to 3N are performed to form the gate silicide 155, oxide plug 160, and to etch back the silicon surface to expose the P+ region 145. The top surface portions of the source 150 have been removed. Schottky regions 139 are located in the N-epitaxial regions 110/115 between the staggered body regions 140,145. At this point, a blanket shallow P or N implant may be carried out to adjust the Schottky height at a Schottky region 139 in between the P-body regions 140. If the doping concentration at the Schottky regions 139 is already suitable, no such implant is required. In FIG. 6D, the processes shown in FIG. 3O are performed by depositing a metal layer followed by a silicidation process to form the silicide layer 165 on top of the Schottky diodes formed in the Schottky regions 139 at the top of the N– epitaxial layer 110 (or N– epi layer 115, if present) surrounded by staggered P-body 140 and P+ body contact 145 regions. The staggered P-body regions provide the junction barrier of a junction barrier Schottky (JBS) to improve reverse blocking capability. They can also provide PN junction diodes for a merged PN-Schottky (MPS). There is also MOS (metal oxide semiconductor) pinching effect from the adjacent gate electrodes 135 (locations shown by gate silicide 155 in FIG. 7). FIG. 7 is a top view of the MOSFET device integrated with the Schottky diodes shown in FIG. 6D. The integrated Schottky diodes are manufactured simultaneously with the MOSFET on the same substrate having the Schottky diodes in the Schottky regions 139 with surrounding staggered body regions 140, 145 acting as junction barriers/PN diodes. The silicide layer 165 is not shown for clarity but cover the semiconductor substrate, including the source region 150, body region 140, 145, and the Schottky region 139 of the epitaxial layer 115. The outlines of the Schottky mask 138 are indicated by the dashed lines. Trench gates are shown traversing the figure (though the oxide plug 160 is not shown for clarity) the trench gates including the silicide gate contact layer 155, and gate oxide 132. The source regions 150 and P body regions 140, aid P+ body contact regions 145 are formed between the trench gates except where the Schottky mask 138 blocks them. N+ source regions 150 are formed along the sidewalls of the trench except where blocked by Schottky mask 138. The cross section view of FIG. 6D is taken along the line A-A of FIG. 7. By way of example, Schottky region 139 may have a width W1 that may have range between approximately 1 to 3 microns in a first dimension between body regions 140 to allow for JBS pinching in reverse blocking, and may have a width W2 that may have range between approximately 0.8 to 2 microns in a second dimension perpendicular to the first dimension between gate trenches 119 to allow for MOS pinching in reverse blocking.

Figure 8A:
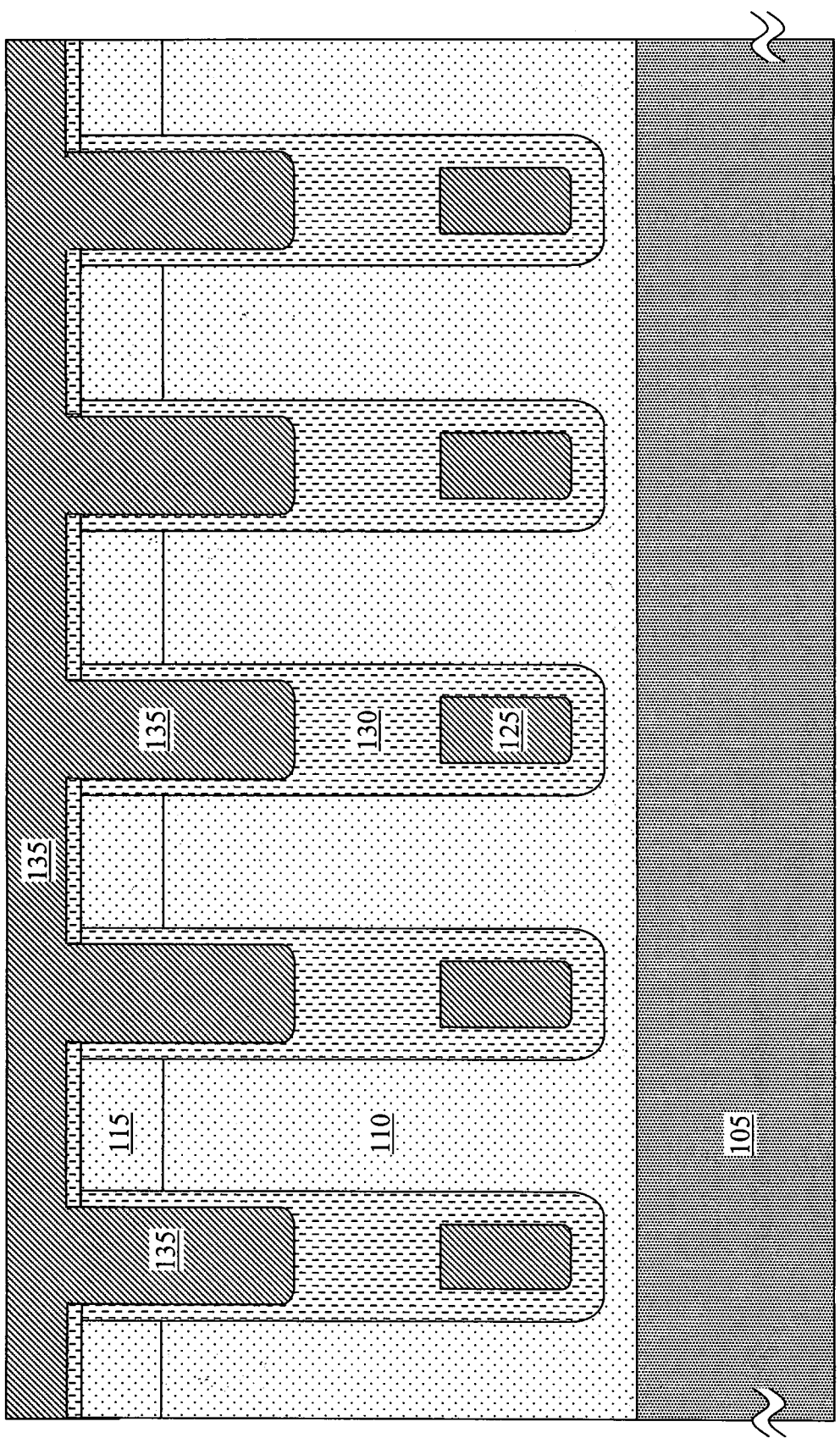
Figures 1, 8A:
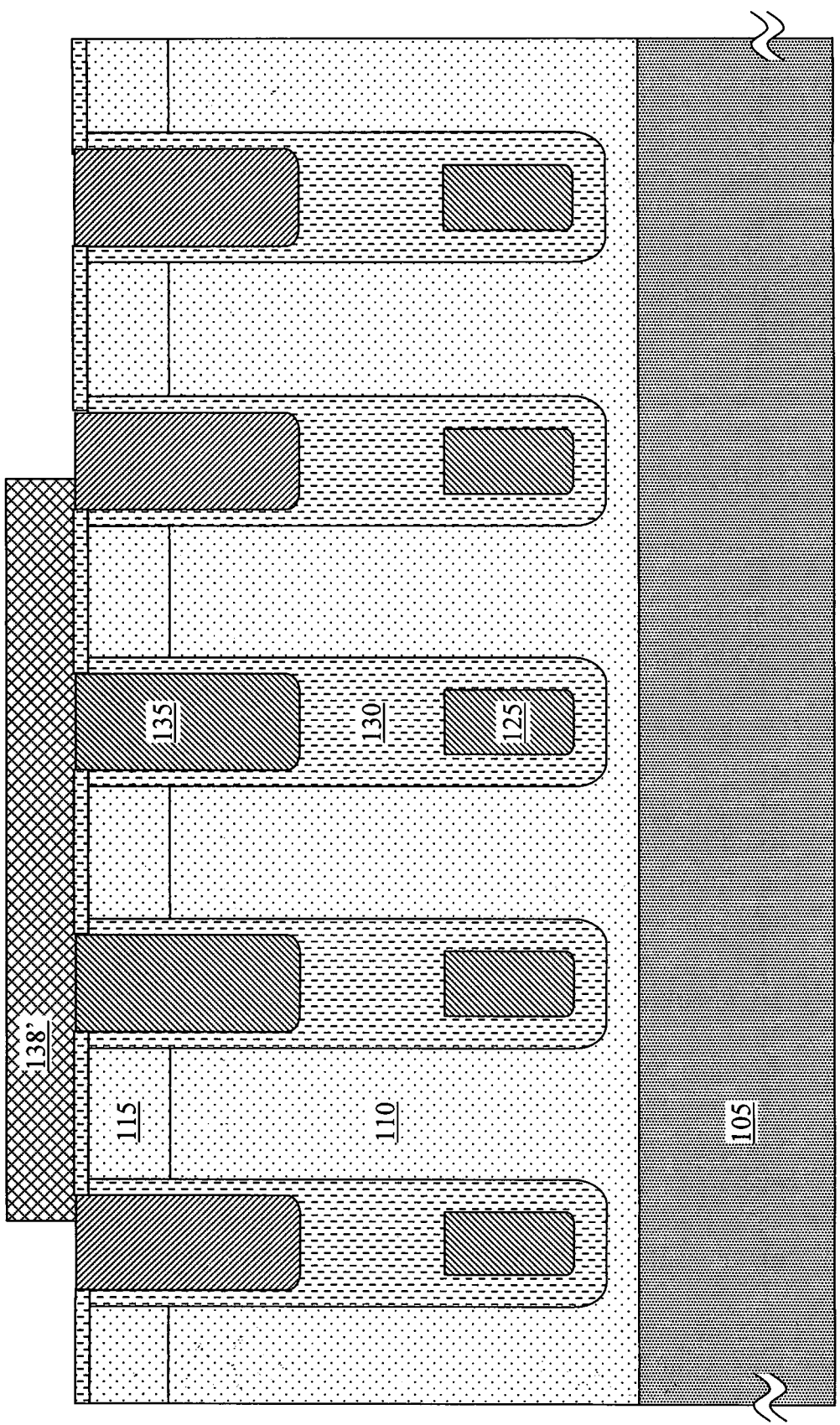
Figure 8B:
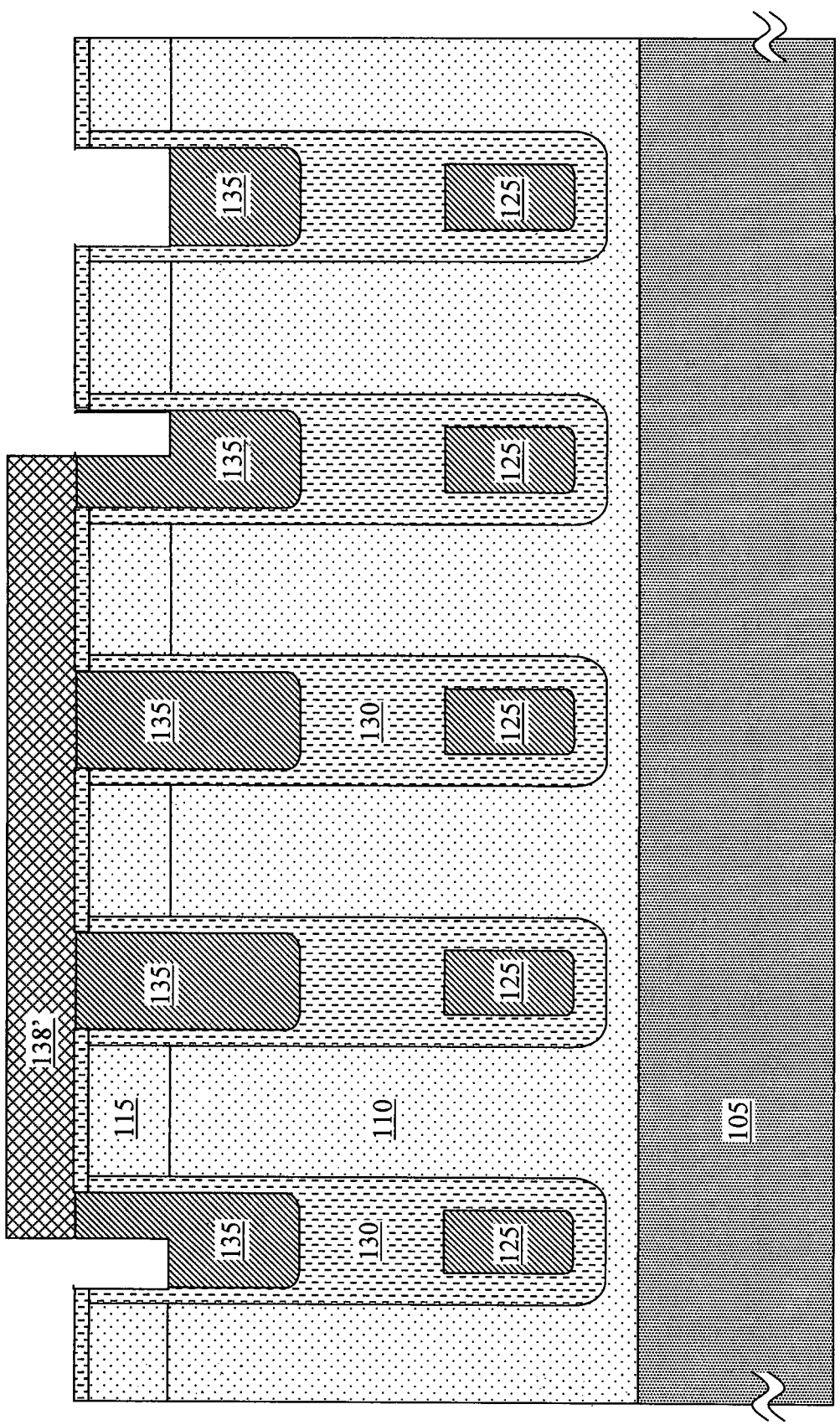
Figure 8C:
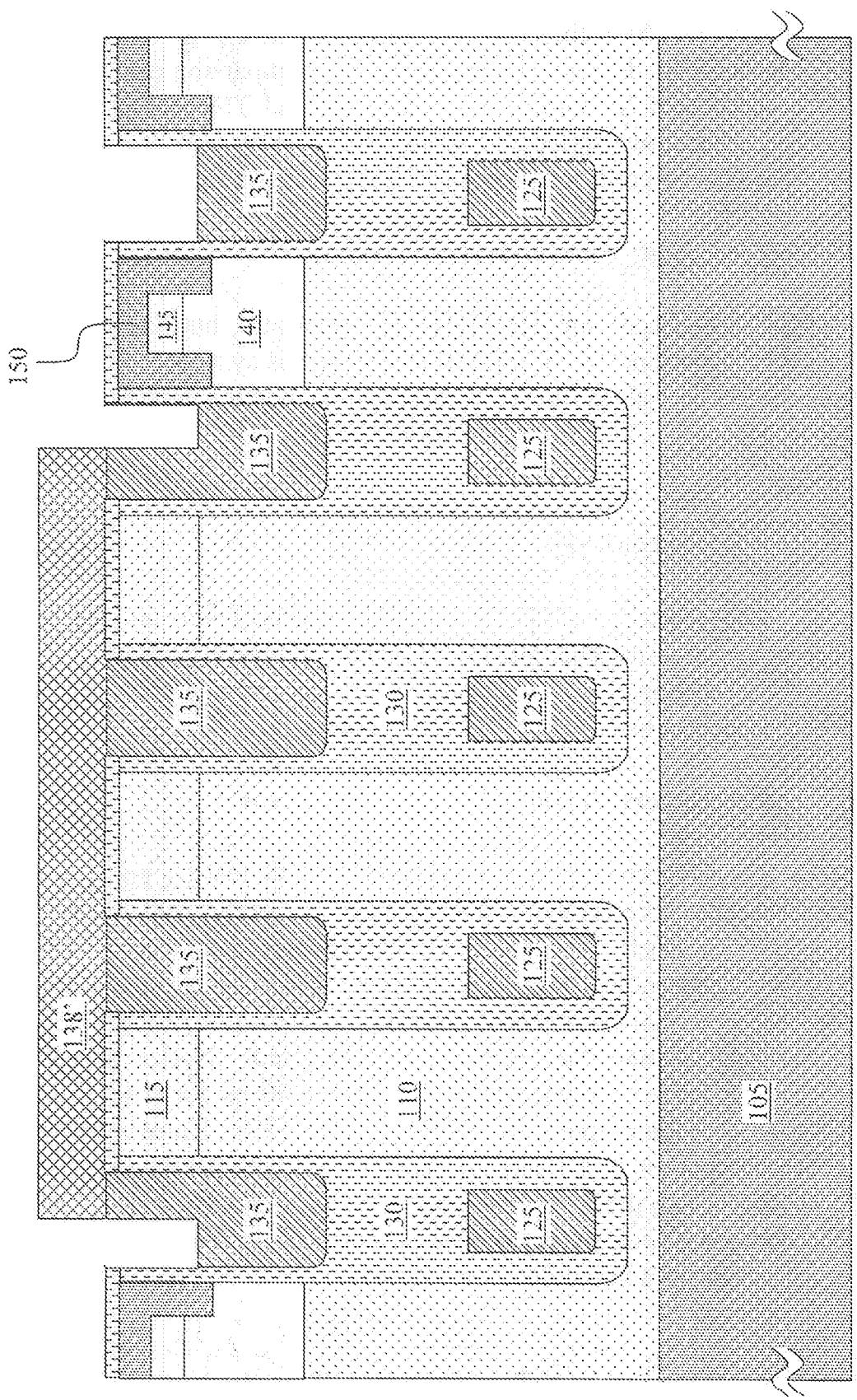
Figure 8D:
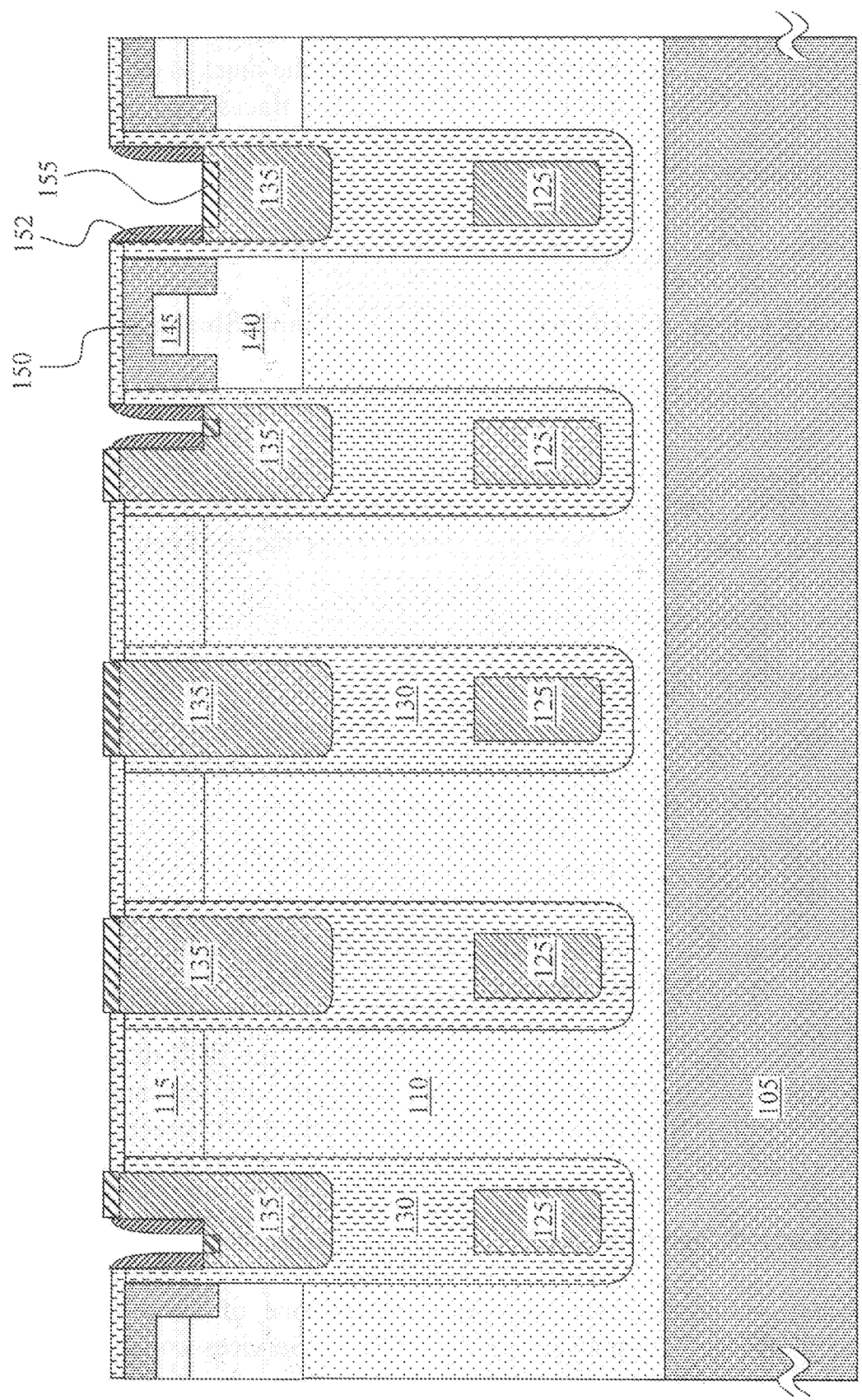
Figure 6E:
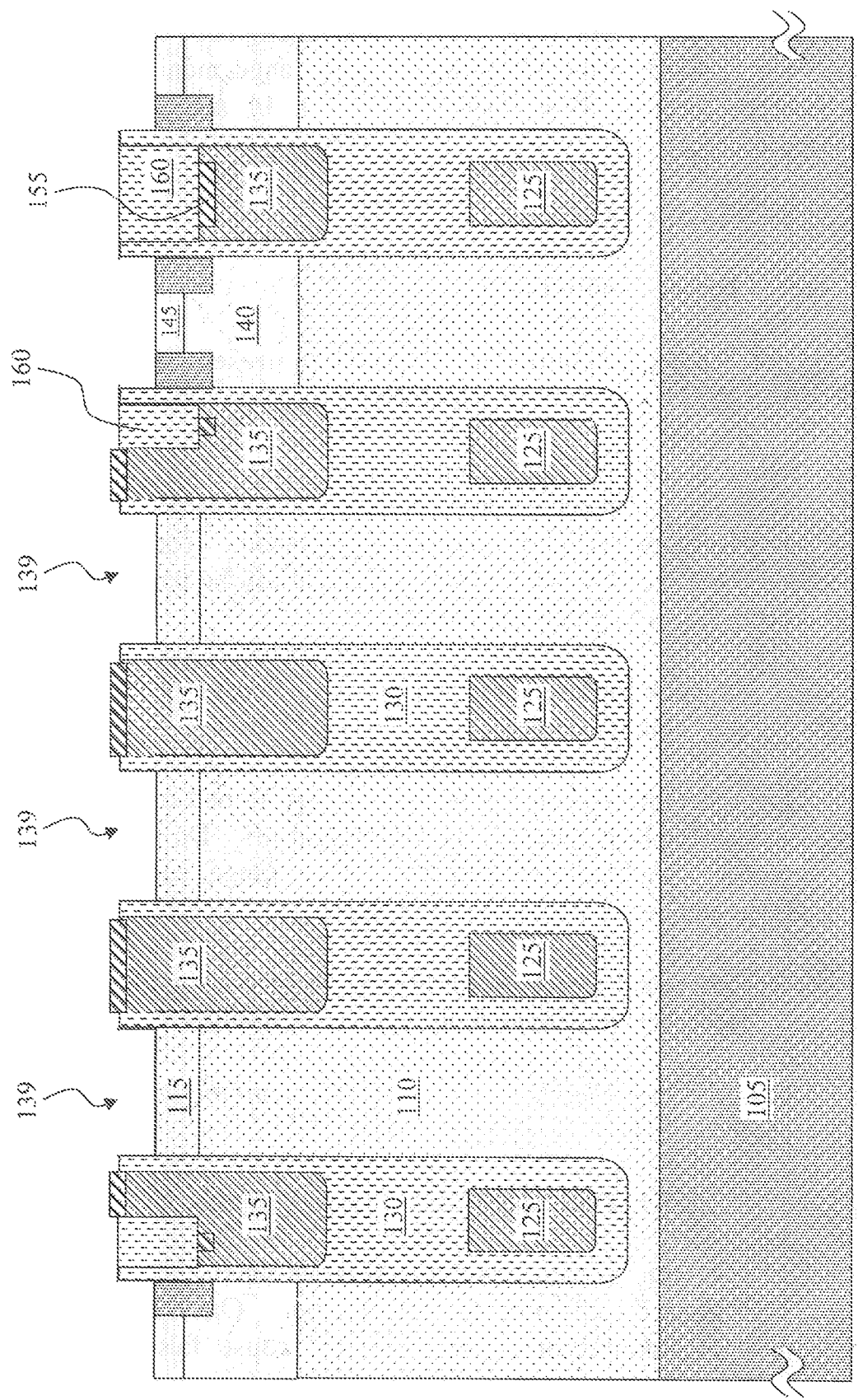
Figure 8F:
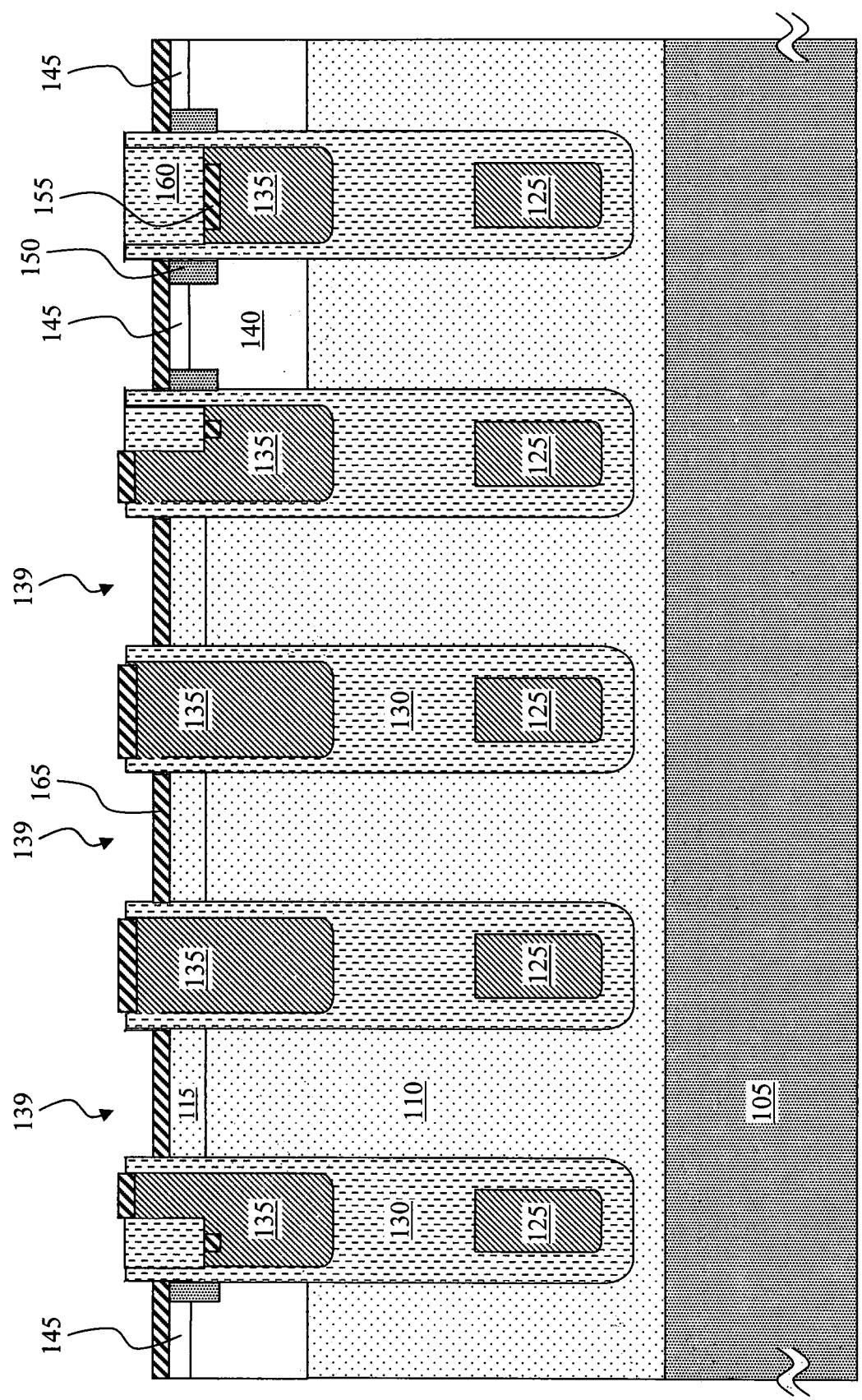
Figure 9:
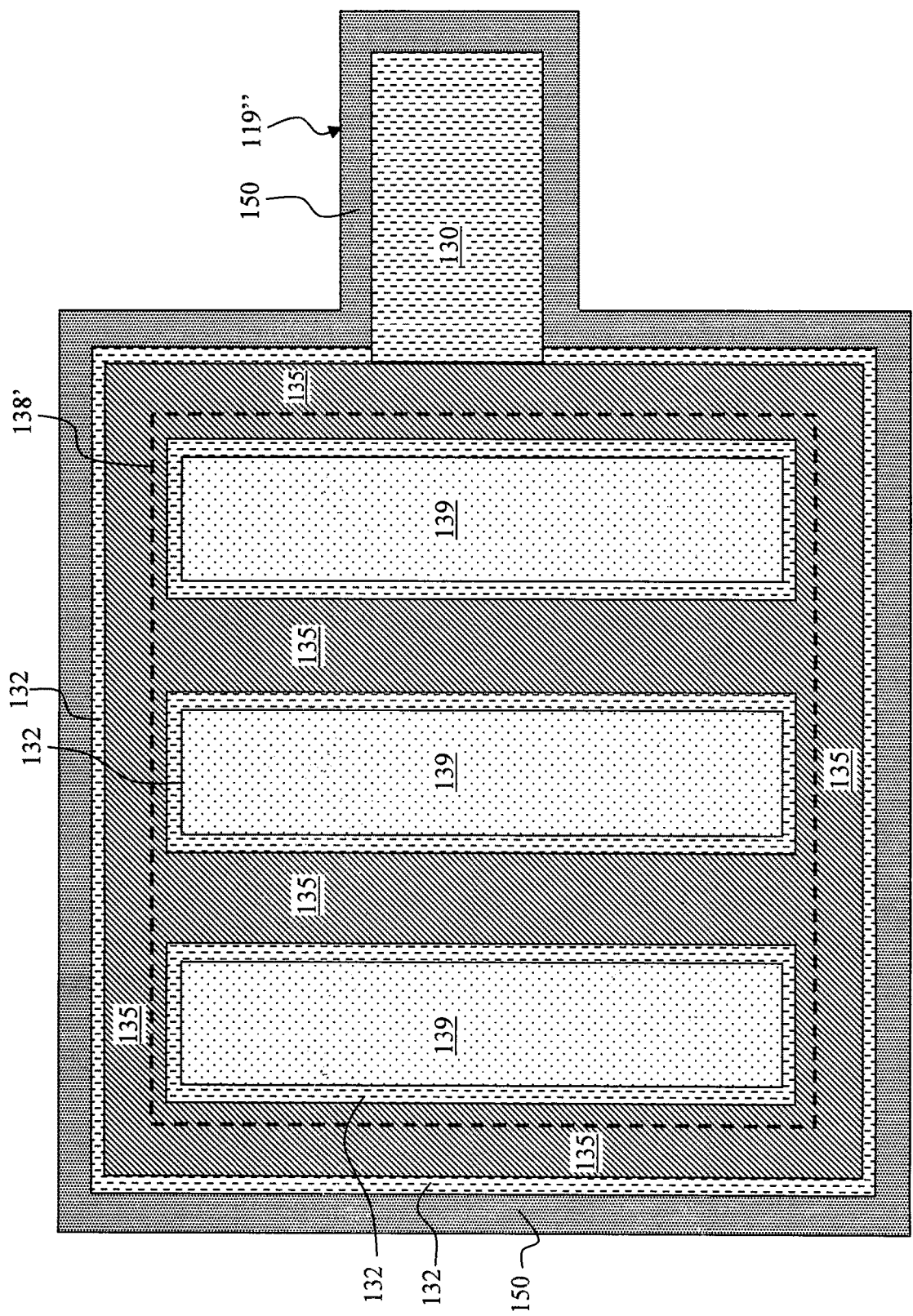
FIG. 9 is a top view to illustrate the layout configuration of the MOSFET device integrated with the Schottky diodes described in FIGS. 8A to 8F.

FIGS. 8A to 8F are a series of cross sectional views to illustrate the alternative processing steps for forming a Schottky diode integrated with the MOSFET device simultaneously manufactured on the same semiconductor substrate 105. FIG. 8A shows the fabrication process starting from a partially manufactured MOSFET device shown in FIG. 3I. In FIG. 8A-1, a CMP process is carried out to remove the second polysilicon layer 135 from above the top surface of the semiconductor substrate and a Schottky mask 138' is applied. Because of mask technical constraints, the Schottky mask 138' may be designed to partially overlap with the surrounding trenches 119. The P body and P+ body contact implantation processes can optionally be carried out at this point with the Schottky mask 138' covering part of the top surface—in these figures, these implants will be performed later. In FIG. 8B, a polysilicon etch back process is performed like that shown in FIG. 3J to recess the exposed second polysilicon 135. In FIG. 8C, the processes like those shown in FIG. 3K are performed to form the body regions 140 and 145 and the source regions 150 in the regions not covered by Schottky mask 138'. In FIG. 8D, the Schottky mask 138' is removed and the same processes shown in FIG. 3L are performed—a silicon nitride layer is formed and then etched off to form the spacer 152 along the exposed trench sidewalls. A titanium layer is then deposited followed by a high temperature operation to form the silicide gate contact 155 followed by an etch process to remove the un-reacted metal thus leaving silicide gate contact 155 on top of the second polysilicon layer 135. In FIG. 8E, the spacers 152 are removed and oxide layer 160 is deposited and then planarized by applying a CMP process to polish the top portion of the oxide layer 160 back to the silicon surface. An additional oxide etch may be performed to make sure to expose the silicon surface. Then, a silicon etch is carried out to expose the P+ body contact region 145 as shown in FIG. 8E. At this point, an implant may be performed to adjust the Schottky barrier height in the Schottky regions 139 of exposed epitaxial layer 115/110. In FIG. 8F, processes like those shown in FIG. 3O are performed by depositing an appropriate metal layer followed by a silicidation process to form the silicide layer 165 on the exposed silicon material to function as the Schottky diodes with the N− layer 115. Silicide source/body contacts are also formed from silicide layer 165. FIG. 9 is a top view for showing a layout configuration of the Schottky diodes of FIG. 8F. The silicides 155 and 165 are not shown in this figure, nor are top metal or oxide layers, for clarity. Schottky diodes are formed in the Schottky regions 139 in the rows of exposed epitaxial layer 115 between the gate trenches. Please note that the second polysilicon 135 is isolated from other second polysilicons in the active area and so is not connected to the gate potential; instead it can be connected to the source metal by contacts (not shown). A wide trench 119″ similar to the one shown in FIGS. 5A-5E is connected to the gate trenches within the Schottky structure, and provides a space for making a connection from the source metal to the first polysilicon 125 at the bottom of the trenches; like that shown in FIG. 5E. Dashed lines indicate the outline of Schottky mask 138'. The IPD 130 is shown in the center of wide trench 119″ to illustrate that the second polysilicon 125 is not present in the wide trench, thus allowing a contact to be made to the second polysilicon 125 below. In an alternative embodiment, this wide trench 119″ can extend out to connect with a standard gate trench so that the first polysilicon 125 in the Schottky vicinity is at source potential, but the second polysilicon in the Schottky vicinity is still at source potential rather than gate. This Schottky structure is like an island and can be located anywhere under the source metal.

The SGT MOSFETs integrated with Schottky diodes described above can be formed using just one additional mask compared to the basic structures shown in FIGS. 2-5 for a total of only four masks: trench mask, Schottky mask, contact mask and metal mask.

Figure 10A:
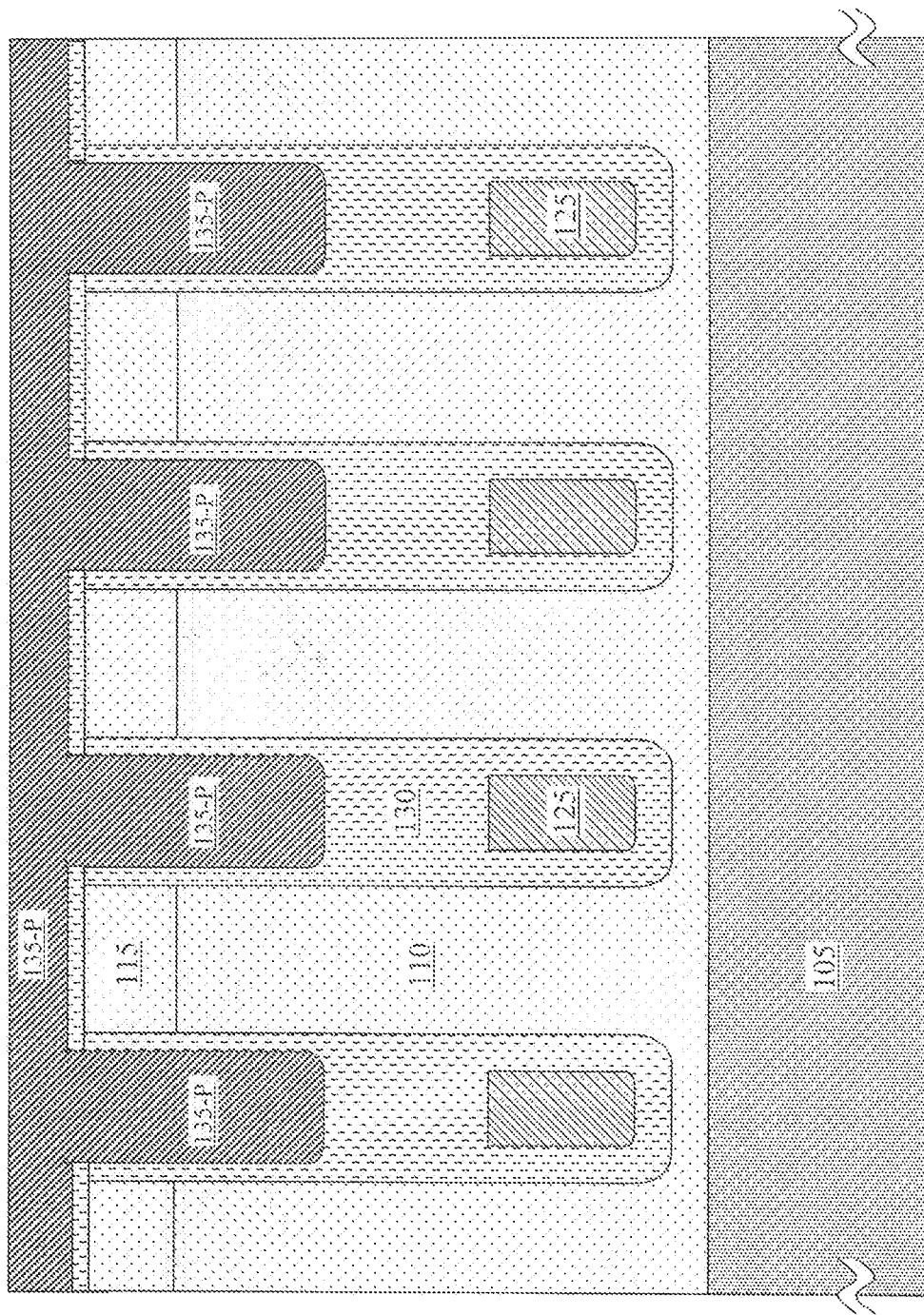
Figures 1, 10A:
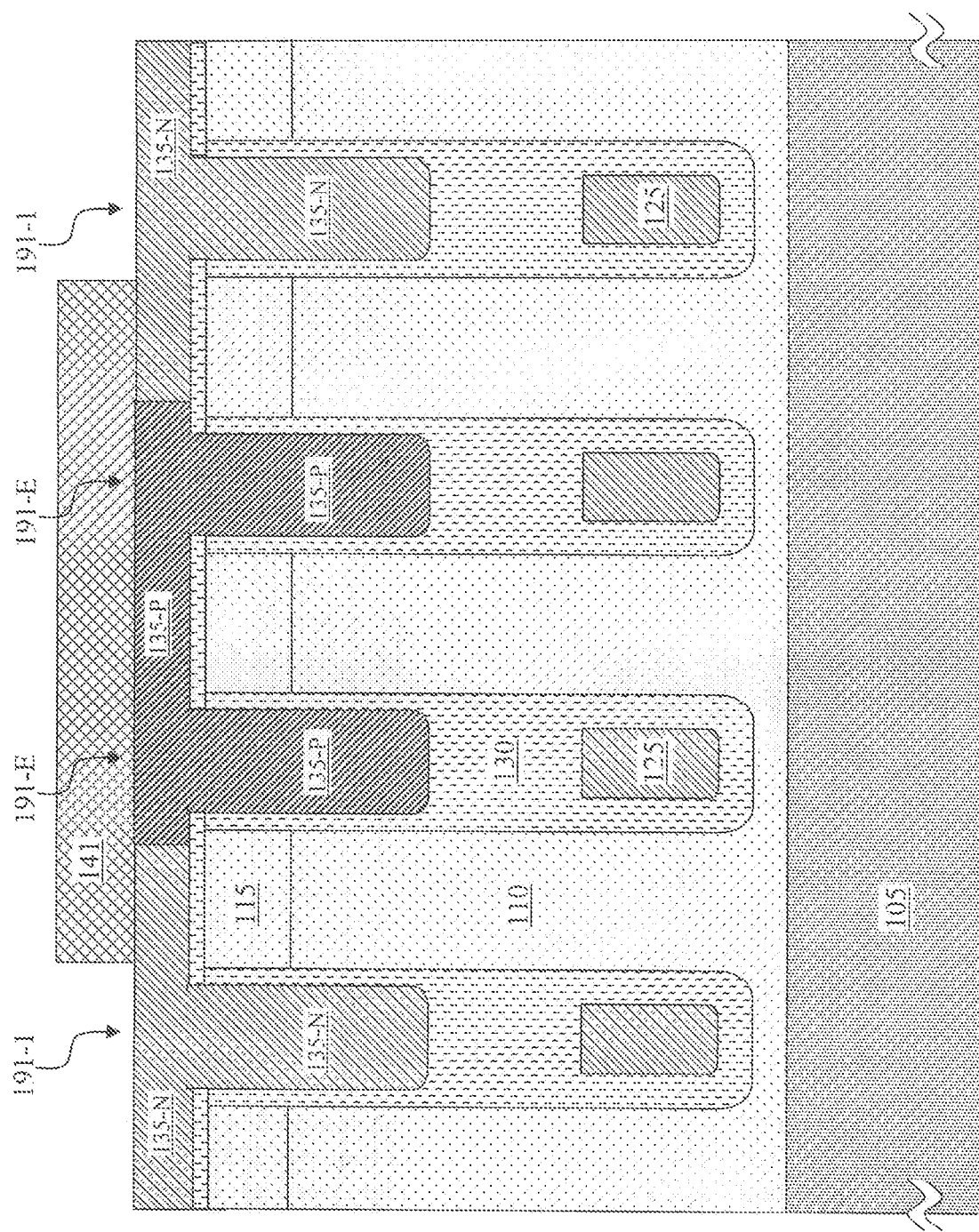
Figure 10B:
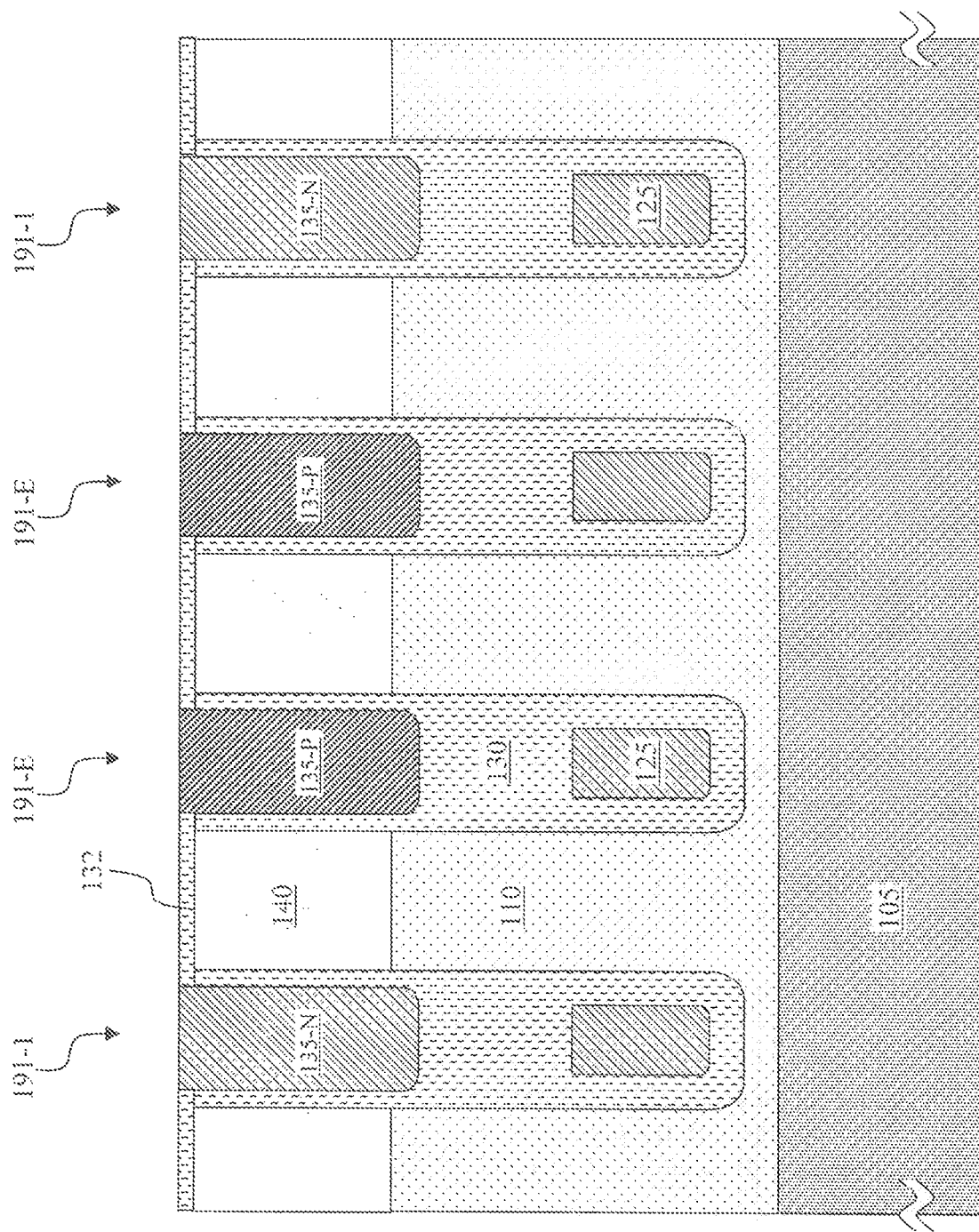
Figure 10C:
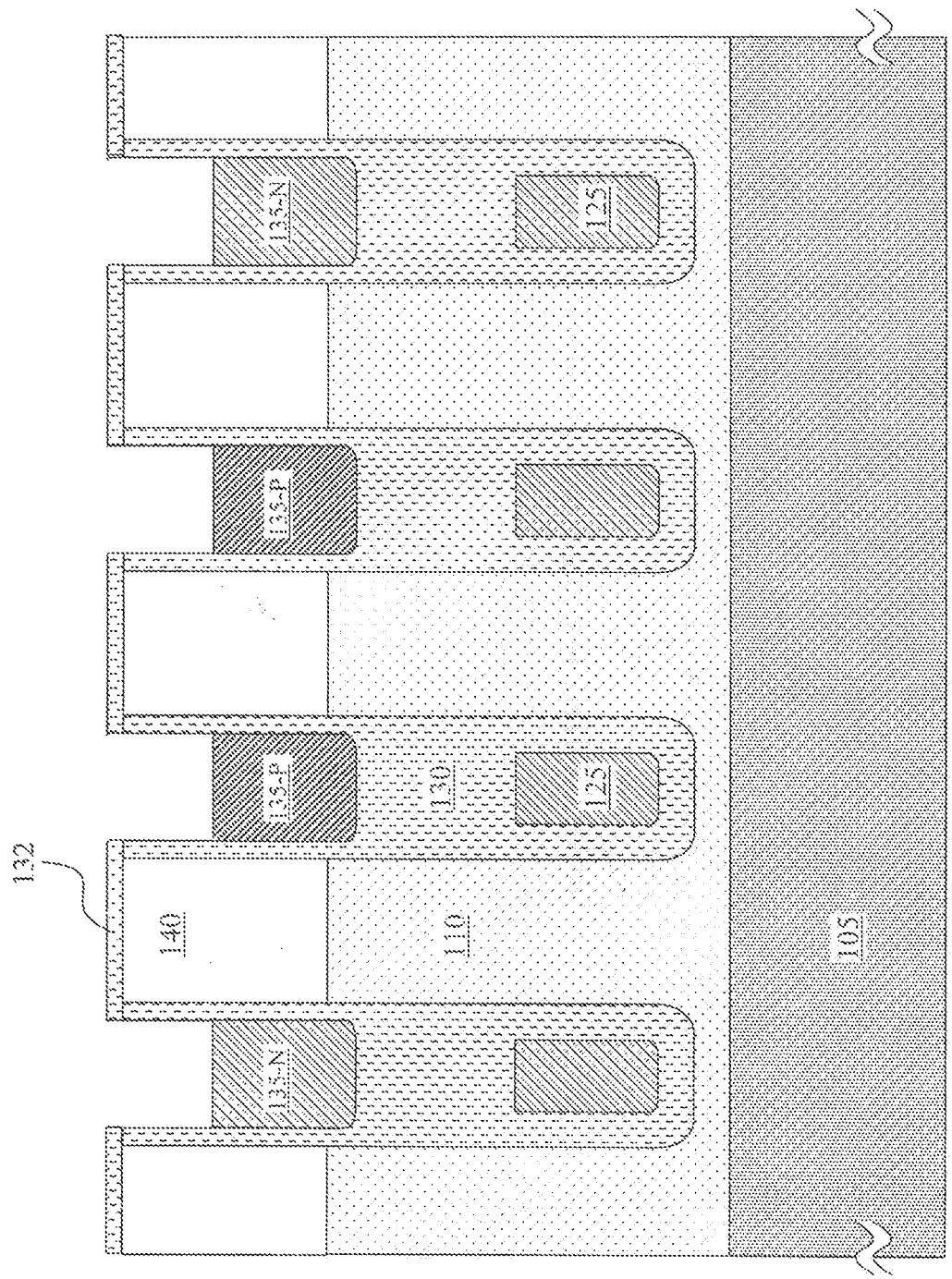
Figure 10D:
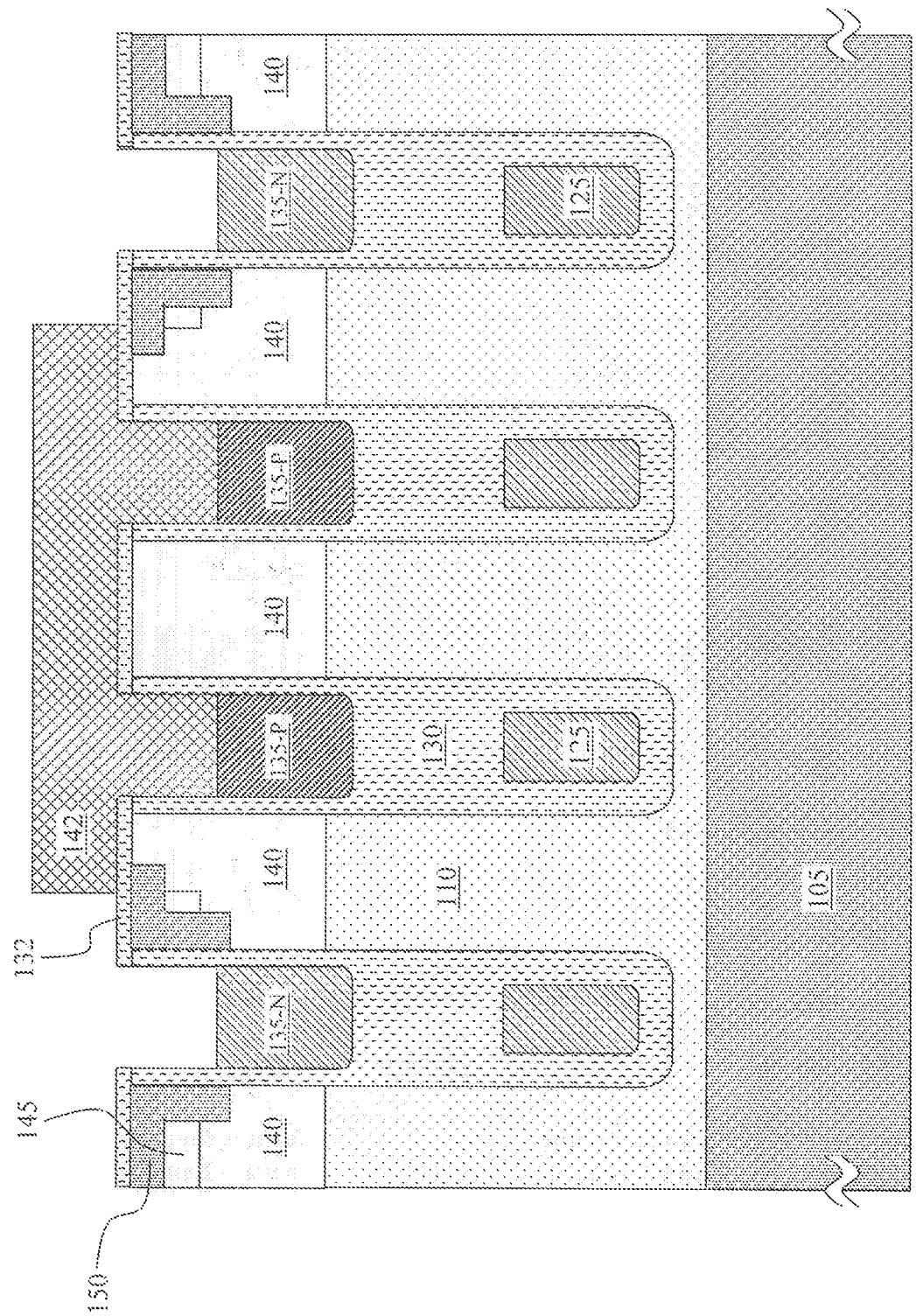
Figure 10E:
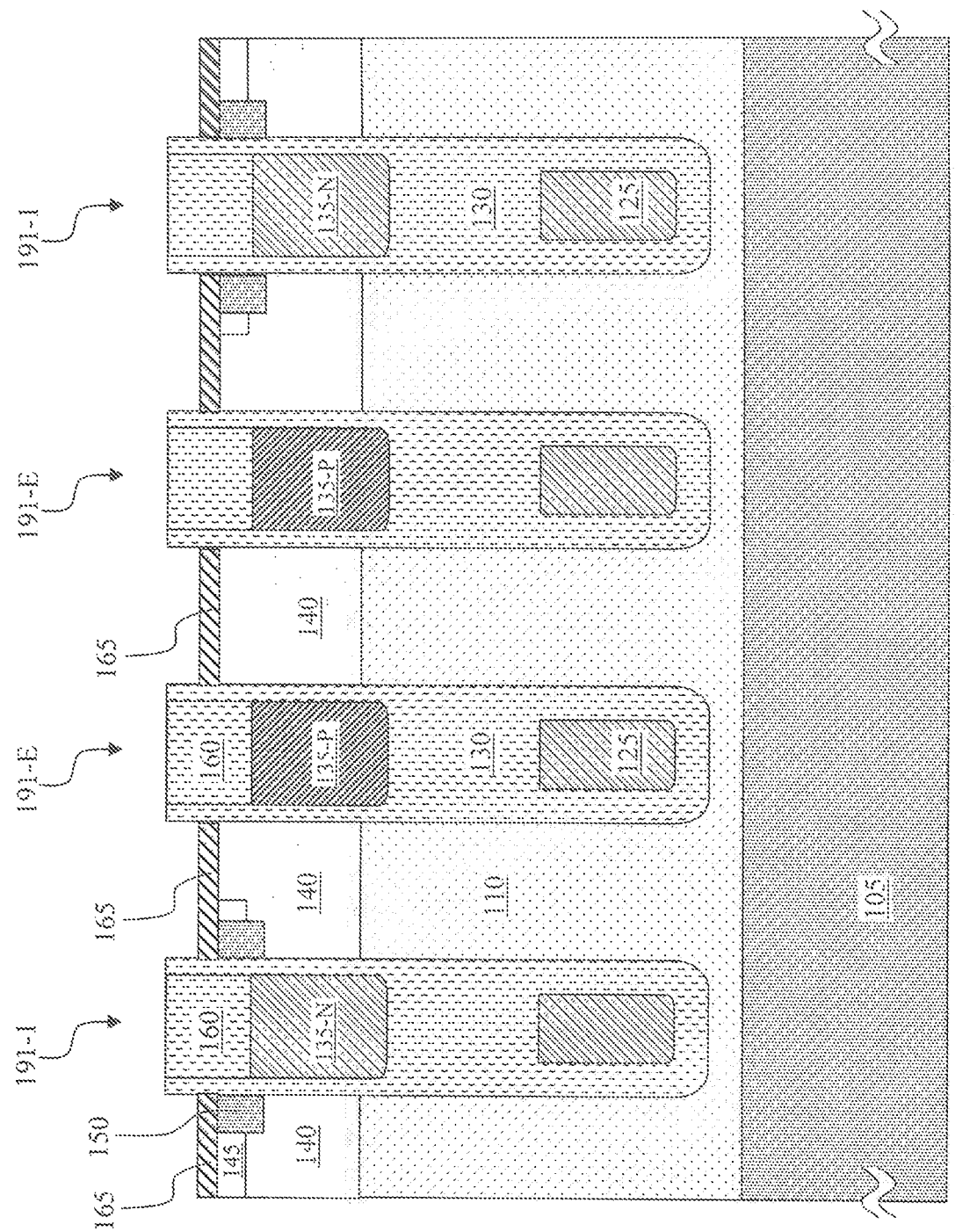

FIGS. 10A to 10E are a series of cross sectional views to illustrate the processing steps for forming electrostatic discharge (ESD) protection diodes integrated with the MOSFET device simultaneously manufactured on the semiconductor substrate 105. FIG. 10A shows the fabrication process starting from a partially manufactured MOSFET device like that shown in FIG. 3I except that in FIG. 10A the second polysilicon 135 is in-situ doped P-type polysilicon 135-P. In FIG. 10A-1 a first ESD mask 141 is applied over portions of the ESD trenches 119-E to implant N-type ions and diffuse into the uncovered portions of the second polysilicon layer 135-P to form N-type polysilicon layer 135-N. P-type polysilicon layer 135-P remains in the areas protected by first ESD mask 141. Normal gate trenches 119-1 may be located adjacent to ESD trenches 119-E and contain only the N-type second polysilicon 135-N, while the ESD 119-E trenches contain both types 135-P and 135-N, as will be shown later. In FIG. 10B, the first ESD mask 141 is removed and the second polysilicon layer, i.e., the P− type polysilicon layer 135-P and the N-type polysilicon layer 135-N, is etched back or planarized back to the silicon surface. Then, a P-body implant is carried out to form the P-body regions 140. The P-body implant is not enough to overcome the N-type doping in the N-type polysilicon regions 135-N. In FIG. 10C, the polysilicon layers 135-P and 135-N are further etched back to recess below the silicon top surface. In FIG. 10D, a second ESD mask 142 is applied as a P+/N+ block mask to perform implanting processes that include an (optional) angled P implant for threshold voltage Vt adjustment, a low energy P+ implant to form the body contact region 145, and an angled low energy source implant to form the N type source region 150. The areas of trenches 119-E covered by second ESD mask 142 remain p-type polysilicon 135-P. In FIG. 10E, the photoresist mask 142 is removed; oxide plugs 160, and source/body silicides 165 are formed in the same steps as described in FIGS. 3M to 3O to form the device as shown in FIG. 10E, corresponding to configuration as that shown in FIG. 3O. However, in this ESD embodiment, gate silicide 155 is preferably not formed to avoid shorting the ESD diode regions together as explained below. Thus the ESD protection diodes are formed with plurality of PN junctions between the P doped polysilicon 135-P and the N-doped polysilicon 135-N in the ESD trenches. This is better shown in the perspective and top views of FIGS. 11A and 11B.

Figure 11B:
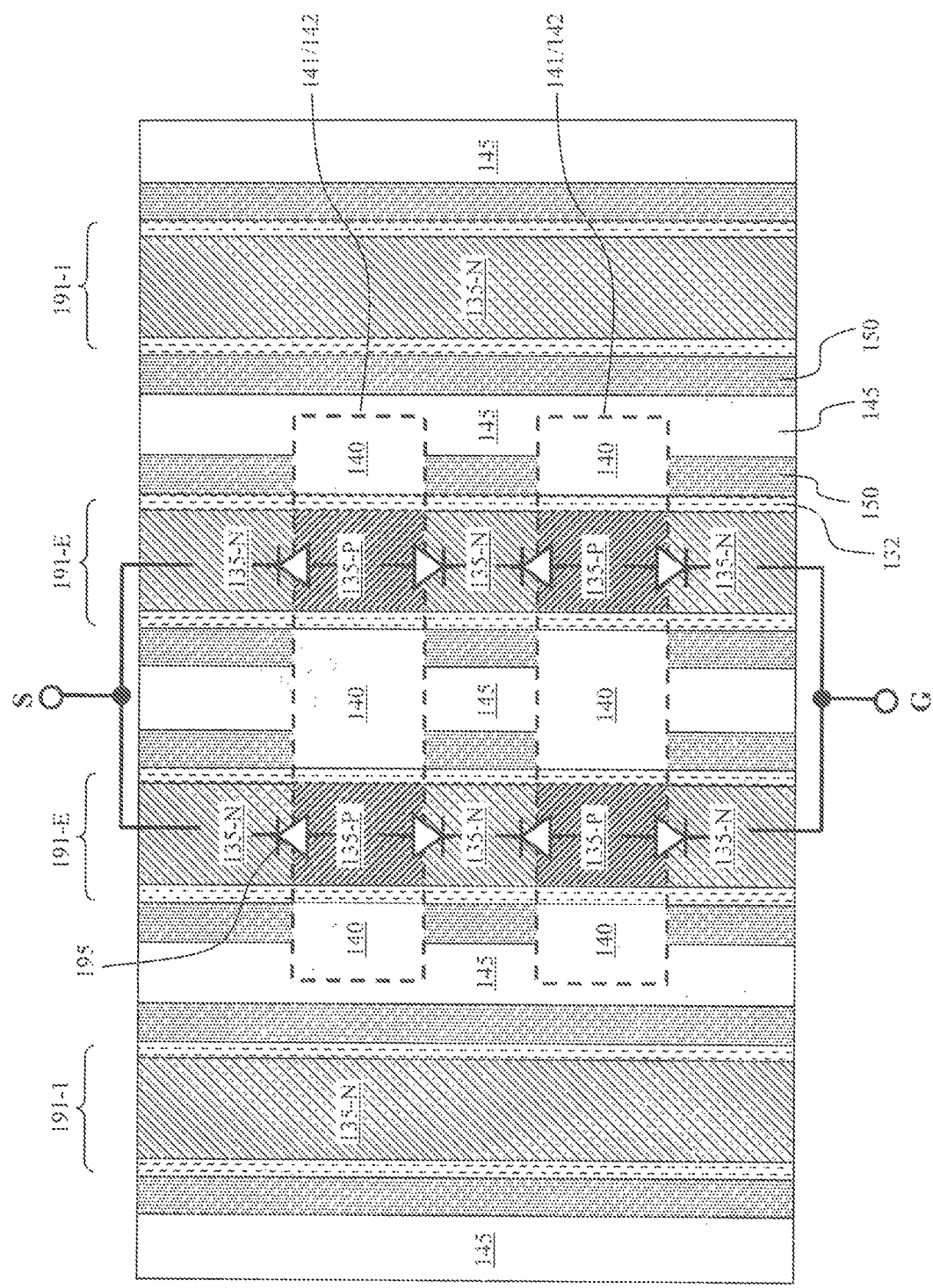

FIGS. 11A-11B are perspective and top views of the ESD protection circuits shown in FIG. 10E, with the ESD protection circuits comprising N-type polysilicon 135-N and P-type polysilicon 135-P to form back to back Zener diodes 195 within the ESD trench. The dotted lines represent the first and second ESD mask outlines 141 and 142 which more or less cover the same area. The gate silicide 155 is not formed in this embodiment to avoid shorting the P-type polysilicon 135-P and N-type polysilicon 135-N regions together. ESD trenches 119-E may be located adjacent to active gate trenches 119-1. One end of the ESD structure is connected to source potential, and the other end is connected to gate potential, thus forming gate to source ESD diodes.

Figure 12A:
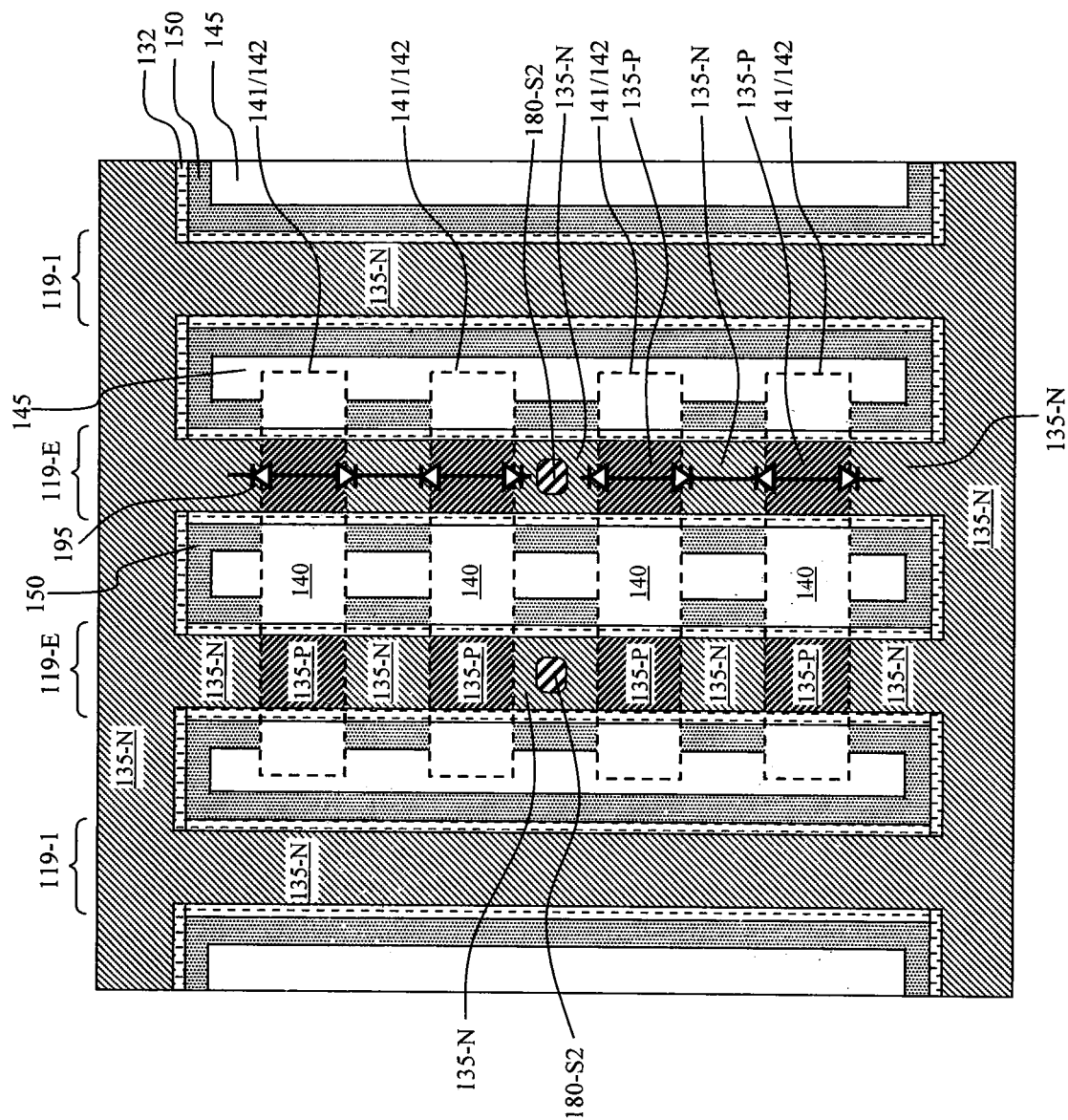
FIGS. 12A and 12B is a top view and a circuit diagram to show a possible layout configuration and equivalent circuit of a MOSFET device integrated with the ESD protection diodes described above.

FIG. 12A shows a top view of one embodiment of the of the ESD structure within located within a MOSFET device. In the ESD trenches 119-E, the P and N type polysilicons 135-P and 135-N form back to back diodes. The ESD trenches connect to regular gate trenches 119-1 at both ends. A source contact 180-S2 can be made at the center N-type polysilicon 135-N of each ESD trench 119-E to connect it to the source metal. The ESD structure shown in FIG. 11B is mirrored on both sides of the source contact 180-S2 so that back to back Zener diodes extend from the source potential at the source contact 180-S2 to the polysilicon 135-N of the normal gate trenches 119-1, which are at gate potential.

Figure 12B:
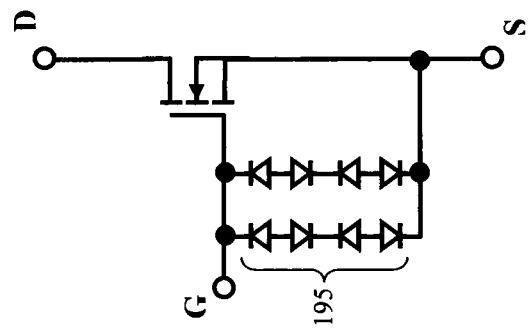

FIG. 12B is an equivalent circuit for the MOSFET having source (S), gate (G) and drain (D) pads, with gate-to-source ESD diodes 195 formed between the gate and source.

The MOSFET with ESD protection circuits described above may be formed with only two additional masks on top of the basic process described in FIGS. 2-5, for a total of five masks: trench mask, first ESD mask, second ESD mask, contact mask, and metal mask.

Figure 13A:
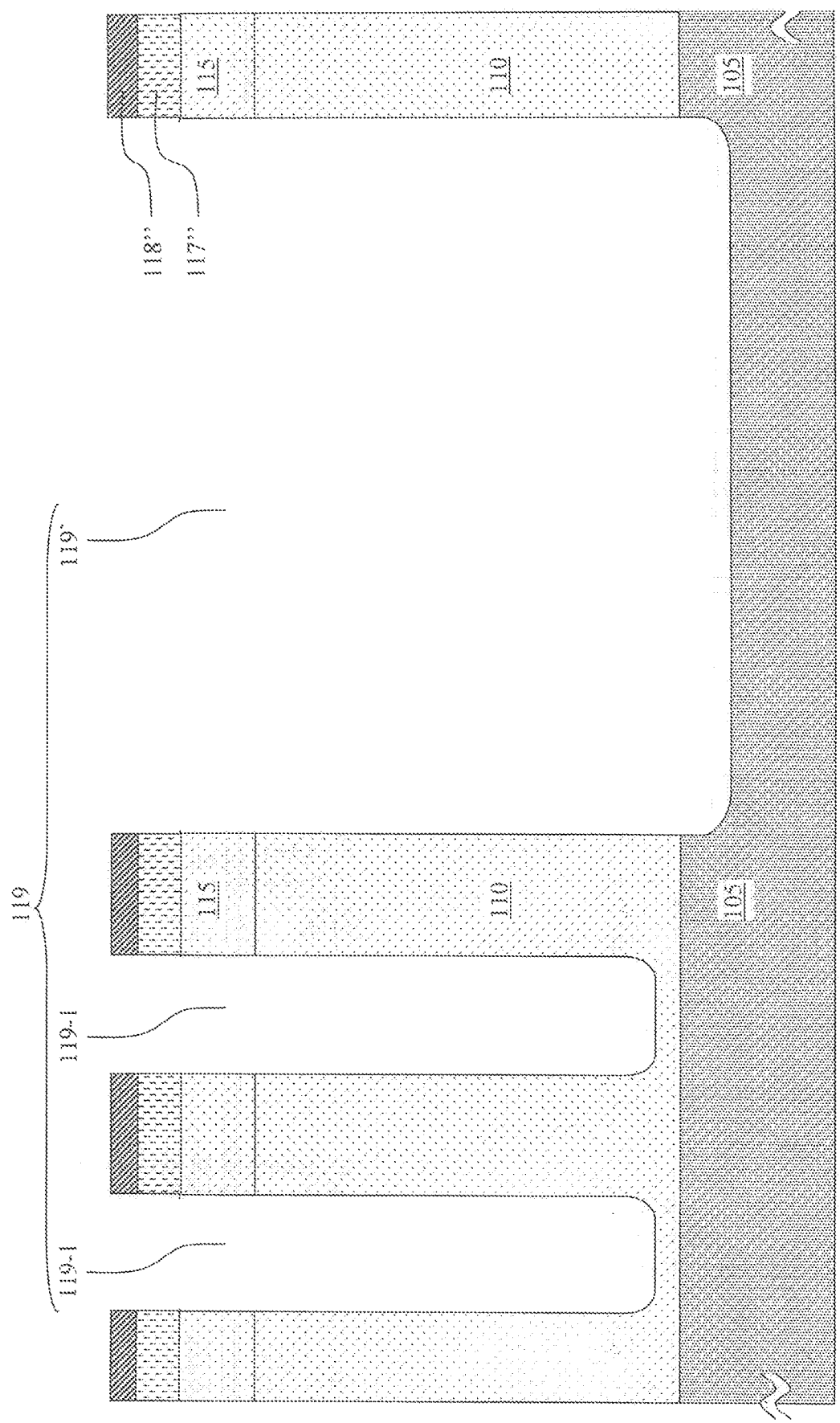
Figure 13B:
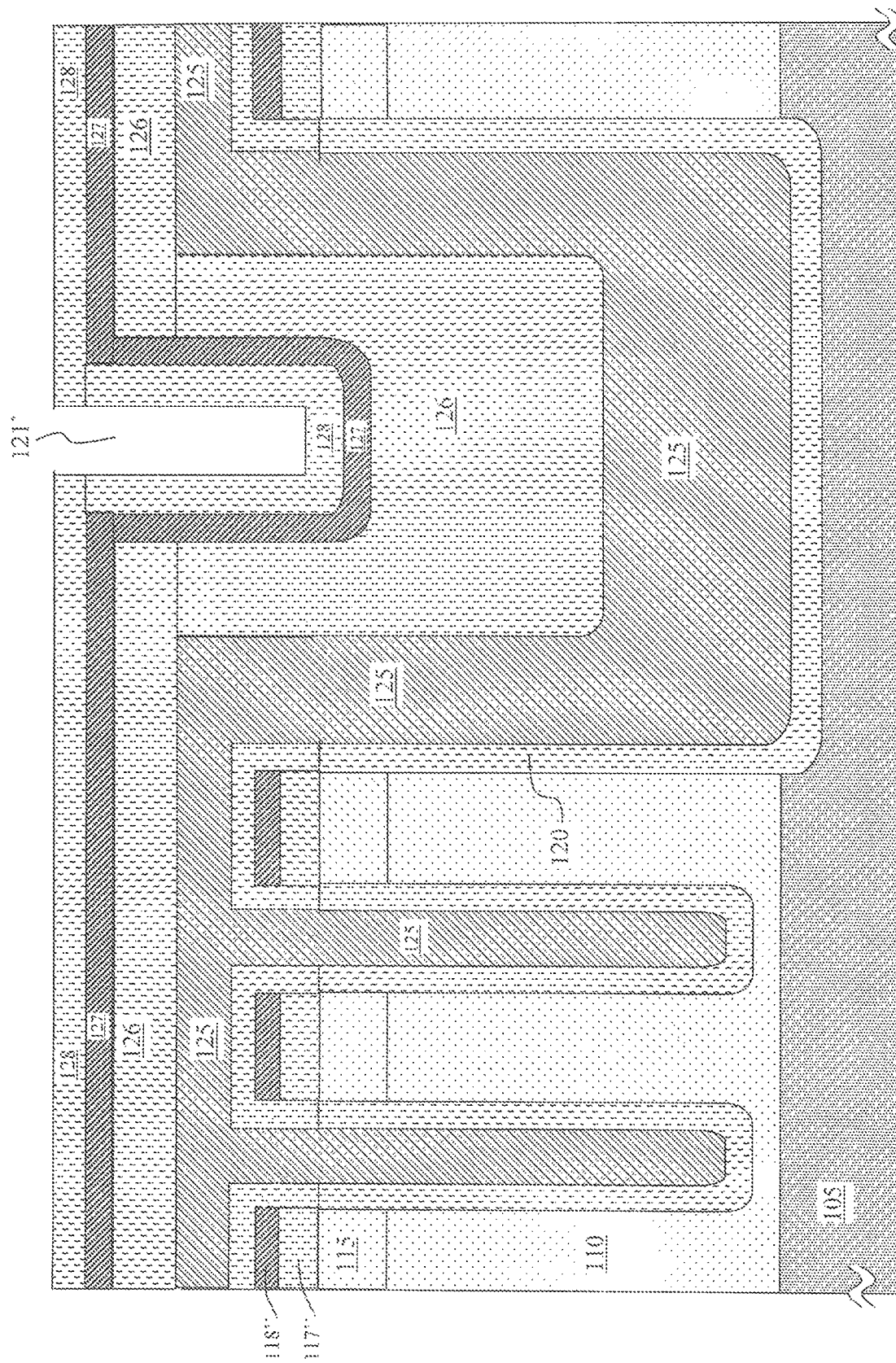
Figure 13C:
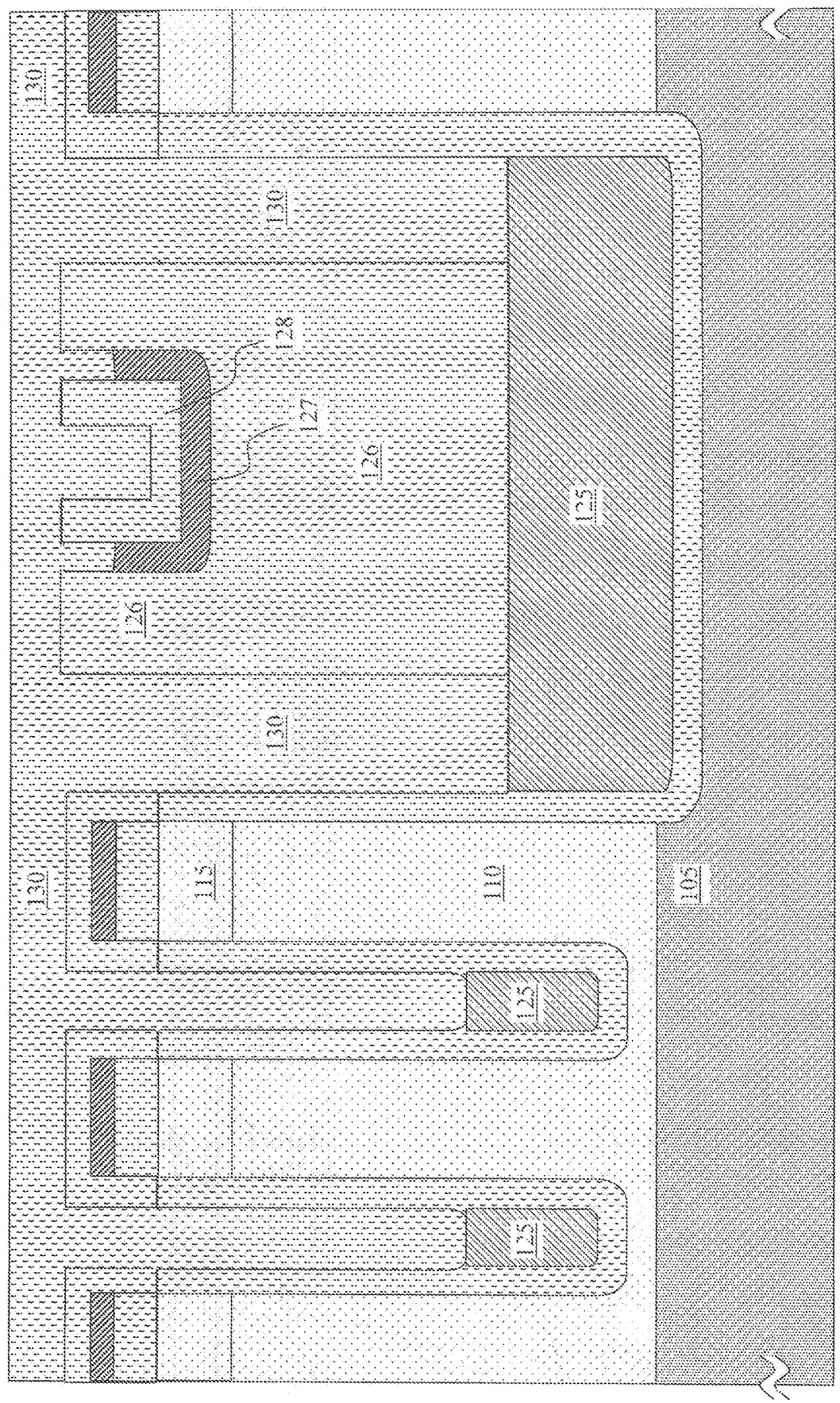
Figure 13D:
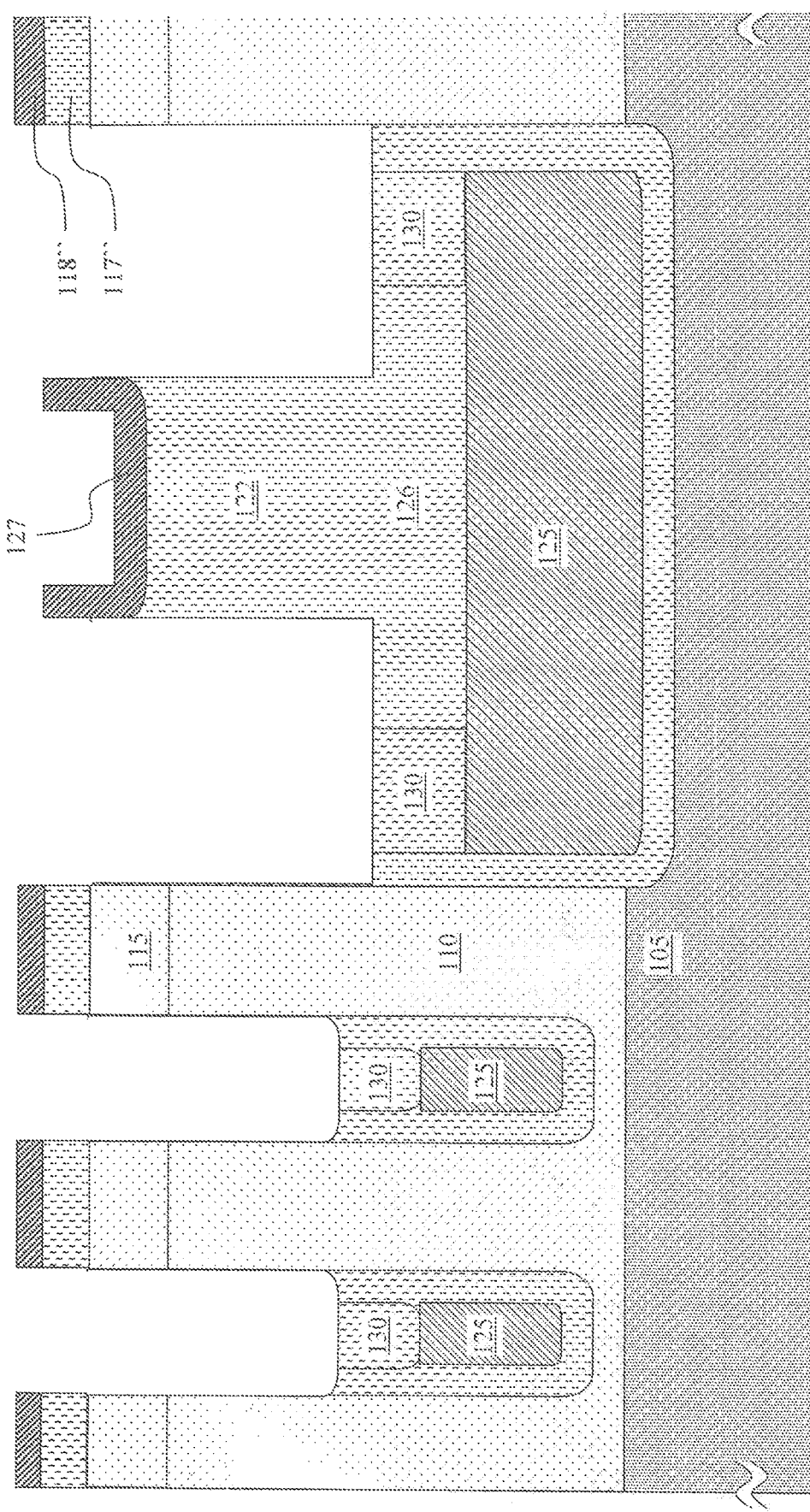
Figure 13E:
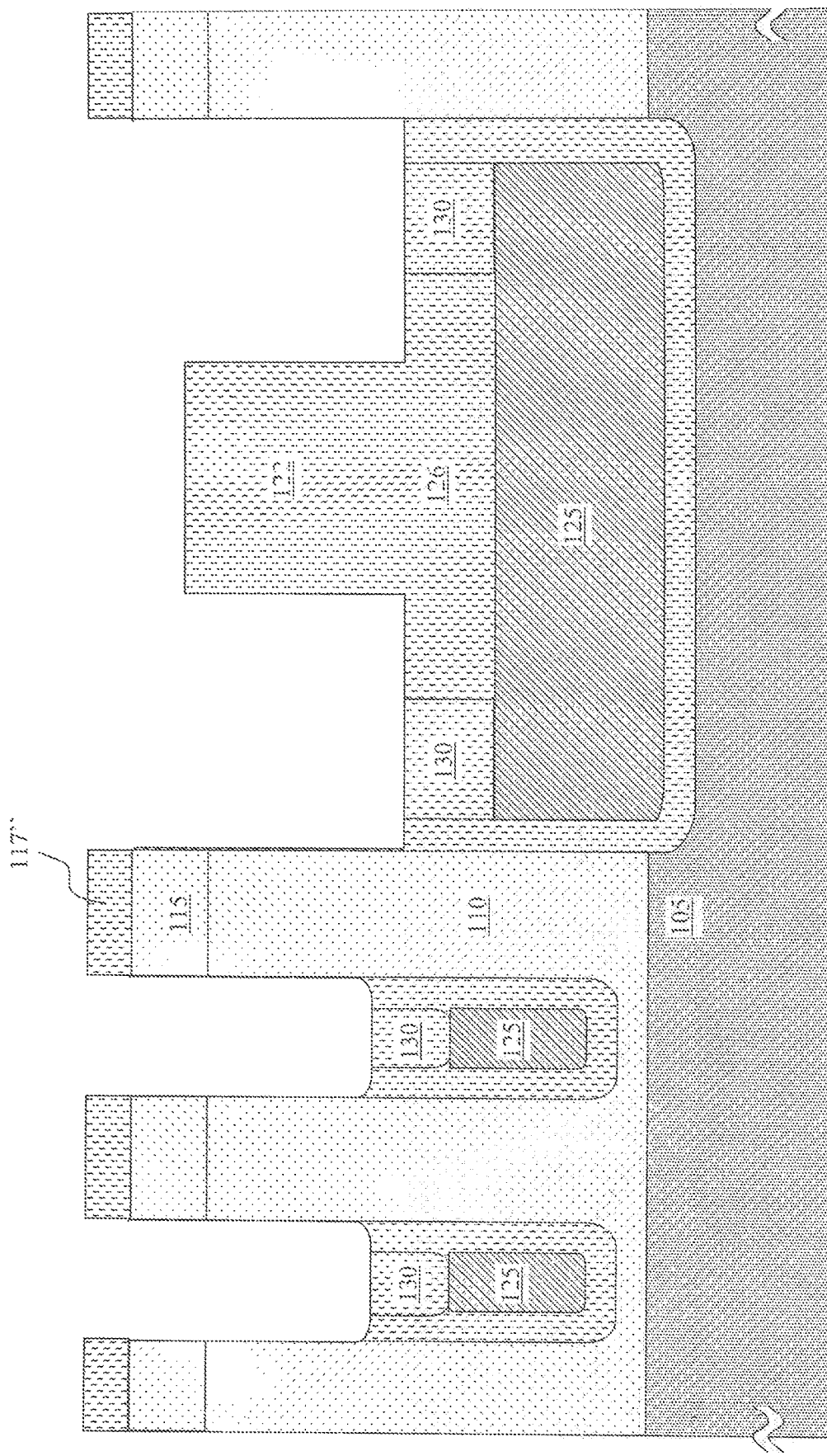
Figure 13F:
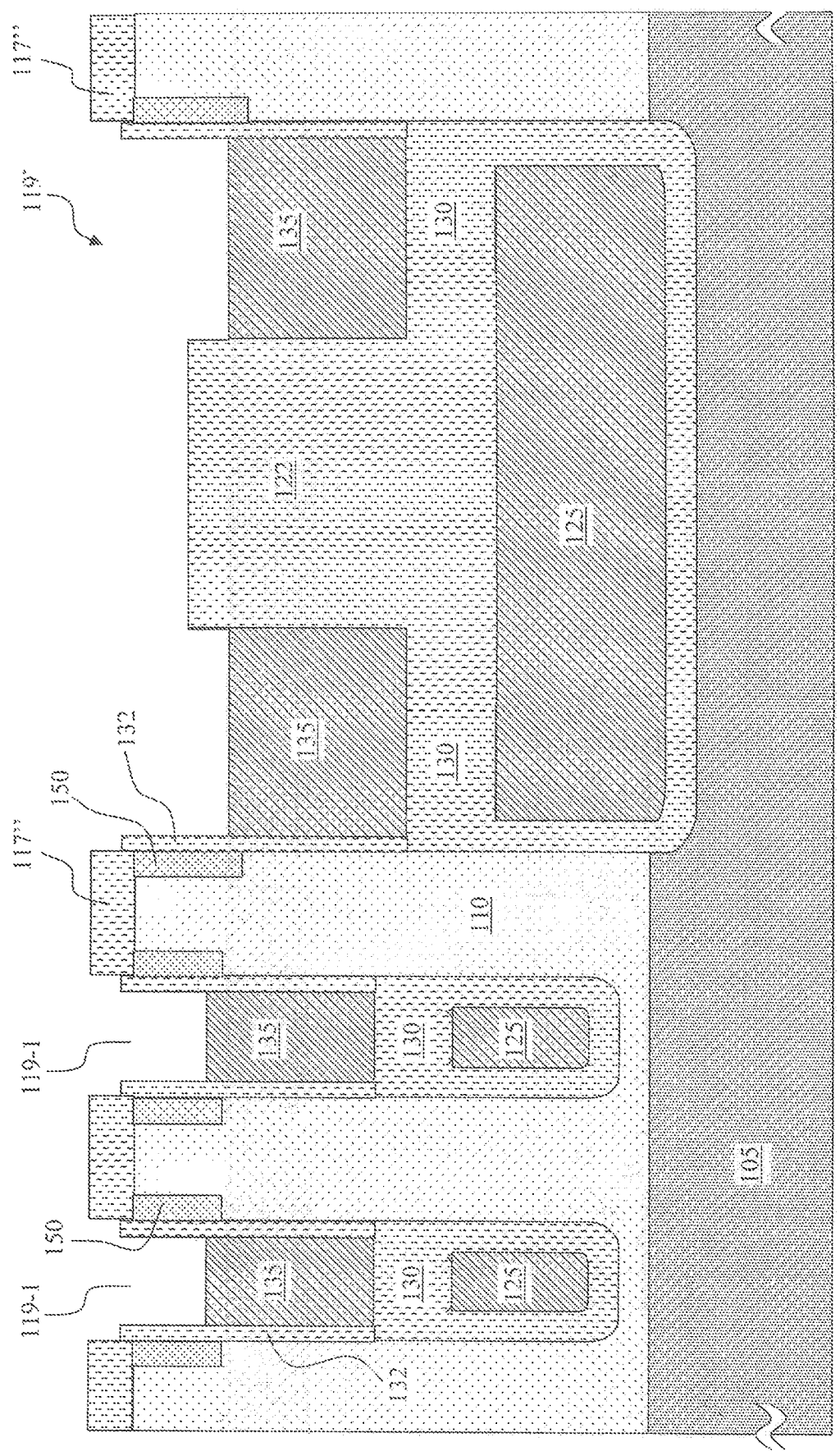
Figures 1, 13F:
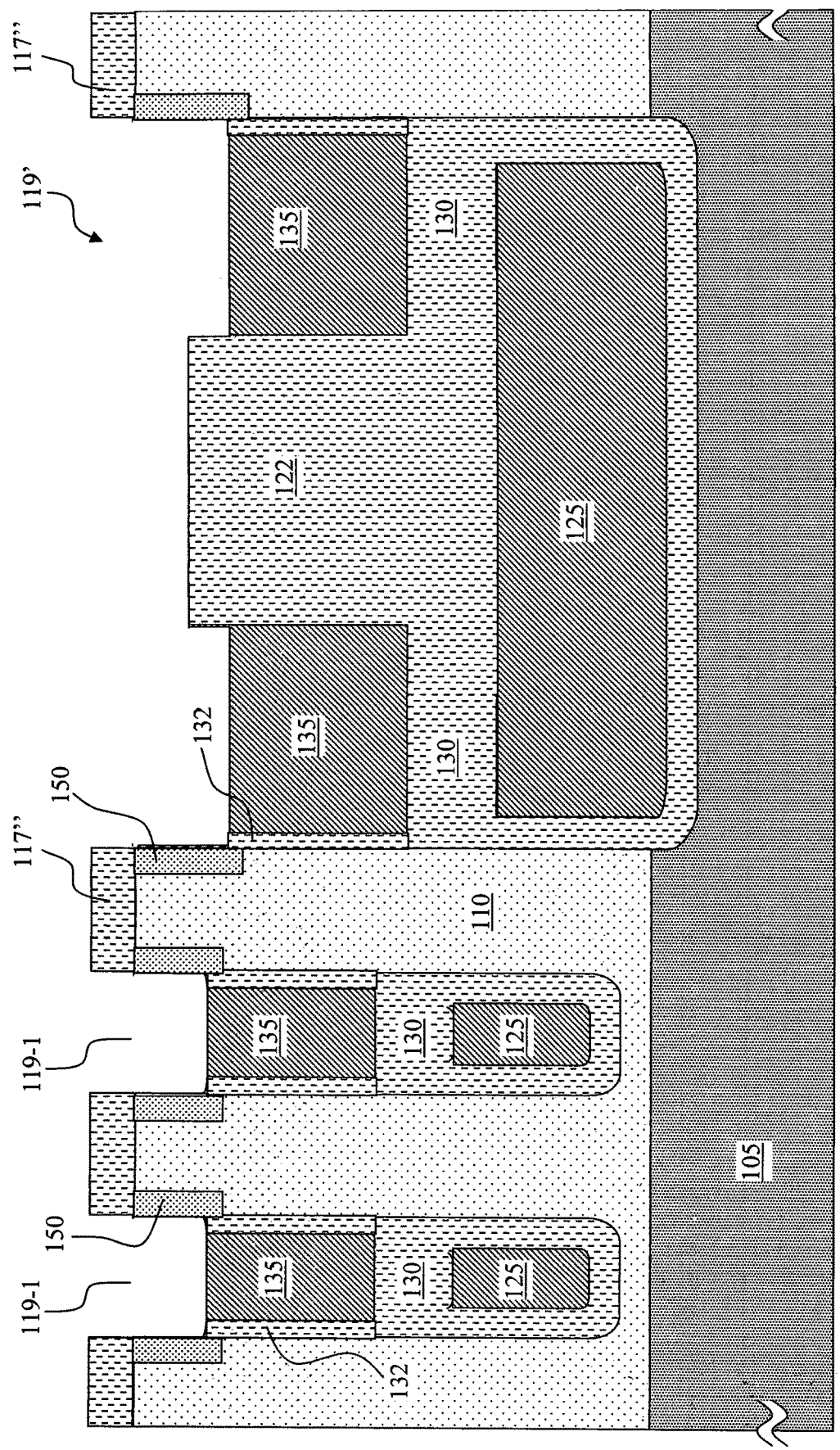
Figure 13G:
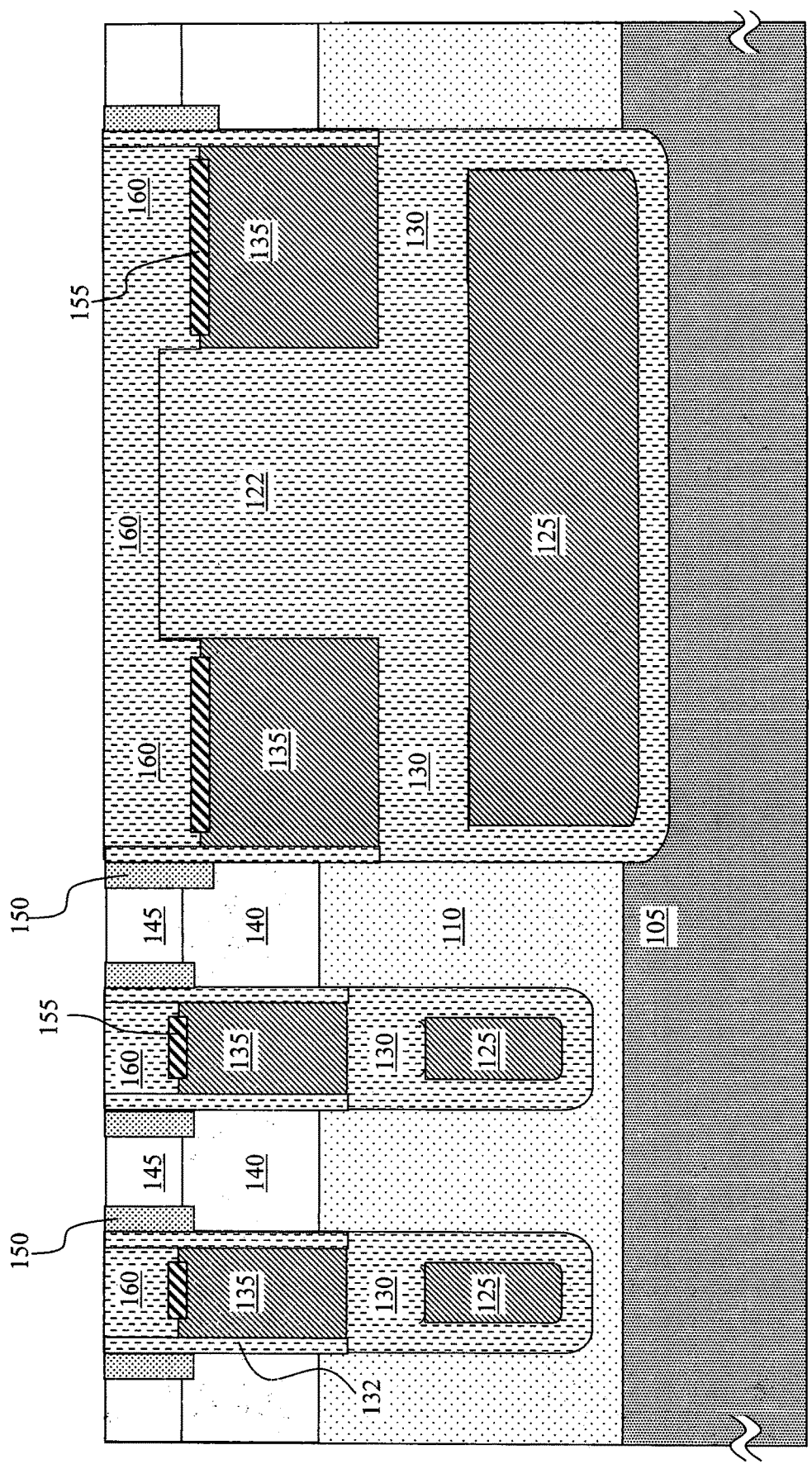
Figure 13H:
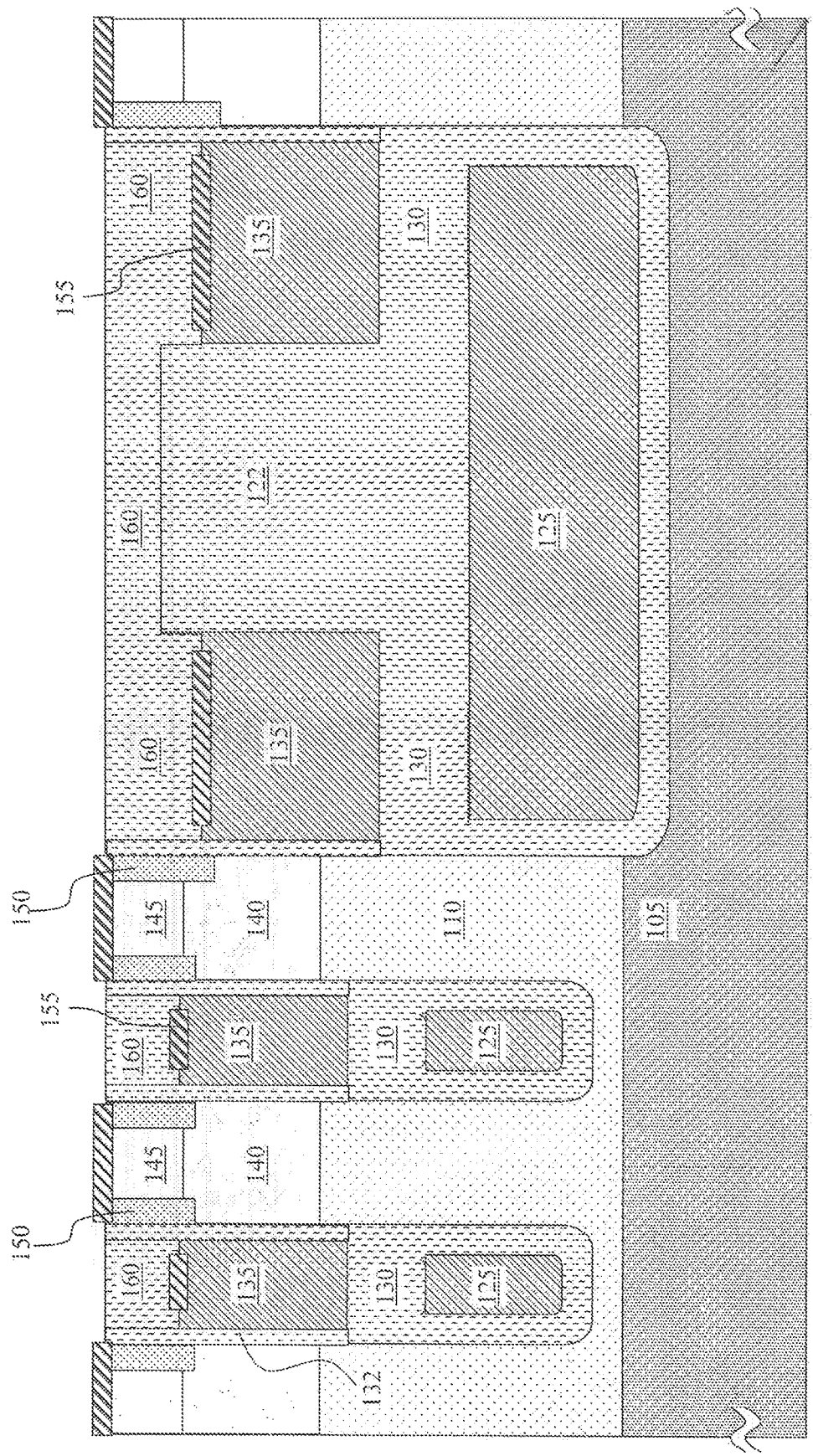

FIGS. 13A-13H are cross sectional views to illustrate an alternative method for forming the SGT of this invention. These Figures are very similar to FIG. 3, but keep a hard mask from the initial trench etch to mask the source implant later in the process. In FIG. 13A, which happens at the same step as FIG. 3B, a hard mask of oxide 117" and nitride 118" are formed and patterned with a photoresist mask (not shown). The oxide 117" and nitride 118" are used to form the trenches 119, including active trenches 119-1 and wide trench 119'. In FIG. 13B, which corresponds to FIG. 3E'-2, a bottom electrode layer 125 (e.g. polysilicon) is deposited in the trenches. Followed by adding the ONO (oxide, nitride, oxide) layers 126, 127, 128. FIG. 13B is different from FIG. 3E'-2 in that in FIG. 13B the hard mask oxide 117" and nitride 118" from the trench etch of FIG. 13A still remain. The same steps from FIGS. 3' are followed so that in FIG. 3C, which corresponds to FIG. 3G', a U-shaped nitride 127 layer remains in the center of the wide trench 119', over the oxide layer 126. Inter-poly-dielectric 130 is deposited in the trenches. In FIG. 13D which corresponds to FIG. 3H', the oxide layers etched back leaving inter-poly dielectrics 130. The oxide etch leaves the nitride layers 118', and the U-shaped nitride layer 127 in the middle of the wide trench. In FIG. 13E which corresponds to FIG. 3H'-1, a nitride etch removes the nitrides 118" and 127, leaving hard mask oxide 117" on top of the semiconductor protuberances and the oxide protuberance 122 in the middle of the wide trench. In FIG. 13F, which corresponds to FIG. 3K', top polysilicon electrode 135 is formed in the top of the trenches and source regions 150 are formed e.g., by angled implants along the upper sidewalls of the semiconductor protuberances, using both the top electrode 135 and the hard mask oxide 117" as masks for the implant. In an alternative method, as shown in FIG. 13F-1, the gate oxide 132 may be removed from the upper sidewalls of the semiconductor protuberances, and the source regions may be formed by gas diffusion. The hard mask 117" keeps source regions from forming along the top of the semiconductor protuberances. In FIG. 13G, corresponding to FIG. 3M-1', the gate silicide 155 is formed, e.g. using nitride spacers (not shown). In FIG. 13H, corresponding to FIG. 3M-1', oxide plugs 160 are formed at the top of the trenches and a source/body silicide is formed at the top of the semiconductor protuberances which connect and contact the source regions 150 and body regions 145. Note that in this case, the tops of the semiconductor protuberances may not need to be etched down before forming the silicide, because the body region 135 is already exposed between source regions 150, because of the presence of the oxide hard mask 117" during the source formation of FIG. 13F.

Figure 14A:
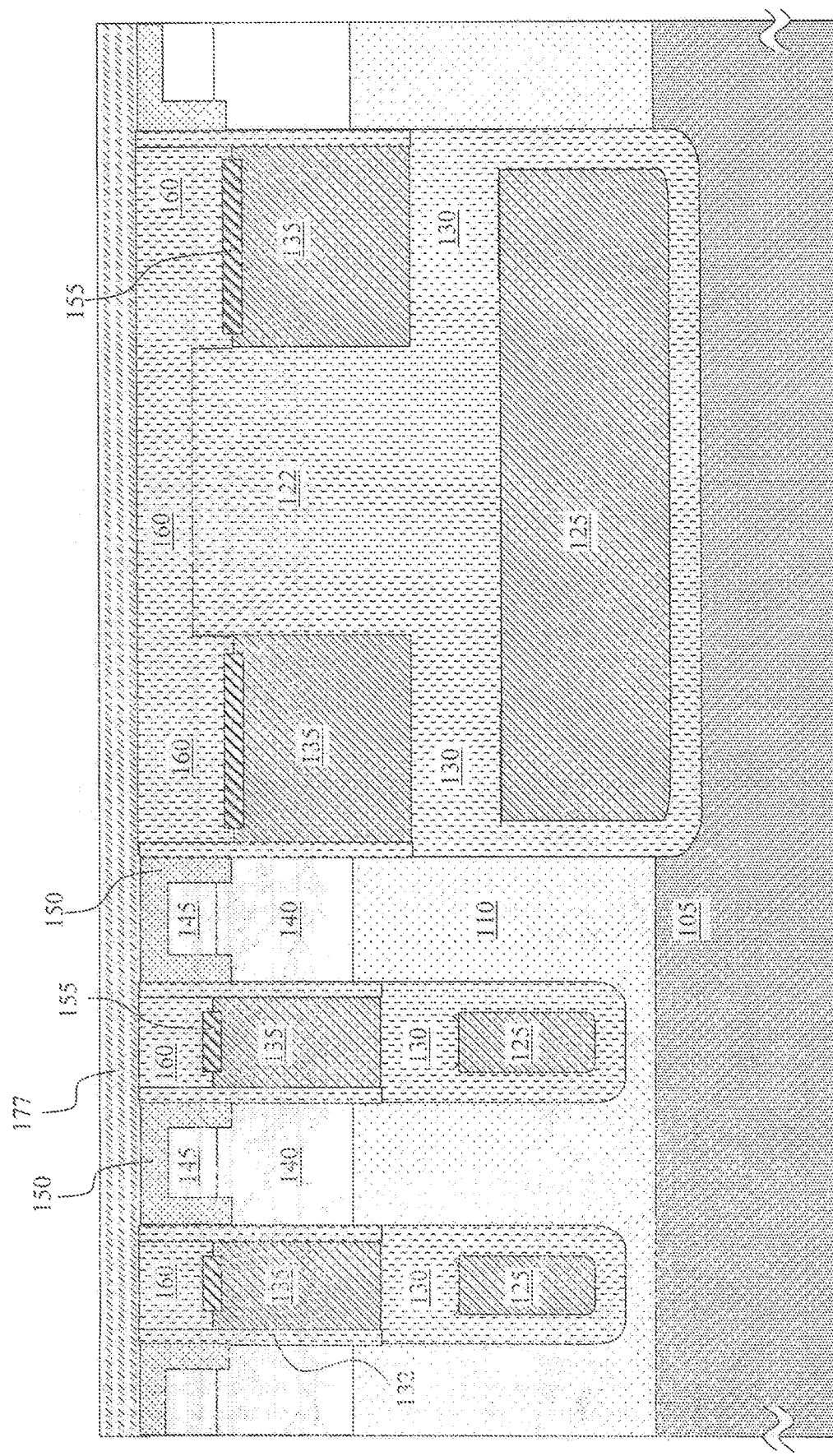
FIGS. 14A and 14B are a series of cross sectional views for illustrating an alternative method for forming a self-aligned source/body silicide of this invention.
Figure 14B:
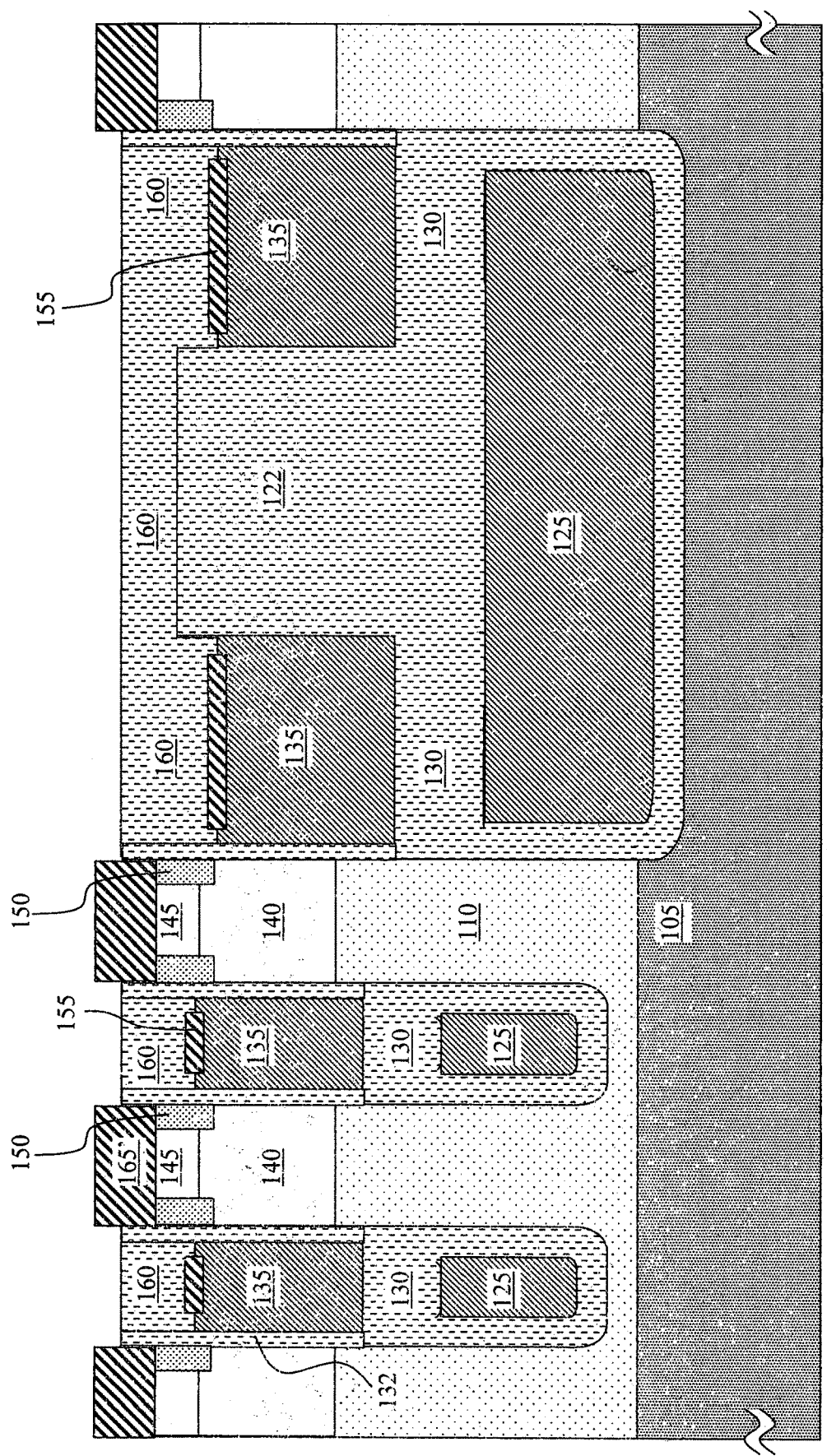

FIGS. 14A and 14B are cross sectional views for showing another alternative method of forming the source/body silicide. In FIG. 14A, which takes place after forming the oxide plugs 160 in FIG. 3M-1, a thick pre-silicide metal 177 is deposited on the device. A silicidation process is performed (e.g. by heating the device), so that the pre-silicide metal 177 reacts with the exposed semiconductor surfaces to form silicide 165. The silicidation process consumes some of the semiconductor material. The pre-silicide metal 177 has enough thickness, and the silicidation process is carried on for long enough for enough semiconductor material to be consumed in the silicidation process for the silicide to reach the body region 145. This is illustrated in FIG. 14B, where the thick source/body silicide contacts both the source regions 150 and body regions 145, having consumed the top horizontal surface portions of the source region 150.

Although the present invention has been described in terms of the presently preferred embodiment, it is to be understood that such disclosure is not to be interpreted as limiting. For example, though the above describes an n-channel device, this invention can be applied to p-channel devices as well simply by reversing the conductivity types of the doped regions. Various devices may be formed including IGBT. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method of forming a shield gate trench (SGT) MOSFET with source body shorting silicide comprising:
    forming trenches by applying a first photo mask with semiconductor protuberances in between;
    forming a bottom dielectric layer in a bottom of the trench;
    forming a shield electrode at the bottom of the trench on top of the bottom dielectric layer and forming a dielectric layer surrounding the shield electrode;
    forming an inter-electrode-dielectric over the shield electrode;
    forming an upper gate dielectric layer on an upper trench sidewalls;
    forming a recessed gate electrode on top of the inter-electrode-dielectric layer surrounded by the upper gate dielectric layer;
    forming source regions along the top surface of semiconductor protuberance sidewalls, using the recessed gate electrode as a mask;
    forming a body region between and below source regions; and
    forming a source/body silicide substantially across the entire top surface of the semiconductor protuberance;
    forming contacts with a second photomask for contacting the source and body regions, and forming a source metal and a gate metal with a third photomask; and
    wherein the steps of forming the source and body regions further comprising a step of applying an additional mask to protect a Schottky diode region.

2. The method of claim 1 further comprising a step of removing the top portion of the semiconductor protuberance to allow the source/body silicide to contact the body region between the source regions.

3. A method of forming a shield gate trench (SGT) MOSFET with source body shorting silicide comprising:
    forming trenches by applying a first photo mask with semiconductor protuberances in between;
    forming a bottom dielectric layer in a bottom of the trench;
    forming a shield electrode at the bottom of the trench on top of the bottom dielectric layer and forming a dielectric layer surrounding the shield electrode;
    forming an inter-electrode-dielectric over the shield electrode;
    forming an upper gate dielectric layer on an upper trench sidewalls;
    forming a recessed gate electrode on top of the inter-electrode-dielectric layer surrounded by the upper gate dielectric layer;

forming source regions along the top surface of semiconductor protuberance sidewalls, using the recessed gate electrode as a mask;

forming a body region between and below source regions;

forming a source/body silicide substantially across the entire top surface of the semiconductor protuberance;

forming contacts with a second photomask for contacting the source and body regions, and forming a source metal and a gate metal with a third photomask; and using two additional masks for forming an ESD structure of back-to-back gate-source diodes.

4. The method of claim 3 further comprising a step of using an additional mask to protect a Schottky diode region while forming the source and body regions.

5. The method of claim 1 further comprising a step of applying two additional masks for forming an ESD structure of back-to-back gate-source diodes.

* * * * *